(12) United States Patent
Kimura

(10) Patent No.: US 9,368,526 B2
(45) Date of Patent: Jun. 14, 2016

(54) DIGITAL CIRCUIT HAVING CORRECTING CIRCUIT AND ELECTRONIC APPARATUS THEREOF

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 32 days.

(21) Appl. No.: 14/250,663

(22) Filed: Apr. 11, 2014

(65) Prior Publication Data

US 2014/0299927 A1    Oct. 9, 2014

Related U.S. Application Data

(63) Continuation of application No. 13/675,097, filed on Nov. 13, 2012, now Pat. No. 8,698,356, which is a continuation of application No. 12/185,854, filed on Aug. 5, 2008, now Pat. No. 8,314,514, which is a continuation of application No. 10/741,589, filed on Dec. 22, 2003, now Pat. No. 7,411,318.

(30) Foreign Application Priority Data

Dec. 25, 2002    (JP) .................................. 2002-375002

(51) Int. Cl.
*H01H 47/00*   (2006.01)
*H02B 1/24*    (2006.01)
(Continued)

(52) U.S. Cl.
CPC .......... *H01L 27/1255* (2013.01); *G02F 1/1368* (2013.01); *H01L 27/0629* (2013.01); *H03K 19/01728* (2013.01); *Y10T 307/74* (2015.04); *Y10T 307/747* (2015.04)

(58) Field of Classification Search
CPC ............ H01L 27/1255; H01L 27/0629; G02F 1/1368; H03K 19/01728; Y10T 307/74; Y10T 307/747
USPC ................................... 307/113; 327/380–383
See application file for complete search history.

(56) References Cited

U.S. PATENT DOCUMENTS

| 4,758,801 | A | 7/1988 | Draxelmayr |
|---|---|---|---|
| 4,797,579 | A | 1/1989 | Lewis |

(Continued)

FOREIGN PATENT DOCUMENTS

| JP | 49-017161 A | 2/1974 |
|---|---|---|
| JP | 55-156427 A | 12/1980 |

(Continued)

OTHER PUBLICATIONS

Cairns et al.; "9.2: Multi-Format Digital Display with Content Driven Display Format"; SID 01 Digest; vol. 32; pp. 102-105; 2001.

(Continued)

*Primary Examiner* — Hal Kaplan
(74) *Attorney, Agent, or Firm* — Fish & Richardson P.C.

(57) ABSTRACT

Provided is a digital circuit (30) that comprises: a switching circuit (31) having first transistors (32, 33) supplied with power supply potentials (VDD, VSS); correcting circuits (34, 36) connected between an input terminal (IN) inputted with an input signal and control terminals (gates) of the first transistors; capacitors (C2, C3) connected between the control terminals and the input terminal; diode-connected second transistors (35, 37) that are provided between nodes (N5, N6) between the capacitors and the control terminals and the power supply potentials and have the substantially same threshold voltage as the first transistors; and switches (SW2, SW3) connected in series with the second transistors.

13 Claims, 36 Drawing Sheets

(51) Int. Cl.
*H01L 27/12* (2006.01)
*H03K 19/017* (2006.01)
*G02F 1/1368* (2006.01)
*H01L 27/06* (2006.01)

(56) References Cited

U.S. PATENT DOCUMENTS

| | | | |
|---|---|---|---|
| 4,827,159 A | 5/1989 | Naganuma |
| 4,877,980 A | 10/1989 | Kubinec |
| 4,922,364 A | 5/1990 | Paulsson |
| 5,128,560 A | 7/1992 | Chern et al. |
| 5,808,480 A | 9/1998 | Morris |
| 5,811,992 A | 9/1998 | D'Souza |
| 5,929,679 A | 7/1999 | Ohwada |
| 5,949,270 A | 9/1999 | Saito |
| 6,072,353 A | 6/2000 | Matsuzawa |
| 6,166,580 A | 12/2000 | Sessions |
| 6,211,720 B1 | 4/2001 | Matsuzawa |
| 6,229,506 B1 | 5/2001 | Dawson et al. |
| 6,236,576 B1 | 5/2001 | Munk-Nielsen |
| 6,242,951 B1 | 6/2001 | Nakata et al. |
| 6,242,973 B1 | 6/2001 | Kong et al. |
| 6,445,225 B2 | 9/2002 | Andre |
| 6,483,679 B1 | 11/2002 | Anand et al. |
| 6,522,323 B1 | 2/2003 | Sasaki et al. |
| 6,577,302 B2 | 6/2003 | Hunter et al. |
| 6,603,456 B1 | 8/2003 | Aoki et al. |
| 6,628,146 B2 | 9/2003 | Tam |
| 6,686,899 B2 | 2/2004 | Miyazawa et al. |
| 6,731,273 B2 | 5/2004 | Koyama et al. |
| 6,927,618 B2 | 8/2005 | Kimura et al. |
| 6,930,666 B2 | 8/2005 | Miyayzawa et al. |
| 6,972,594 B2 | 12/2005 | Yu |
| 7,090,387 B2 | 8/2006 | Kohno |
| 7,327,168 B2 | 2/2008 | Kimura |
| 7,355,445 B2 | 4/2008 | Kimura |
| 7,365,713 B2 | 4/2008 | Kimura |
| 7,429,985 B2 | 9/2008 | Kimura et al. |
| 7,456,810 B2 | 11/2008 | Kimura |
| 7,528,643 B2 | 5/2009 | Kimura |
| 7,545,357 B2 | 6/2009 | Miyazawa et al. |
| 7,714,616 B2 | 5/2010 | Kimura |
| 7,965,106 B2 | 6/2011 | Kimura |
| 2001/0028271 A1 | 10/2001 | Andre |
| 2002/0008689 A1 | 1/2002 | Koyama et al. |
| 2003/0117352 A1 | 6/2003 | Kimura |
| 2003/0132931 A1 | 7/2003 | Kimura et al. |
| 2003/0174009 A1 | 9/2003 | Kimura et al. |
| 2004/0080474 A1 | 4/2004 | Kimura |
| 2004/0085115 A1 | 5/2004 | Fujiyoshi et al. |
| 2004/0095159 A1 | 5/2004 | Kimura |
| 2004/0155698 A1 | 8/2004 | Kimura |
| 2004/0257117 A1 | 12/2004 | Kimura |
| 2009/0167404 A1 | 7/2009 | Kimura |
| 2011/0248746 A1 | 10/2011 | Kimura |

FOREIGN PATENT DOCUMENTS

| | | |
|---|---|---|
| JP | 60-194819 A | 10/1985 |
| JP | 08-130461 A | 5/1996 |
| JP | 09-172367 A | 6/1997 |
| JP | 09-232938 A | 9/1997 |
| JP | 10-003789 A | 1/1998 |
| JP | 10-303732 A | 11/1998 |
| JP | 11-068534 A | 3/1999 |
| JP | 2000-047646 A | 2/2000 |
| JP | 2000-231089 A | 8/2000 |
| JP | 2001-085989 A | 3/2001 |
| JP | 2001-085990 A | 3/2001 |
| JP | 2002-251174 A | 9/2002 |
| JP | 2002-335147 A | 11/2002 |
| KR | 10-0226227 B1 | 10/1999 |

OTHER PUBLICATIONS

Washio et al.; "18.4: TFT-LCDs with Monolithic Multi-Drivers for High Performance Video and Low-Power Text Modes"; SID 01 Digest; vol. 32; pp. 276-279; 2001.

Kubota et al.; "L1.1: Late-News Paper: Low-Voltage Interface Technology for CGS TFT-LCD with Low Power Consumption"; SID 99 Digest; vol. 30; pp. 1116-1119; 1999.

Cairns et al.; "High Performance Circuitry for Poly-Silicon Integrated Drivers"; Euro Display 99, Late News; pp. 89-92; 1999.

International Search Report (Application No. PCT/JP03/16237 in Japanese), 2 pages, Apr. 13, 2004.

Office Action, Korean Application No. 10-2005-7011975, dated Sep. 24, 2010, 11 pages with English translation.

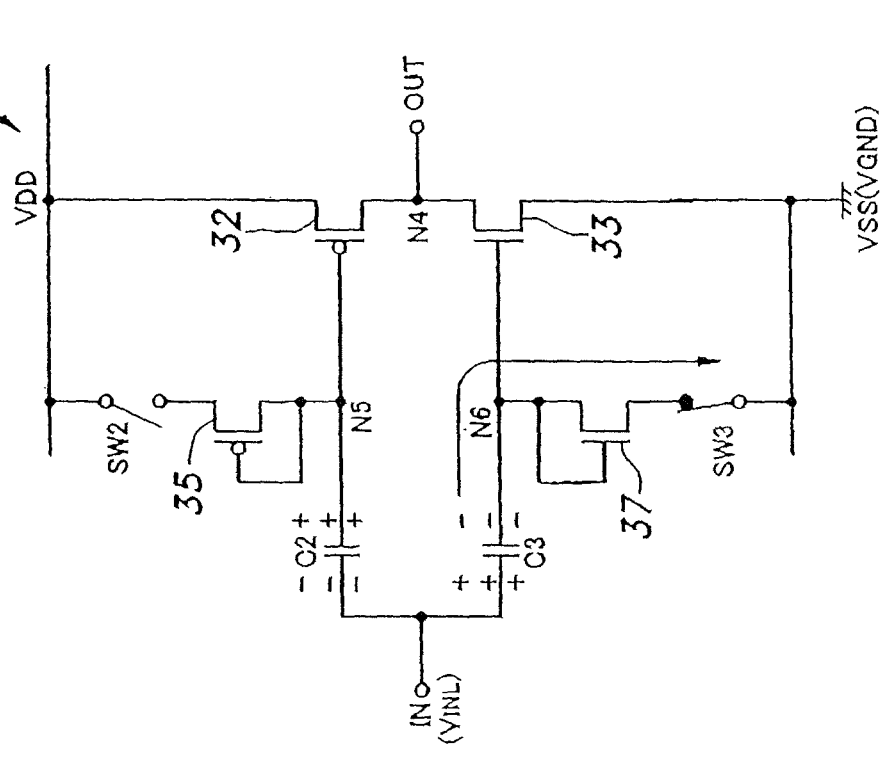
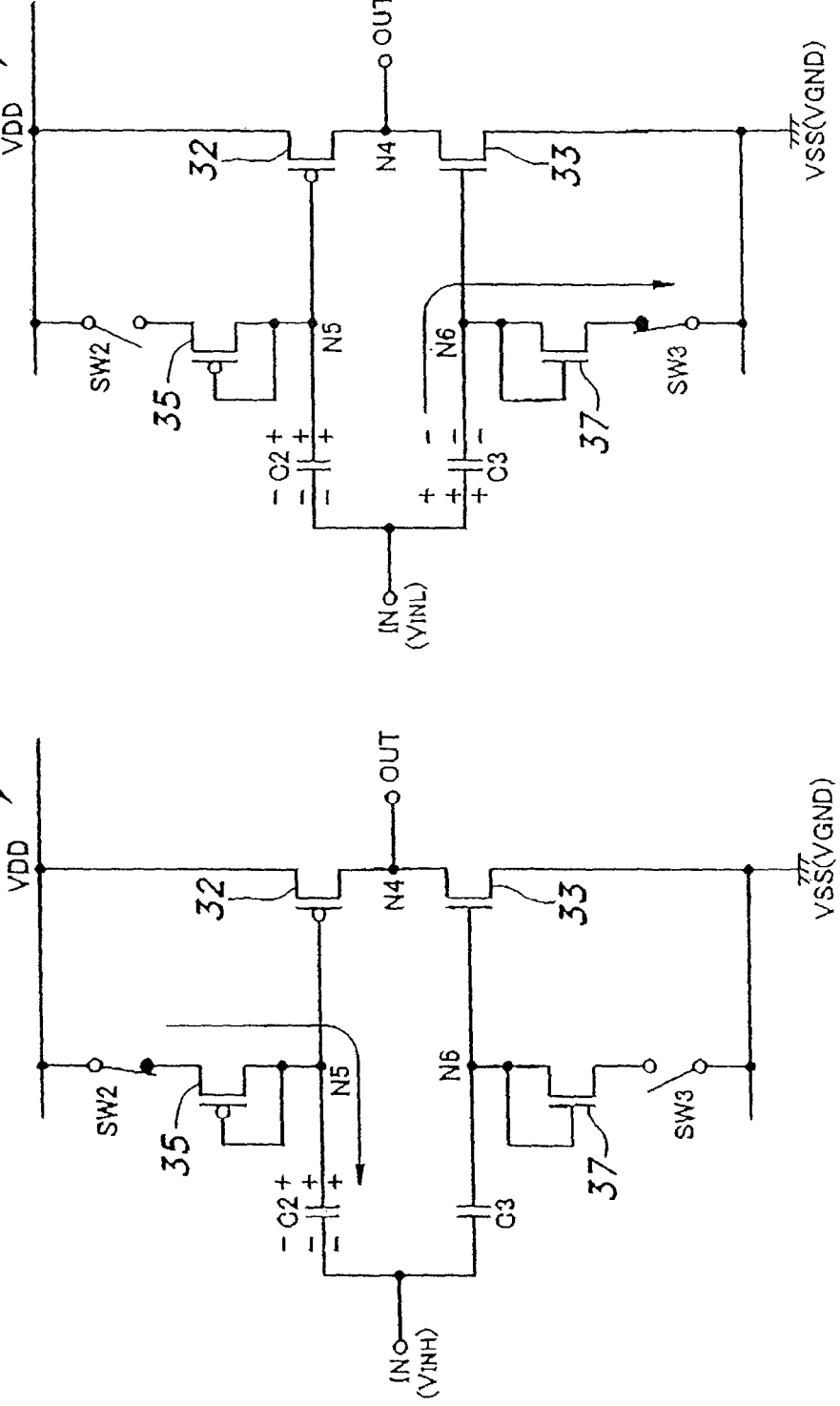

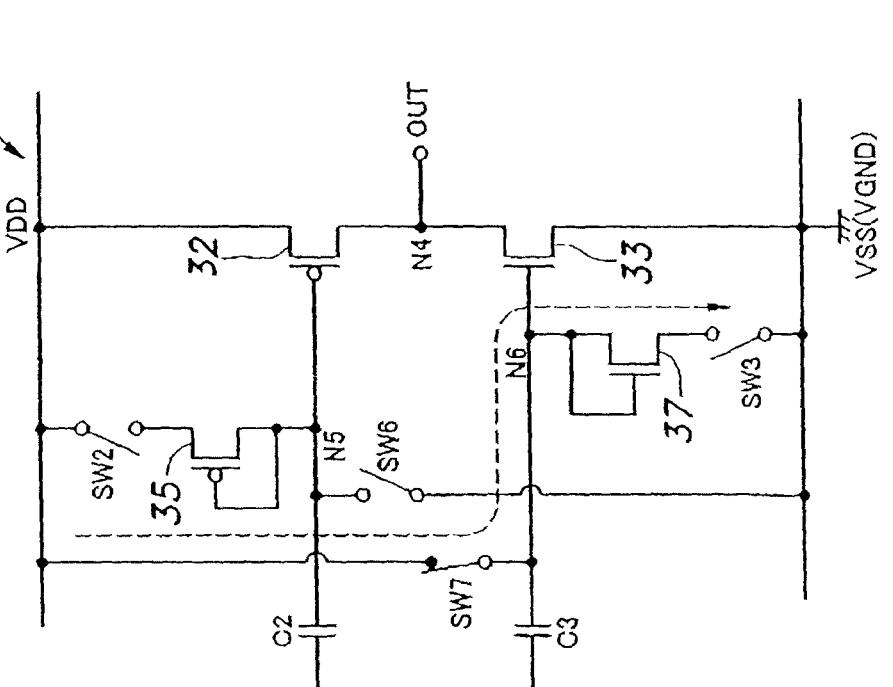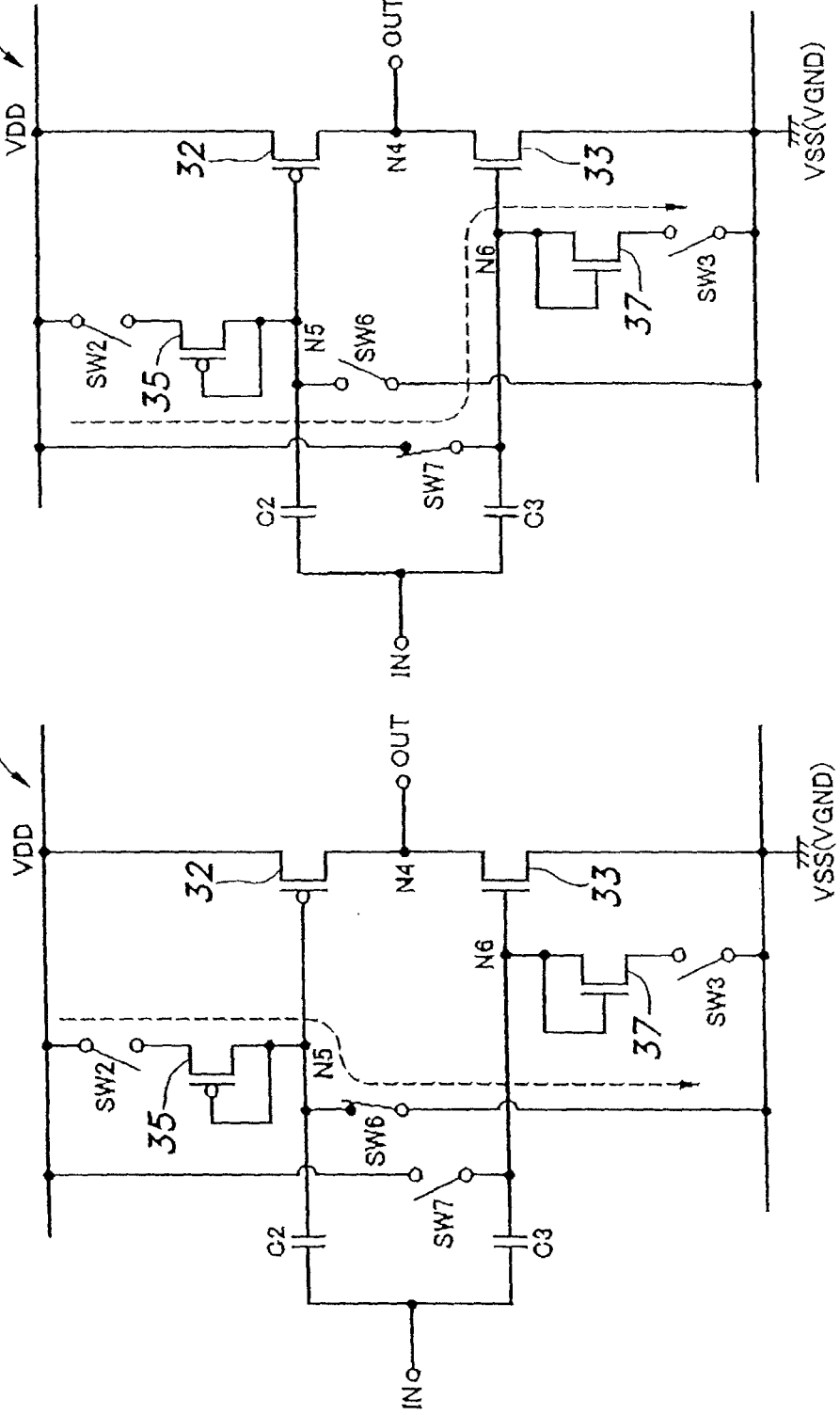

Fig.21
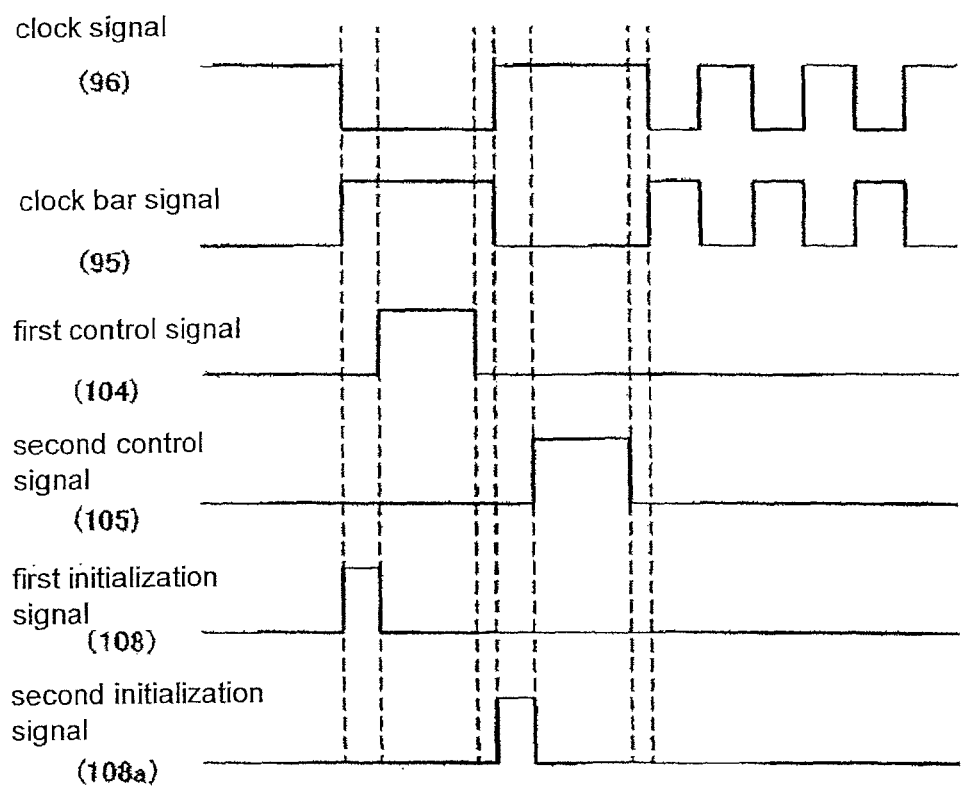
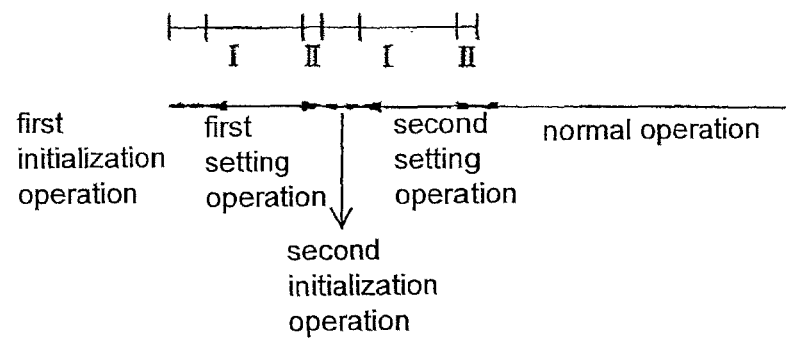

selective period of one gate operation period of shift register | return period one frame period

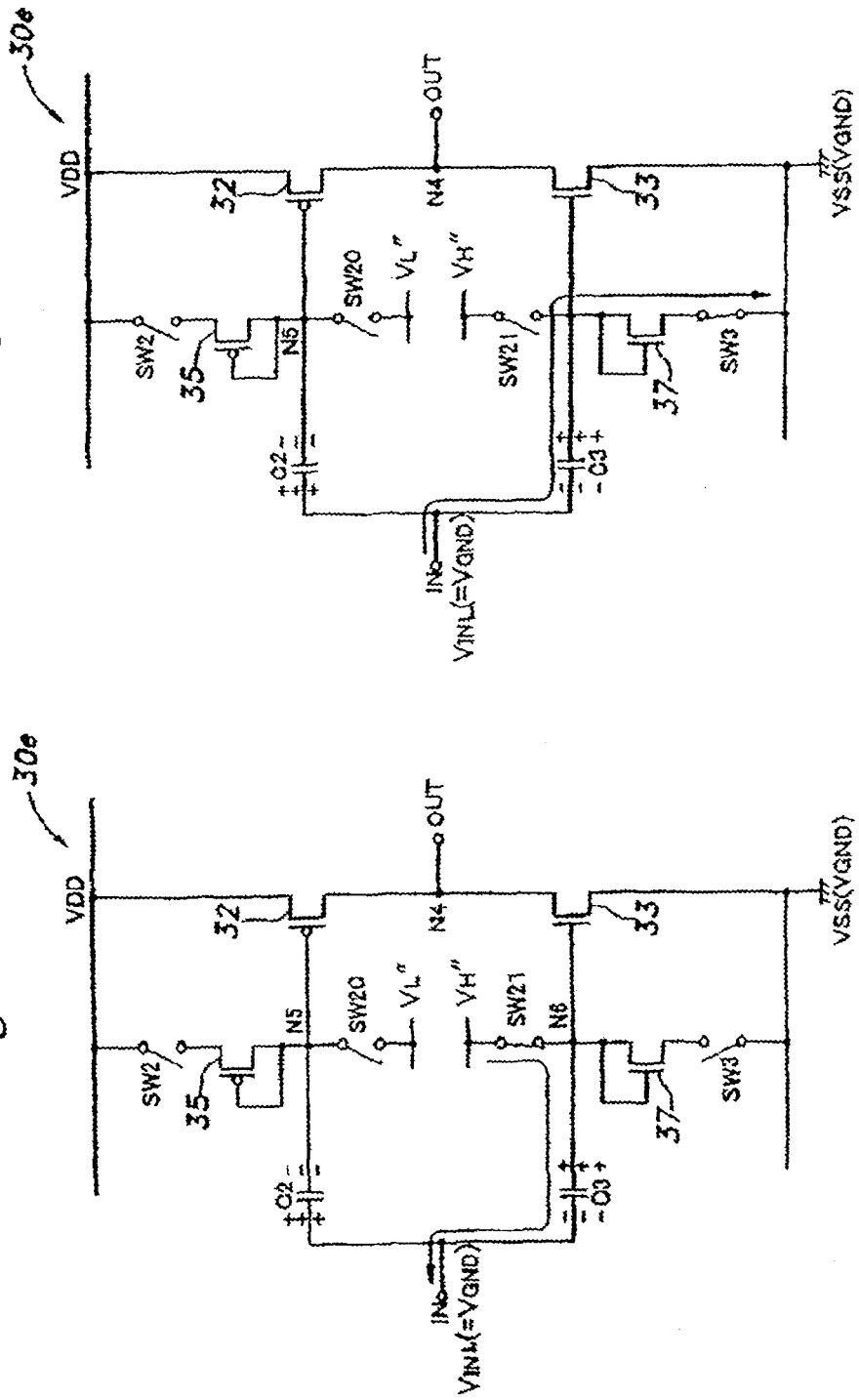

Prior Art

DIGITAL CIRCUIT HAVING CORRECTING CIRCUIT AND ELECTRONIC APPARATUS THEREOF

CROSS-REFERENCE TO RELATED APPLICATIONS

This application is a continuation of U.S. application Ser. No. 13/675,097, filed Nov. 13, 2012, now allowed, which is a continuation of U.S. application Ser. No. 12/185,854, filed Aug. 5, 2008, now U.S. Pat. No. 8,314,514, which is a continuation of U.S. application Ser. No. 10/741,589, filed Dec. 22, 2003, now U.S. Pat. No. 7,411,318, which claims the benefit of a foreign priority application filed in Japan as Serial No. 2002-375002 on Dec. 25, 2002, all of which are incorporated by reference.

TECHNICAL FIELD

The present invention relates to a digital circuit with a transistor. In particular, the invention relates to a digital circuit provided with a correcting circuit that, in the case of an amplitude of an input signal being smaller than that of a power supply voltage and in the case of a power supply voltage being not sufficiently larger than a threshold voltage of a transistor that is used, corrects a DC level of an input signal to realize a preferable circuit operation.

BACKGROUND ART

So far, inverter circuits that use transistors such as bipolar transistors and field effect transistors (FETs) have been widely used. In FIG. 36a, a typical example of an existing CMOS inverter circuit that uses MOSFETs as transistors is shown. A CMOS inverter circuit 200 has a PMOSFET 201 having a threshold voltage $V_{THP}$ and an NMOSFET 202 having a threshold voltage $V_{THN}$ with these FETs serially connected between a high level power supply potential VDD and a low level power supply potential VSS (normally $V_{THP}$ is negative and $V_{THN}$ is positive). A source of the PMOSFET 201 is connected to the high level power supply potential VDD and a source of the NMOSFET 202 is connected to the low level power supply potential VSS. Drains of both of the MOSFETs 201 and 202 are connected to each other and a connection point N (node) thereof is connected to an output terminal OUT. Furthermore, both gates of the MOSFETs 201 and 202 are connected to an input terminal IN to which an input signal that oscillates between a high level input potential $V_{INH}$ and a low level input potential $V_{INL}$ is inputted. In the present specification, unless stated, "connection" of a circuit element means "electrical connection".

An ordinary operation of the CMOS inverter circuit 200 having such a configuration is shown in FIG. 36b and FIG. 36c. In FIGS. 36b and 36c, in order to show an ON/OFF state of the MOSFETs 201 and 202, the MOSFETs 201 and 202 each is shown with a sign of a switch. As shown in FIG. 36b, when to the input terminal IN, a high level input potential $V_{INH}$ equal to or higher than a value obtained by subtracting an absolute value of the threshold voltage of the PMOSFET $|V_{THP}|$ from the high level power supply potential VDD is inputted, the PMOSFET 201 is turned off and the NMOSFET 202 is turned on to supply a potential substantially equal to the low level power supply potential VSS to the output terminal OUT as an output signal. Furthermore, as shown in FIG. 36c, when to the input terminal IN, a low level input potential $V_{INL}$ equal to or lower than a value obtained by adding an absolute value of the threshold voltage of the NMOSFET $|V_{THN}|$ to the low level power supply potential VSS is inputted, the PMOSFET 201 is turned on and the NMOSFET 202 is turned off to supply a potential substantially equal to the high level power supply potential VDD to the output terminal OUT as an output signal.

However, in the case of an input signal being supplied from, for instance, an IC and so on of which operating voltage is low, problems below are caused. As shown in FIG. 37a, in the case of a high level input potential $V_{INH}$ inputted to the input terminal IN being smaller than a value obtained by subtracting an absolute value of the threshold voltage of the PMOSFET 201 $|V_{THP}|$ from the high level power supply potential VDD, in the PMOSFET 201, a gate-source voltage $V_{GS}$ (=gate potential $V_G$–source potential $V_s$)←$|V_{THP}|$ is realized, the PMOSFET 201 is not turned off. As a result, both the MOSFETs 201 and 202 are turned on, and a potential divided by on-state resistances of the PMOSFET 201 and the NMOSFET 202 is outputted to the output terminal OUT, that is, the low level power supply potential VSS is not outputted. Similarly, as shown in FIG. 37b, in the case of a low level input potential $V_{INL}$ inputted to the input terminal IN being higher than a value obtained by adding an absolute value of the threshold voltage of the NMOSFET 202 $|V_{THN}|$ to the low level power supply potential VSS, the NMOSFET 202 is not turned off, both the MOSFETs 201 and 202 are turned on, and the high level power supply potential VDD is not outputted to the output terminal OUT. Thus, in the case of, because of levels between input potentials $V_{INH}$, $V_{INL}$ and power supply potentials VDD, VSS being different, the MOSFETs 201 and 202 of the inverter circuit 200 being not assuredly turned on or off and an output not taking a desired value, there are problems in that a circuit in a later stage of the inverter 200 cannot be driven, or an operation of such circuit becomes uncertain. Furthermore, since both the MOSFETs 201 and 202 are simultaneously turned on to flow a short current, there is caused a problem also in that power consumption increases.

In order to overcome the problems as mentioned above, it is proposed that, in a level shifter circuit that has a first input inverter and a second output inverter, a DC level of a signal that is inputted from the first inverter to the second inverter is converted by use of a capacitor (condenser) and a biasing means (see Japanese Patent Application Laid-Open No. H9-172367). However, in this circuit, since a DC level converting capacitor that is connected between a gate of each of the transistors constituting the second inverter and an output of the first inverter is always connected to a high level power supply potential or a low level power supply potential with the biasing means, there are problems in that charge and discharge of the capacitors may adversely affect on the dynamic characteristics of the circuit (that is, lower a circuit operation speed), or power consumption due to the charge and discharge of the capacitors may become a magnitude that cannot be ignored. Furthermore, in the case of there being variations in the threshold voltages of the transistors, the electrostatic capacity of each of the capacitors can be conformed with difficulty to a corresponding transistor. Accordingly, there may occur a problem in that a voltage across the DC level converting capacitor cannot be matched to a threshold voltage of the corresponding transistor, and the transistors cannot be accurately turned on or off.

Furthermore, in the inverter circuit 200 shown in FIG. 36a, in the case of a power supply voltage (VDD–VSS) being small, for instance, to suppress the power consumption, and, being not sufficiently large with respect to the absolute values of the threshold voltages of the MOSFETs 201 and 202, even when an amplitude of an input signal inputted to the input terminal IN is equal to that of a power supply voltage, there may occur a problem in that a sufficient current cannot be flowed to the MOSFETs 201 and 202 to drive with high speed. This is due to that it is not a gate-source voltage $V_{GS}$ that contributes to a current that flows in the MOSFET but $V_{GS}-V_{TH}$. For instance, in the inverter circuit 200 shown in FIG. 36a, VDD=3.3 V, VSS=0 V (ground), a threshold voltage of the PMOSFET 201 $V_{THP}$=−2 V, a threshold voltage of the NMOSFET 202 $V_{THN}$=3 V, a high level input potential $V_{INH}$=VDD=3.3 V, and a low level input potential $V_{INL}$=VSS=0 V are assumed. In the case of the low level input potential $V_{INL}$ being added to the input terminal IN, in the PMOSFET 201, $V_{GS}-V_{THP}$=−3.3−(−2)=−1.3 V is obtained, and the PMOSFET 201 is thus turned on, whereas in the NMOSFET 202, $V_{GS}-V_{THN}$=0−3=−3 V is obtained, and the NMOSFET 202 is thus turned off. In this case, since the absolute value of the threshold voltage (−2 V) of the PMOSFET is sufficiently small with respect to a power supply voltage (that is, an amplitude of an input signal), the absolute value of ($V_{GS}-V_{THP}$) can become large (1.3 V), accordingly, there is caused no problem. On the other hand, in the case of a high level input potential $V_{INH}$ being added to the input terminal IN, in the PMOSFET 201, $V_{GS}-V_{THP}$=0−(−2)=2 V is obtained, and the PMOSFET 201 is thus turned off, whereas in the NMOSFET 202, $V_{GS}-V_{THN}$=3.3−3=0.3 V is obtained, and the NMOSFET 202 is thus turned on. However, since $V_{GS}-V_{THN}$ is such small as 0.3 V, a small current flows and the NMOSFET 202 cannot be operated (on) at high speed. It is a matter of course that when amplitudes of the power supply voltage and the input signal are made larger, the high-speed operation can be realized, but the power consumption increases.

DISCLOSURE OF THE INVENTION

The present invention is carried out to overcome problems of the prior art as mentioned above. A primary object of the invention is to provide a digital circuit having a switching circuit that uses a transistor, wherein in accordance with relationship between a power supply voltage, an amplitude of an input signal and a threshold voltage of a transistor, the input, signal is properly corrected and thereby a proper circuit operation is realized.

A second object of the invention is to provide a digital circuit having a switching circuit that uses a transistor, wherein even in the case of an amplitude of an input signal being smaller than a power supply voltage (difference between a high level power supply potential and a low level power supply potential), the transistor can be assuredly turned on and off.

A third object of the invention is to provide a digital circuit having a switching circuit that uses a transistor, wherein even in the case of an amplitude of an input signal being smaller than a power supply voltage, the transistor can be assuredly turned on and off without deteriorating the dynamic characteristics.

A fourth object of the invention is to provide a digital circuit having a switching circuit that uses a transistor, wherein even in the case of an amplitude of an input signal being smaller than a power supply voltage, a DC level converting capacitor connected to a control terminal of a transistor contained in the switching circuit is charged to a proper value according to a threshold voltage of a corresponding transistor, and thereby the transistor can be assuredly operated.

A fifth object of the invention is to provide a digital circuit having a switching circuit that uses a transistor, wherein even in the case of a power supply voltage being not sufficiently large with respect to the absolute value of a threshold voltage of the transistor, a sufficient current can flow to the transistor to operate the digital circuit with high-speed.

In order to achieve the above objects, according to the invention, provided is a digital circuit having a switching circuit connected between an input terminal and an output terminal. The switching circuit includes a first transistor that is provided with a first terminal, a second terminal and a control terminal and can be ON/OFF controlled by varying a potential of the control terminal with respect to the first terminal. A first power supply potential is inputted to the first terminal of the first transistor in normal operation, and the signal at the output terminal depends on whether the first transistor is ON or OFF. In a normal operation, an input signal that oscillates between a first input potential that turns off the first transistor and a second input potential that turns on the first transistor is input to an input terminal. The digital circuit has a correcting circuit connected between the input terminal and the control terminal of the first transistor. The correcting circuit has a) a capacitor, one terminal of which is connected to the input terminal and the other terminal of which is connected to the control terminal of the first transistor and b) at least one switch for determining a conduction path for setting, in a setting operation prior to a normal operation, electric charges that are accumulated in the capacitor so that a voltage across thereof may be a predetermined value. In a normal operation, a state of the at least one switch is set so as to hold a voltage across the capacitor.

According to such a configuration, in a setting operation prior to a normal operation, when a voltage across the capacitor is properly set in accordance with a power supply voltage, an amplitude of an input signal, a threshold voltage of the first transistor and so on, a DC level of the input signal can be corrected in the normal operation and thereby a preferable circuit operation can be realized. In the normal operation, since a switch is set so as to hold a voltage (or electric charges) between both ends of the set capacitor, there is no concern of the capacitor adversely affecting on the dynamic characteristics of the digital circuit (that is, operation speed is not lowered). On the contrary, the capacitor, being connected in series with parasitic capacitance of the transistor to lower total capacitance, can contribute to improve the dynamic characteristics. Furthermore, since there is no need of frequently carrying out the setting operation, power consumption due to the setting operation is only slight.

Preferably, the correcting circuit further includes a second transistor that is provided with a first terminal, a second terminal and a control terminal, capable of being ON/OFF controlled by varying a potential of the control terminal with respect to the first terminal, and has the same conductivity type and the substantially same threshold voltage as the first transistor, and the first terminal of the second transistor is connected to a first power supply potential, and the second terminal and the control terminal of the second transistor are connected to each other and connected to a node between the capacitor and the control terminal of the first transistor. At least one switch includes a first switch connected in series with the second transistor, and in a normal operation, the first switch is turned off.

Typically, the first and the second transistors are constituted of FETs, and each of the first terminals, the second terminals and the control terminals of the first and the second transistors is constituted of a source, a drain and a gate, respectively. As the power supply potential, a high level power supply potential and a low level power supply potential are supplied. When an input signal oscillates between a high level input potential and a low level input potential, in the case of the first transistor being, for instance, a PMOSFET, the first power supply potential can be set at the high level power supply potential and a first input potential can be set at the high level input potential. Furthermore, in the case of the first transistor being, for instance, an NMOSFET, the first power supply potential can be set at the low level power supply potential and the first input potential can be set at the low level input potential.

According to one preferable embodiment according to the invention, even when an amplitude of an input signal is smaller than a power supply voltage, the setting operation is performed so as to assuredly turn on/off the first transistor. That is, in the setting operation, with the first switch turned on, a potential substantially equal to the first input potential is inputted to one terminal of the capacitor until the second transistor is turned off. Here, "the second transistor being turned off" means being turned off substantially. That is, the second transistor is not necessarily turned off completely (that is, a current that flows in the second transistor does not necessarily become zero completely), but the current that flows in the second transistor has only to become sufficiently small. In such a setting operation, a current is flowed to a capacitor connected between the control terminal and the input terminal of the first transistor through the second transistor of which second terminal and control terminal are connected to each other (that is, diode-connected) until the second transistor is turned off or a current value becomes very small. According to this, the capacitor can be charged so that a voltage across thereof may be a proper voltage that reflects difference between the first power supply potential and the first input potential and the threshold voltage of the first transistor. Thereby, in a normal operation, when a voltage of the charged capacitor is added to the input signal followed by inputting to the control terminal of the first transistor, the first transistor can be assuredly turned on/off. The reason for the threshold voltage of the first transistor being able to reflect on the voltage of the capacitor is that the threshold voltage of the first transistor and that of the second transistor are substantially equal. The threshold voltages of the first and the second transistors, though desirably equal, may be a little different as far as in the setting operation a capacitor for use in correction of input signal can be properly charged to allow operating a digital circuit normally. Furthermore, in the case of an FET being used as a transistor, the threshold voltage is plus for an N-type and minus for a P-type in many cases. However, even when the threshold voltage takes a value other than that, the invention can be applied.

Furthermore, a rectifier element is preferably connected in parallel with the second transistor and so that the forward direction thereof may be opposite to the forward direction of the second transistor. Thereby, even in the case of electric charges that oppositely bias the diode-connected first transistor being accumulated in the capacitor owing to, for instance, noise and so on, when the first switch is turned on in a setting operation, a current is capable of flowing through the rectifier element, and thereby a voltage across the capacitor can be converged to a proper value. The rectifier element may be formed of, for instance, a diode-connected transistor having the same conductivity type as that of the second transistor.

Still furthermore, it is preferable that a node between the capacitor and the control terminal of the first transistor is connected through a further switch to a potential different from the first power supply potential, and the further switch is turned on prior to the setting operation, such that a potential of the node can be set to a predetermined potential. Here, the predetermined potential is such a potential at which the second transistor is turned on owing to the difference between the first power supply potential and the predetermined potential, after the potential of the node is set at a predetermined potential, when the first switch is turned on in the setting operation that is carried out with the further switch turned-off. According to this, even in the case of electric charges being accumulated without being desired in the capacitor owing to, for instance, noise and so on, when, prior to the setting operation, a potential of a node between the capacitor and the control terminal of the first transistor is set at a proper value, the setting operation can be assuredly performed, and thereby a voltage across the capacitor can be converged to a proper value corresponding to the difference between the first power supply potential and the first input potential and the threshold voltage of the first transistor. When the different potential from the first power supply potential is set at a second power supply potential, the different potential can be preferably supplied with ease.

Furthermore, one terminal of the capacitor may be connected through the second switch to an input terminal and through a third switch to a potential substantially equal to the first input potential, so that the second switch is turned on and the first and the third switches are turned off in a normal operation, whereas the second switch is turned off and the first and the third switches are turned on in the setting operation. According to this, the setting operation can be easily carried out only by switching the switch, without controlling the input potential. Furthermore, even in the case of, for instance, two transistors different in the polarity being used as the first transistor, the setting operation of these transistors can be simultaneously carried out.

According to another preferable embodiment of the invention, provided is a digital circuit in which even in the case of, for instance, a power supply voltage being low, and the power supply voltage being not sufficiently large with respect to the absolute value of the threshold voltage of the transistor, the setting operation can be carried out so that a sufficient current may flow to the transistor to operate with high-speed. In such a digital circuit, the node between the capacitor and the control terminal of the first transistor is connected through the second switch to a predetermined potential. The setting operation includes a first setting operation and a second setting operation. In the first setting operation, the second switch is turned on and the first input potential is inputted to the input terminal to charge the capacitor. In the second setting operation, with the first input potential inputting to the input terminal, the second switch is turned off and the first switch is turned on, and thereby through the second transistor the capacitor is discharged. The discharge of the capacitor through the second transistor is carried out until a current flowing the second transistor becomes substantially zero, that is, until a voltage across the capacitor may be substantially equal to the threshold voltage of the second transistor. The above-mentioned predetermined potential is a potential at which when the first switch is turned on in the second setting operation the second transistor is turned on, and can be set at, for instance, a second power supply potential different from the first power supply potential. Furthermore, typically, the first input potential is equal to the first power supply potential and the second input potential is equal to the second power supply potential.

When the voltage across the capacitor is set as mentioned above, in a normal operation, when the first input potential is inputted to the input terminal, potential difference between the control terminal and the first terminal of the first transistor becomes equal to the threshold voltage of the first transistor to turn off the first transistor. Meanwhile, when the second input potential is inputted, the voltage across the capacitor is superposed on the second input potential so that the first transistor may be accelerated in turning on, and thereby a sufficient current can flow to the first transistor to turn on with high-speed.

Furthermore, one terminal of the capacitor may be connected through the third switch to the input terminal and connected through a fourth switch to a potential substantially equal to the first input potential, so that the third switch is turned on and the first, the second and the fourth switches are turned off in a normal operation, the second and the fourth switches are turned on and the third switch is turned off in the first setting operation, and the second and the third switches are turned off and the first and the fourth switches are turned on in the second setting operation. By thus setting, the setting operation can be easily carried out only by switching the switches, without controlling the input potential. Still furthermore, in the case of, for instance, two transistors different in the polarity being used as the first transistor, the setting operation of these transistors can be simultaneously performed.

The switching circuit can take various forms such as an inverter circuit, a clocked inverter circuit, a logic circuit such as a NAND and a NOR, a level shift circuit or a transfer gate. In the case of the inverter circuit, the one using a transistor and a resistor, or the one using transistors with the same polarity one of which is diode-connected so as to operate as a resistor can be used as well as a CMOS inverter using two MOSFETs different in the polarity. In the case of the clocked inverter circuit, a transistor that provides a correcting circuit may be either or both of a transistor that constitutes the inverter body and a transistor for use in clock signal synchronization.

The abovementioned switches (the first switch connected in series with the diode-connected second transistor, and so on) may be any one of electrical ones and mechanical ones as far as a current flow can be controlled. They may be transistors, diodes, or logic circuits made of combinations thereof. When the switches are made of semiconductor elements such as MOSFETs, it is preferable because an entire digital circuit can be formed through a semiconductor process. When the switch is made of a transistor, since it is used only as the switch, the conductivity type of the transistor is not particularly restricted. However, in the case of an off current being desirable to be small, it is desirable to use a transistor having the polarity less in the off current. As a transistor less in the off current, there is the one in which an LDD region is disposed, and so on. Furthermore, when a potential of a source terminal of a transistor functioning as a switch operates in a state close to a low potential side power supply (Vss, Vgnd, 0V and so on), an n-channel type is desirably used. On the contrary, when a potential of the source terminal operates in a state close to a high potential side power supply (Vdd and so on), a p-channel type is desirably used. The reason for this is that since the absolute value of a gate-source voltage can be made larger, the transistor can easily operate as a switch. With both an n-channel type and a p-channel type, a CMOS type switch may be formed.

Furthermore, in order to inhibit electric charges accumulated owing to noise and so on in the capacitor without being desired from adversely affecting during the setting operation, a further switch may be connected in parallel with the capacitor. When the switch is turned on prior to the setting operation, the electric charges accumulated in the capacitor can be discharged.

With the aforementioned digital circuit having the switching circuit using transistors, various semiconductor devices (or electronic apparatuses) typified by integrated circuits and semiconductor display devices can be preferably realized. Such semiconductor devices include a liquid crystal display device, a self-light emitting type display device having an organic EL display light emitting element in each pixel, a DMD (Digital Micromirror Device), a PDP (Plasma Display Panel), an FED (Field Emission Display) and the like, and the digital circuit according to the invention can be applied to a driver circuit and so on thereof. When the digital circuit according to the invention is applied to a semiconductor device that is formed by using a glass substrate, since an amplitude of a signal inputted from an IC is not needed to be controlled with a booster circuit, a semiconductor device can be reduced in size, leading to lowered cost of the device itself.

The characteristics, objects and effects of the invention will be more clarified when preferable embodiments are explained with reference to the accompanying drawings.

BRIEF DESCRIPTION OF THE DRAWINGS

FIGS. 6a and 6b are diagrams each showing a setting operation of the digital circuit shown in FIG. 5.

FIGS. 11a and 11b are diagrams each showing an initialization operation in the digital circuit shown in FIG. 10.

FIG. 21 is a timing chart showing signals (potentials) of the respective portions in an initialization, a setting operation and a normal operation of a shift register including the clocked inverter circuit shown in FIG. 20.

FIGS. 31a and 31b are diagrams each showing a setting operation of the digital circuit shown in FIG. 29.

FIGS. 36b and 36c are diagrams each showing a normal operation of the CMOS inverter circuit shown in FIG. 36a.

BEST MODE FOR CARRYING OUT THE INVENTION

In what follows, most preferable embodiments according to the invention will be explained with reference to the drawings.

Figure 1:
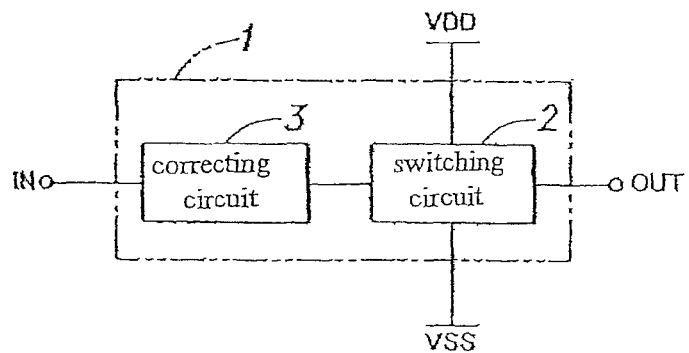
FIG. 1 is a block diagram showing a schematic configuration of the invention.

FIG. 1 is a block diagram showing a schematic configuration of a digital circuit based on the invention. As shown in FIG. 1, a digital circuit 1 based on the invention includes a switching circuit 2 having a transistor such as a MOSFET, that is connected between an input terminal IN and an output terminal OUT, and outputs a different signal (for instance, a high level power supply potential VDD or a low level power supply potential VSS) to the output terminal in accordance with a value of an input signal inputted to the input terminal; and a correcting circuit 3 connected between the input terminal IN and the switching circuit 2.

Figure 2:
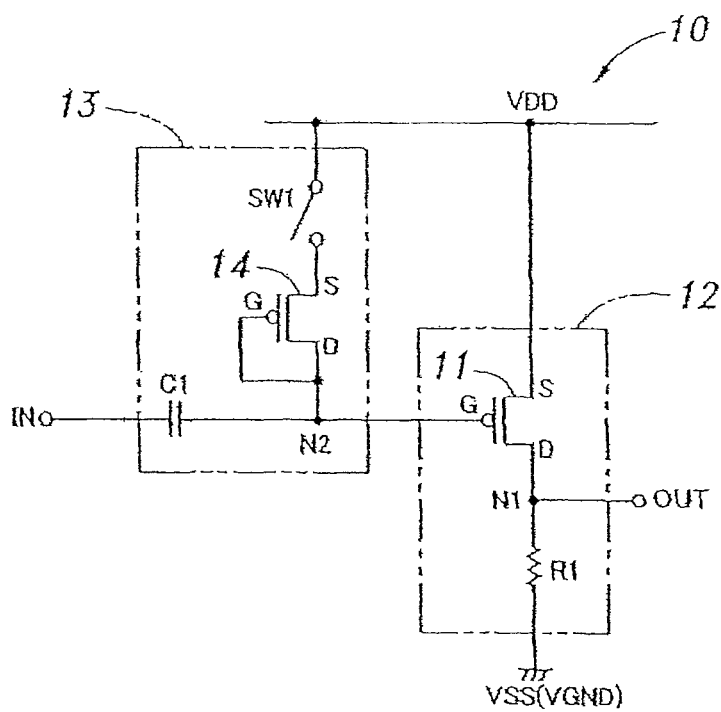
FIG. 2 is a circuit diagram showing one embodiment of a digital circuit based on the invention.

FIG. 2 is a circuit diagram showing one embodiment of a digital circuit based on the invention. A digital circuit 10 includes, as a switching circuit, an inverter circuit 12 that is constituted of one PMOSFET 11 and a resistor R1. The PMOSFET 11 has a threshold voltage $V_{THP}$, a source thereof being connected to a high level power supply potential VDD, and a drain thereof being connected to a low level power supply potential VSS (for instance, a ground potential $V_{GND}$) through the resistor R1. A gate that works as a control terminal of the PMOSFET 11 is connected to an input terminal IN to which an input signal that oscillates between a high level input potential $V_{INH}$ and a low level input potential $V_{INL}$ is inputted, a node N1 between the drain and the resistor R1 being connected to an output terminal OUT.

Between the gate of the PMOSFET 11 and the input terminal IN, a correcting circuit 13 is connected. The correcting circuit 13 includes a capacitor C1 connected between the gate of the PMOSFET 11 and the input terminal IN, a PMOSFET 14 that has the same conductivity and the substantially same threshold voltage $V_{THP}$ as the PMOSFET 11, and a switch SW1. A drain of the PMOSFET 14 is connected to a node N2 between the capacitor C1 and the gate of the PMOSFET 11, a source thereof being connected through the switch SW1 to the high level power supply potential VDD. The switch SW1 may be disposed between the drain of the PMOSFET 14 and the node N2, that is, has only to be connected in series with the PMOSFET 14. Furthermore, the PMOSFET 14, with the gate and the drain connected to each other, forms a so-called "diode-connection". Thereby, a gate-source voltage $V_{GS}$ of the PMOSFET 14 becomes equal to a source-drain voltage $V_{DS}$ thereof.

An operation of thus constituted digital circuit 10 will be explained below. For the sake of explanation, in this embodiment, it is assumed that a high level input potential $V_{INH}$ of an input signal inputted to the input terminal IN is lower than a value obtained by subtracting the absolute value of a threshold voltage $V_{THP}$ from a high level power supply potential VDD (that is, a value at which, in an existing circuit, when an input signal is a high level input potential $V_{INH}$, the PMOSFET 11 is not turned off) and a low level input potential $V_{INL}$ is equal to a ground potential $V_{GND}$ (that is, a value low enough to turn on the PMOSFET 11).

Figure 3A:
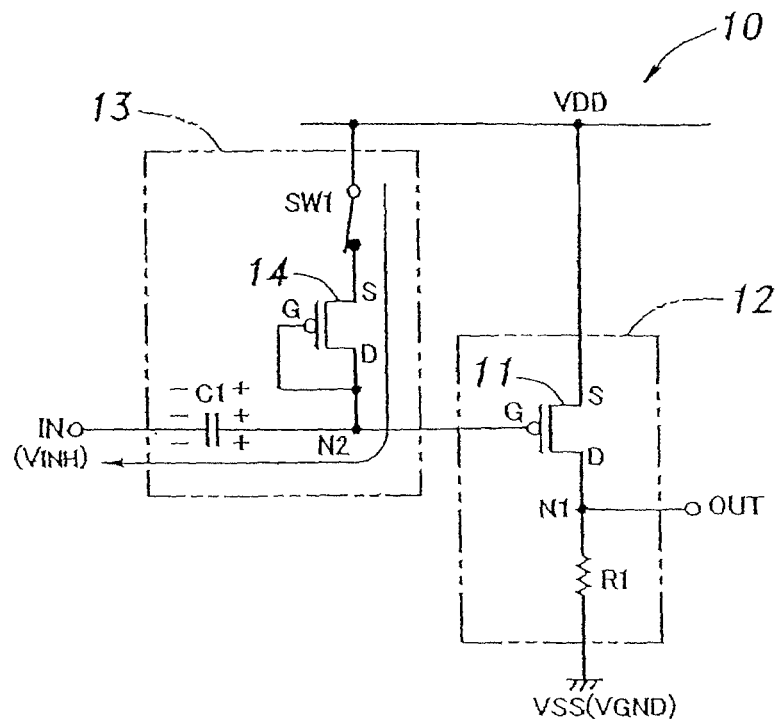
FIG. 3a is a diagram showing a setting operation of the digital circuit shown in FIG. 2.

Firstly, in the setting operation, as shown in FIG. 3a, the switch SW1 is turned on, and in this state, a high level input potential $V_{INH}$ is inputted to the input terminal IN. Accordingly, a current flows through the PMOSFET 14 as shown by an arrow in the drawing and thereby the capacitor C1 is charged. After a sufficient time, a voltage across the capacitor C1 rises, thereby the absolute value of a gate-source voltage $V_{GS}$ of the PMOSFET 14 becomes small, finally the PMOSFET 14 is turned off, and thus the current is stopped. At this time, a voltage across the capacitor C1 becomes VDD−$V_{INH}$−|$V_{THP}$|.

Figure 3B:
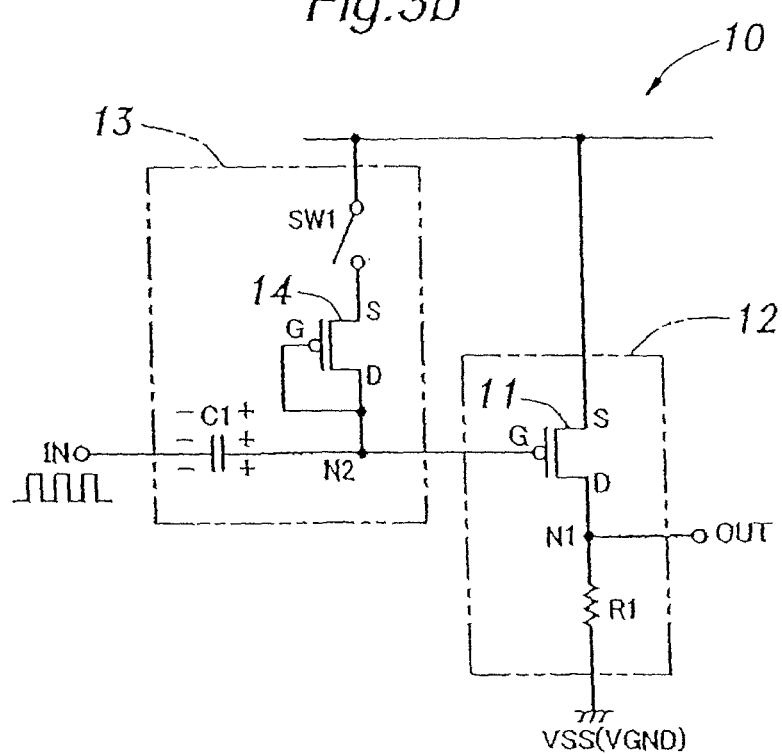
FIG. 3b is a diagram showing a normal operation.

After the capacitor C1 is properly charged thus in the setting operation, in a normal operation, as shown in FIG. 3b, the switch SW1 is turned off, and an input signal that oscillates between a high level input potential $V_{INH}$ and a low level input potential $V_{INL}$ is inputted to the input terminal IN. Since the switch SW1 is turned off at this time, electric charges accumulated in the capacitor C1 are held, that is, a voltage across the capacitor C1 is maintained constant. Accordingly, in the case of a high level input potential $V_{INH}$ being inputted to the input terminal IN, since a voltage across the capacitor C1, VDD−$V_{INH}$−$V_{THP}$, is added thereto, a gate potential of the PMOSFET 11 becomes VDD−|$V_{THP}$|, and a gate-source voltage $V_{GS}$ thereof becomes −|$V_{THP}$|. Accordingly, the PMOSFET 11 can be assuredly turned off without causing a leakage current. Thereby, a ground potential $V_{GND}$ is outputted to the output terminal OUT. The setting operation is not necessarily carried out until the PMOSFET 14 is completely turned off (that is, until the current flowing through the PMOSFET 14 becomes completely zero). Even when a slight current flows in the PMOSFET 14, at a time when the capacitor C1 is charged enough to an extent that allows properly correcting an input signal in a normal operation (that is, the PMOSFET 14 is substantially turned off), the setting operation can be finished without causing practical operational problems.

On the other hand, in the case of a low level input potential $V_{INL}$ being inputted to the input terminal IN, a gate potential of the PMOSFET 11 becomes lower than that in the case of a high level input potential $V_{INH}$ being inputted to the input terminal IN, and $V_{GS}$ becomes $-|V_{THP}|-(V_{INH}-V_{INL})$. Accordingly, $V_{GS} \leftarrow |V_{THP}|$ is satisfied, the PMOSFET 11 is turned on, and a potential of the output terminal OUT becomes substantially equal to the high level power supply potential VDD. In the case of the capacitor C1 being not sufficiently large with respect to a gate capacitance of the PMOSFET 11, an input voltage ($V_{INH}$, $V_{INL}$) is divided by the capacitor C1 and the gate capacitance, therefore, a sufficient voltage is not applied to the gate of the PMOSFET 11. Accordingly, the amount of the capacitor C1 is preferably determined in consideration of the gate capacitance of the PMOSFET 11 connected to the capacitor C1. For example, it is desirable that the capacitor C1 has five times as large capacitance as the gate capacitance of the PMOSFET 11.

As described above, in this embodiment, even in the case of a high level input potential $V_{INH}$ being lower than a high level power supply potential VDD as the first power supply potential, the capacitor C1 connected between the gate of the PMOSFET 11 constituting the inverter circuit 12 and the input terminal IN is charged to a proper voltage, in the setting operation, through the diode-connected PMOSFET 14 that has the substantially same threshold voltage as the PMOSFET 11 and is used for setting operation, and thereby the PMOSFET 11 can be assuredly turned off. According to the invention, a booster is not needed to be provided additionally, therefore, the cost reduction and downsizing of a device can be achieved. Further, in the case of inputting a signal from an IC to a digital circuit formed on a glass substrate, the signal can be inputted directly to the digital circuit without using a booster circuit. Note that in the above embodiment, even when a high level input potential $V_{INH}$ is equal to or higher than a high level power supply potential VDD, the capacitor C1 can be operated normally in the setting operation, though it is not charged.

In the case of a plurality of digital circuits 10 being used for a drive unit of a liquid crystal display or an organic EL display for instance, a plurality of PMOSFETs 11 constituting each inverter circuit 12 are included, and threshold voltages thereof may vary owing to variations in the impurity concentration, the crystalline state of channel portions, and so on. According to the invention, however, a threshold voltage of the diode-connected PMOSFET 14 that is included in the correcting circuit 13 corresponding to each PMOSFET 11 is substantially equal to that of the PMOSFET 11 constituting the inverter circuit 12, and thereby the DC level converting capacitor C1 in the correcting circuit 13 can be charged so as to supply a proper voltage depending on the threshold voltage of the corresponding PMOSFET 11. In an actual semiconductor circuit, these PMOSFETs 11 and 14 are provided close to each other so as not to have differences in the impurity concentration and so on. According to this, the threshold voltage of the PMOSFET 11 constituting the inverter circuit 12 can be made substantially equal to that of the PMOSFET 14 for setting operation. Further, in the case of including a manufacturing step for crystallizing a channel portion by laser irradiation, channel portions of the PMOSFET 11 and the PMOSFET 14 are preferably crystallized by laser beam spot with the same pulse in order to make the threshold voltages closer to each other. It is preferable that the sizes of the channel length L, the channel width W and so on of the PMOSFETs 11 and 14 are substantially same to easily realize the substantially same threshold voltage. However, the sizes of the PMOSFET 11 and the PMOSFET 14 may be different as long as the threshold voltages thereof are substantially the same. For example, the channel length and/or the channel width W of the PMOSFET 14 can be made small in order to reduce the layout area. Alternatively, the channel width W of the PMOSFET 14 may be made larger so as to complete the setting operation in a shorter time.

In the above embodiment, the switch SW1 that is connected in series with the diode-connected PMOSFET 14 is turned off in the normal operation, therefore, electric charges that are accumulated in the capacitor C1 of the correcting circuit 13 in the setting operation are held. Thus, there is no concern of the capacitor C1 adversely affecting on the dynamic characteristics of the digital circuit 10 (that is, operation speed of the digital circuit 10 is not lowered) in the normal operation. On the contrary, the capacitor C1, being connected in series with parasitic capacitance generated between the gate and the drain or the source of the PMOSFET 11 to lower total capacitance, can contribute to improve the dynamic characteristics. Furthermore, since the setting operation is carried out before the normal operation is not carried out assuredly due to leakage of electric charges accumulated in the capacitor C1, there is no need to frequently carry out the setting operation, and power consumption due to the setting operation is thus only slight. In a circuit connected to an input side of the digital circuit 10, an operating voltage (power supply voltage and a signal voltage) can be lowered, which also contributes to suppress power consumption.

Figure 4:
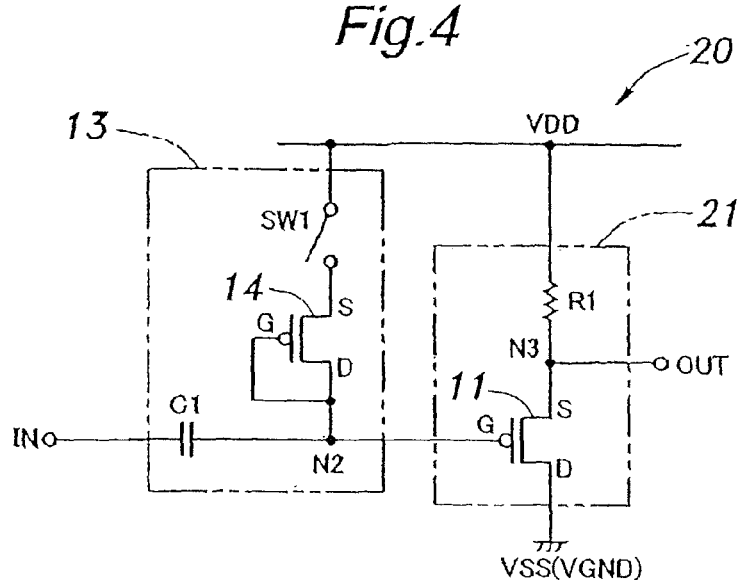
FIG. 4 is a circuit diagram showing another embodiment of a digital circuit based on the invention.

FIG. 4 is a circuit diagram showing another embodiment of the digital circuit based on the invention, which includes a level shift circuit using one PMOSFET as a switching circuit. In this drawing, the same portions as FIG. 2 are denoted by the same reference numerals and explained in no more details. A digital circuit 20 shown in FIG. 4 has the substantially same configuration as the digital circuit 10 shown in FIG. 2, except that the drain of the PMOSFET 11 is connected to a ground potential $V_{GND}$ as a low level power supply potential VSS, the source thereof is connected to a high level power supply potential VDD through the resistor R1, the output terminal OUT is connected to the node N3 between the source of the PMOSFET 11 and the resistor R1, and thereby a level shift circuit 21 is formed as a switching circuit. Although the explanation is omitted here, in this embodiment, the capacitor C1 is properly charged by a similar setting operation as the above embodiment, and thereby the PMOSFET 11 can be assuredly turned on/off without introducing errors in the normal operation. In this embodiment, when a high level input potential $V_{INH}$ is input to the input terminal IN, the PMOSFET 11 is turned off and a high level power supply potential VDD is outputted to the output terminal OUT, whereas when a low level input potential $V_{INL}$ is input, the PMOSFET 11 is turned on and a low level power supply potential VSS is outputted to the output terminal OUT. As described above, a switching circuit that supplies different signals to the output terminal OUT in accordance with the ON/OFF state of a transistor may include various embodiments, and the invention can be applied to such a switching circuit in order to assuredly turn on/off a transistor included therein.

Figure 5:
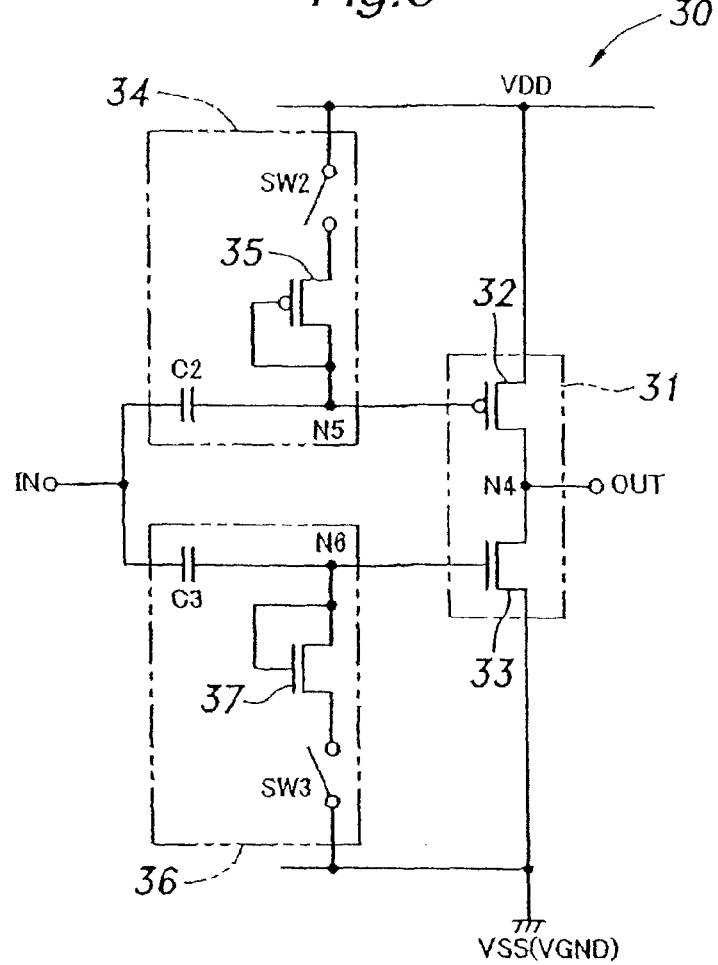
FIG. 5 is a circuit diagram showing another embodiment of a digital circuit based on the invention, that is formed by applying the invention to a CMOS inverter circuit.

FIG. 5 is a circuit diagram showing a CMOS inverter circuit to which the invention is applied as still another embodiment of the digital circuit based on the invention. A digital circuit 30 comprises a CMOS inverter circuit 31 as a switching circuit. The CMOS inverter circuit 31, as ever, includes a PMOSFET 32 having a threshold voltage $V_{THP}$ and an NMOSFET 33 having a threshold voltage $V_{THN}$ that are connected in series between a high level power supply potential VDD as a power supply potential and a low level power supply potential VSS. A source of the PMOSFET 32 is connected to the high level power supply potential VDD and a source of the NMOSFET 33 is connected to the low level power supply potential VSS (ground potential $V_{GND}$ in this example). Drains of the MOSFETs 32 and 33 are connected to each other, and a connection point (node) N4 thereof is connected to an output terminal OUT. Both gates of the MOSFETs 32 and 33 are connected to an input terminal IN to which an input signal that oscillates between a high level input potential $V_{INH}$ and a low level input potential $V_{INL}$ is inputted.

According to the invention, a correcting circuit 34 is connected between the gate of the PMOSFET 32 and the input terminal IN. The correcting circuit 34 includes, similarly to the correcting circuit 13 shown in embodiment of FIG. 2, a capacitor C2 connected between the gate of the PMOSFET 32 and the input terminal IN, a PMOSFET 35 for setting operation that has the same conductivity and the substantially same threshold voltage $V_{THP}$ as the PMOSFET 32, and a switch SW2. A drain of the PMOSFET 35 is connected to a node N5 between the capacitor C2 and the gate of the PMOSFET 32, a source thereof being connected through the switch SW2 to the high level power supply potential VDD. Furthermore, the PMOSFET 35, with the gate and the drain connected to each other, forms a diode-connection. The switch SW2 has only to be is connected in series with the PMOSFET 35 similarly to in FIG. 2.

A correcting circuit 36 is connected between the gate of the NMOSFET 33 and the input terminal IN. The correcting circuit 36 includes a capacitor C3 connected between the gate of the NMOSFET 33 and the input terminal IN, an NMOSFET 37 for setting operation that has the same conductivity and the substantially same threshold voltage $V_{THN}$ as the NMOSFET 33, and a switch SW3. A drain of the NMOSFET 37 is connected to a node N6 between the capacitor C3 and the gate of the NMOSFET 33, a source thereof being connected through the switch SW3 to the low level power supply potential VSS. Furthermore, the NMOSFET 37, with the gate and the drain connected to each other, forms a diode-connection. The switch SW3 may be disposed between the NMOSFET 37 and the low level power supply potential VSS.

An operation of thus constituted digital circuit 30 will be explained below with reference to FIG. 6. For the sake of explanation, it is assumed that a high level input potential $V_{INH}$ of an input signal inputted to the input terminal IN is lower than a value obtained by subtracting the absolute value of a threshold voltage $|V_{THP}|$ of the PMOSFET 32 from the VDD, and a low level input potential $V_{INL}$ is higher than a value obtained by adding an absolute value of the threshold voltage of the NMOSFET 33 $|V_{THL}|$ to the low level power supply potential VSS ($V_{GND}$).

As shown in FIG. 6a, the switch SW2 is turned on and the switch SW3 is turned off, and in this state, a high level input potential $V_{INH}$ is inputted to the input terminal IN. Accordingly, a current flows through the diode-connected PMOSFET 35 as shown by an arrow, and thereby the capacitor C2 connected to the gate of the PMOSFET 32 is charged. When a voltage across the capacitor C2 becomes equal to VDD-$V_{INH}$-$|V_{THP}|$, the PMOSFET 35 is turned off and the current is stopped (P-channel setting operation). Subsequently, as shown in FIG. 6b, the switch SW2 is turned off and the switch SW3 is turned on, and in this state, a low level input potential $V_{INL}$ is inputted to the input terminal IN. Accordingly, a current flows through the diode-connected NMOSFET 37 as shown by an arrow, and thereby the capacitor C3 connected to the gate of the NMOSFET 33 is charged. When a voltage across the capacitor C3 becomes equal to VSS-$V_{INL}$+$|V_{THN}|$, the NMOSFET 37 is turned off and the current is stopped (N-channel setting operation).

After the capacitors C2 and C3 are properly charged thus in the setting operation, in a normal operation, the switches SW2 and SW3 are turned off, and an pulsed input signal that oscillates between a high level input potential $V_{INH}$ and a low level input potential $V_{INL}$ is inputted to the input terminal IN. Since the switches SW2 and SW3 are turned off at this time, electric charges accumulated in the capacitors C2 and C3 are held, that is, a voltage across the capacitors C2 and C3 is maintained constant. In the case of a high level input potential $V_{INH}$ being inputted to the input terminal IN, a gate potential of the PMOSFET 32 becomes equal to VDD-$|V_{THP}|$, and a gate-source voltage $V_{GS}$ thereof becomes equal to $|V_{THP}|$, and thereby the PMOSFET 32 can be turned off. Since the NMOSFET 33 is on at this time, a low level power supply potential VSS (ground potential $V_{GND}$) is outputted to the output terminal OUT. On the other hand, in the case of a low level input potential $V_{INL}$ being inputted to the input terminal IN, a gate potential of the NMOSFET 33 becomes equal to VSS+$|V_{THN}|$, and a gate-source voltage $V_{GS}$ thereof becomes equal to $|V_{THN}|$, and thereby the NMOSFET 33 can be turned off. Since the PMOSFET 32 is on at this time, a high level power supply potential VDD is outputted to the output terminal OUT. The setting operations are not necessarily carried out until the PMOSFET 35 and the NMOSFET 37 are completely turned off. At a time when the current flowing in the MOSFETs 35 and 37 being is sufficiently small, (that is, the MOSFETs 35 and 37 are substantially turned off), the setting operations can be finished. It is needless to say that although the setting operation of the PMOSFET 35 is followed by the setting operation of the NMOSFET 37 in the above embodiment, the order is not limited to this and the setting operation of the NMOSFET 37 may be carried out firstly.

As described above, when the invention is applied to the pair of PMOSFET 32 and NMOSFET 33 constituting the CMOS inverter circuit 31, even in the case of a high level input potential $V_{INH}$ being lower than a high level power supply potential VDD and a low level input potential $V_{INL}$ being higher than a low level power supply potential VSS, the capacitors C2 and C3 connected between the gates of the PMOSFET 32 and the NMOSFET 33 and the input terminal IN are charged to a proper voltage, in the setting operation, in accordance with differences between the threshold voltages of the MOSFETs 32 and 33, and the input potentials $V_{INH}$ and $V_{INL}$ and the power supply potentials VDD and VSS. Thus, the PMOSFET 32 and the NMOSFET 33 can be assuredly turned on/off and a proper circuit operation can be realized.

Figure 7:
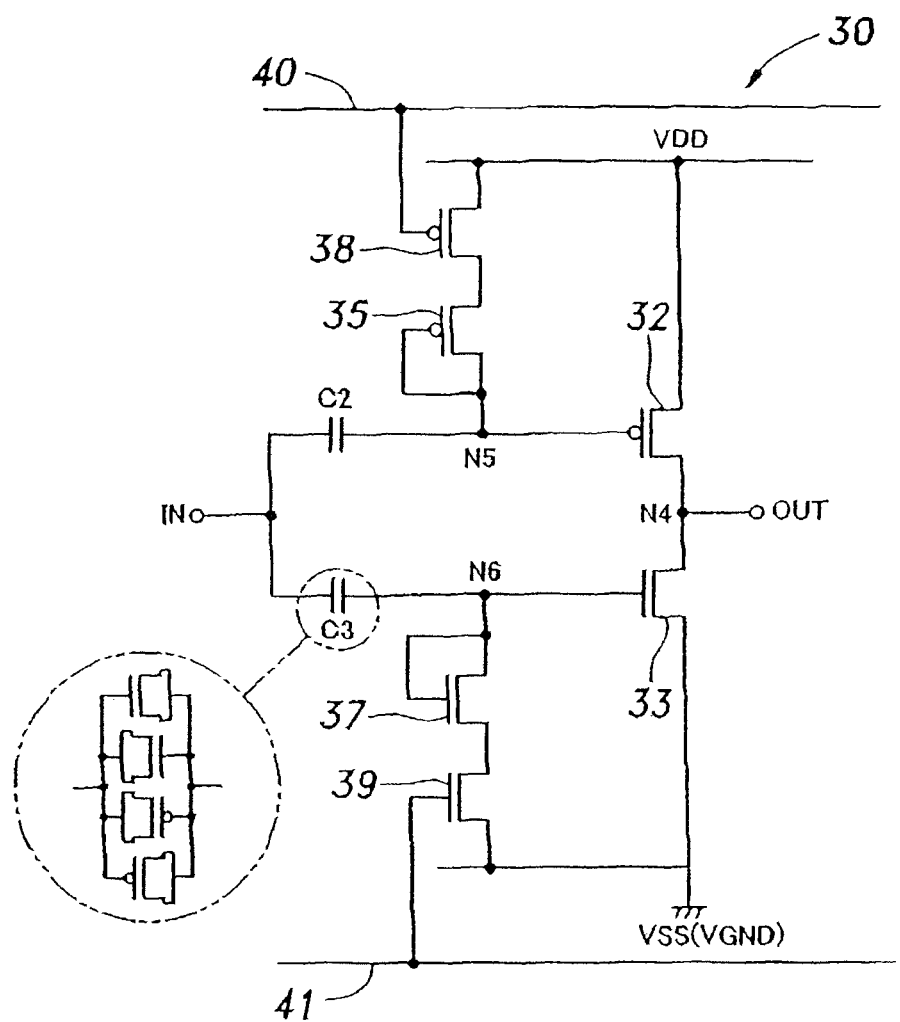
FIG. 7 is a circuit diagram of a digital circuit in which switches SW2 and SW3 shown in FIG. 5 are formed of a PMOSFET 38 and an NMOSFET 39, respectively.

FIG. 7 shows a circuit diagram of the digital circuit 30 in which the switches SW2 and SW3 shown in FIG. 5 are formed of a PMOSFET 38 and an NMOSFET 39 respectively. In this drawing, the same portions as FIG. 5 are denoted by the same reference numerals. Gates of the PMOSFET 38 and the NMOSFET 39 are connected to a P-channel control signal line 40 and an N-channel control signal line 41 respectively. In a P-channel setting operation, potentials of the control signal lines 40 and 41 are equal to a low level power supply potential VSS for instance, and a low level power supply potential VSS is inputted to the gates of the PMOSFET 38 and the NMOSFET 39, and thereby the PMOSFET 38 is turned on while the NMOSFET 39 is turned off, further, a high level input potential $V_{INH}$ is inputted to the input terminal IN. In an N-channel setting operation, potentials of the control signal lines 40 and 41 are equal to a high level power supply potential VDD for instance, and a high level power supply potential is inputted to the gates of the PMOSFET 38 and the NMOSFET 39, and thereby the PMOSFET 38 is turned off while the NMOSFET 39 is turned on, further, a low level input potential $V_{INL}$ is inputted to the input terminal IN. According to such setting operations, as described with reference to FIG. 6a and FIG. 6b, electric charges are properly accumulated in the capacitors C2 and C3. In a normal operation, a potential of the P-channel control signal line 40 is equal to the high level power supply potential VDD whereas a potential of the N-channel control signal line 41 is equal to the low level power supply potential VSS, and both of the PMOSFET 38 and the NMOSFET 39 are turned off.

The capacitors C2 and C3, as shown by a magnified view in FIG. 7, can be formed by using capacitance generated between a gate and a source and/or a drain of one or a plurality of MOSFETs. In the case of connecting a MOSFET used as capacitance, it may be connected in such a direction that the MOSFET is turned on (that is, a channel is formed) when it is charged. For instance, in the case of one PMOSFET being connected as the capacitor C2 shown in FIG. 7, a gate side terminal may be connected to the input terminal IN whereas a source/drain side terminal may be connected to the gate of the PMOSFET 32. The conductivity of a MOSFET used as a capacitor may be either an N-type or a P-type, though the threshold voltage thereof is preferably close to zero.

In the aforementioned digital circuit 30, it is assumed that electric charges are not accumulated in the capacitors C2 and C3 before a setting operation. However, electric charges may be accumulated in the capacitors C2 and C3 owing to, for instance, noise and so on. In the case of, due to such electric charges accumulated in the capacitors C2 and C3, the capacitors C2 and C3 is excessively charged with the polarity shown in FIG. 6b before a setting operation, even when the switches SW2 and SW3 are turned on in the setting operation, the diode-connected MOSFETs 35 and 37 are not turned on, and the electric charges accumulated in the capacitors C2 and C3 (namely, a voltage across the capacitors C2 and C3) are held without change, and thereby the voltage across the capacitors C2 and C3 (or a gate potential of the MOSFETs 32 and 33) may not be converged to a proper value. Thus, some measures are preferably taken in order to set the voltage across the capacitors C2 and C3 to a proper value even when such undesired electric charges are accumulated in the capacitors C2 and C3.

Figure 8:
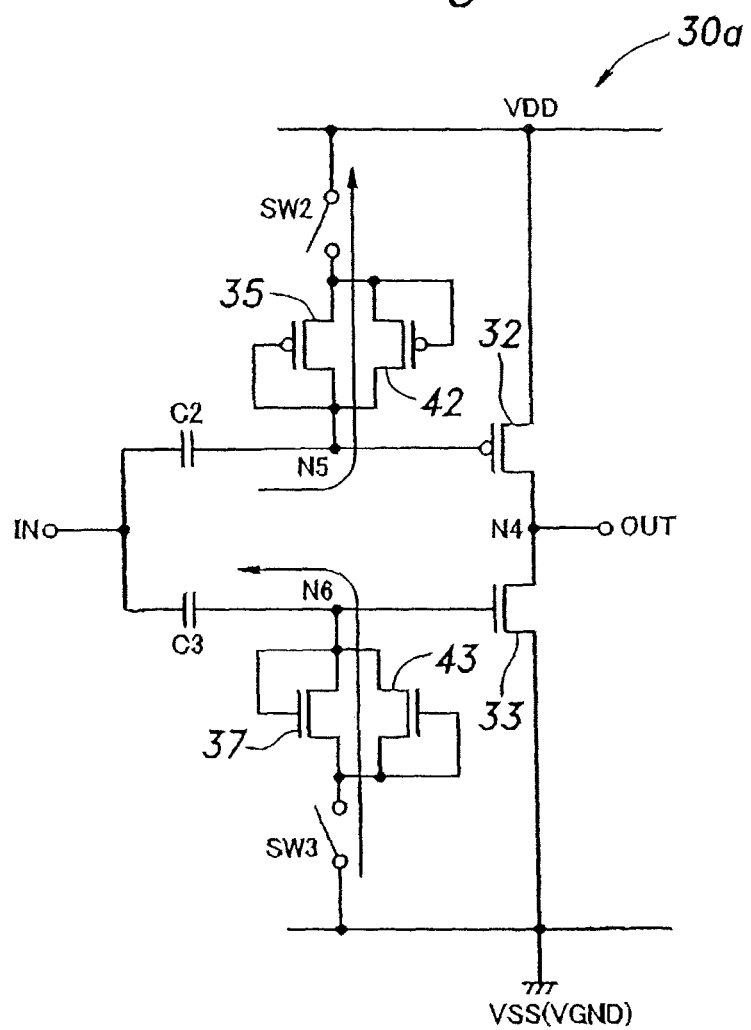
FIG. 8 is a circuit diagram showing another embodiment of the modified digital circuit shown in FIG. 5.

FIG. 8 is a circuit diagram showing another embodiment of the modified digital circuit 30 shown in FIG. 5. In this drawing, the same portions as FIG. 5 are denoted by the same reference numerals and are explained in no more details. In a digital circuit 30a, another diode-connected PMOSFET 42 is connected in parallel with the diode-connected PMOSFET 35 so that the forward direction thereof is opposite to that of the PMOSFET 35. Similarly, another diode-connected NMOSFET 43 is connected in parallel with the diode-connected NMOSFET 37 so that the forward direction thereof is opposite to that of the NMOSFET 37. According to this, in the case of electric charges that can oppositely bias the diode-connected PMOSFET 35 and NMOSFET 37 being accumulated in the capacitors C2 and C3 before a setting operation owing to, for instance, noise and so on, when the switches SW2 and SW3 are turned on in the setting operation, a current is capable of flowing as shown by an arrow in FIG. 8, and thereby a voltage across the capacitors C2 and C3 can be converged to a substantially proper value. When threshold voltages of the diode-connected MOSFETs 42 and 43 are equal to threshold voltages $V_{THP}$ and $V_{THN}$ of the MOSFETs 32 and 33 respectively, a gate potential of the PMOSFET 32 (that is, a potential of a node N5) is converged to a potential expressed by VDD+|$V_{THP}$| while a gate potential of the NMOSFET 33 (that is, a potential of a node N6) is converged to a potential expressed by VSS−|$V_{THN}$|. Another rectifier element such as a diode can be used instead of the diode-connected MOSFETs 42 and 43. The diode-connected MOSFET 42 that is connected in parallel with the PMOSFET 35 may be an N-type. Further, the diode-connected MOSFET 43 that is connected in parallel with the NMOSFET 37 may be a P-type.

Figure 9:
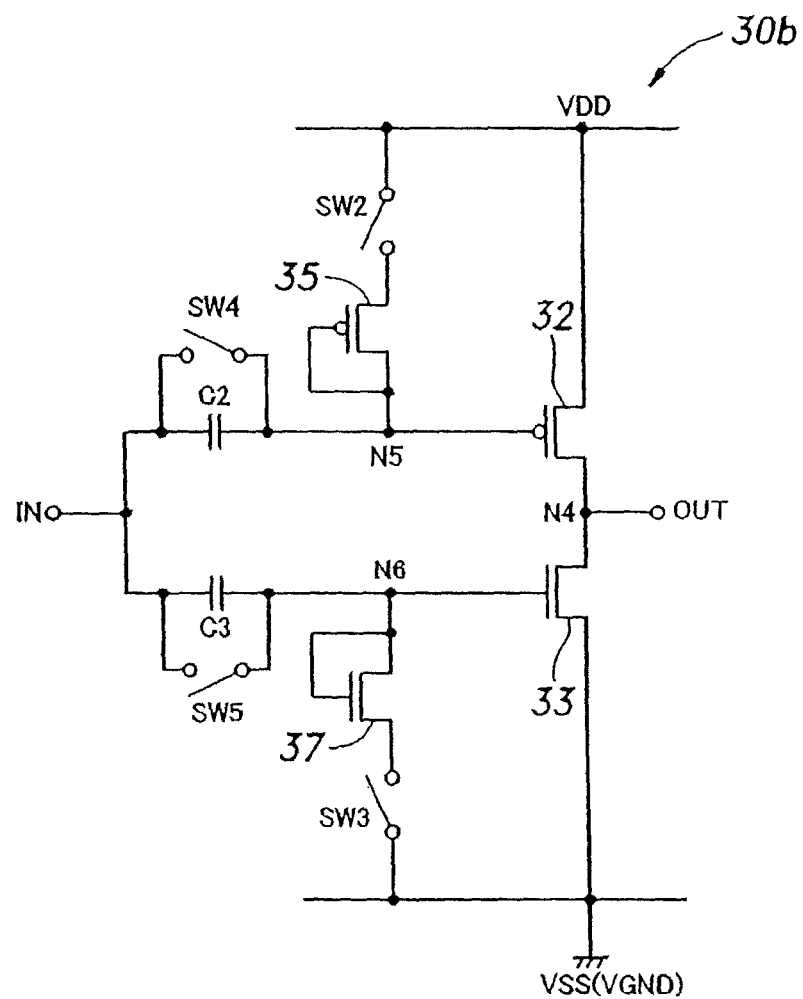
FIG. 9 is a circuit diagram showing another embodiment of the modified digital circuit shown in FIG. 5.

FIG. 9 is a circuit diagram showing another embodiment of the modified digital circuit 30 shown in FIG. 5. In this drawing, the same portions as FIG. 5 are denoted by the same reference numerals and are explained in no more details. In a digital circuit 30b, switches SW4 and SW5 are provided in parallel with the capacitors C2 and C3 respectively. According to this, in the case of undesired electric charges being accumulated in the capacitors C2 and C3 owing to, for instance, noise and so on, the switches SW4 and SW5 are turned on before a setting operation, and thereby the capacitors C2 and C3 can be discharged. Thus, when the switches SW2 and SW3 are turned on in the setting operation, the diode-connected MOSFETs 35 and 37 are turned on assuredly, and thereby the capacitors C2 and C3 are properly charged.

Figure 10:
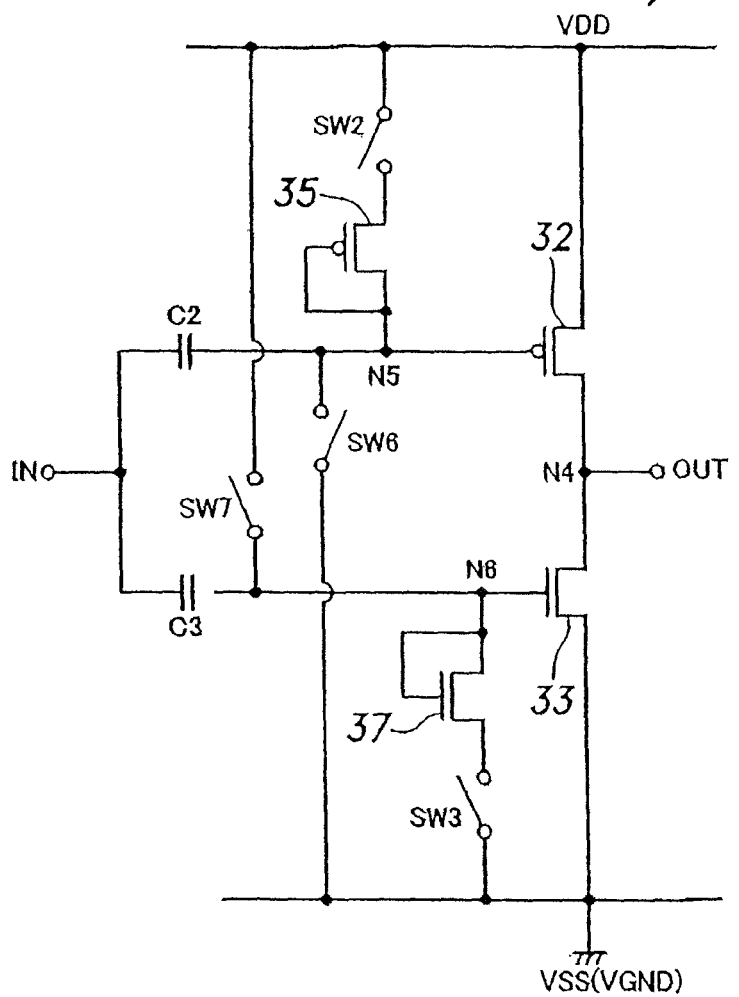
FIG. 10 is a circuit diagram showing still another embodiment of the modified digital circuit shown in FIG. 5.

FIG. 10 is a circuit diagram showing still another embodiment of the modified digital circuit 30 shown in FIG. 5. In this drawing, the same portions as FIG. 5 are denoted by the same reference numerals and are explained in no more details. In a digital circuit 30c, the node N5 between the gate of the PMOSFET 32 and the capacitor C2 is connected through a switch SW6 to a low level power supply potential VSS, while the node N6 between the gate of the NMOSFET 33 and the capacitor C3 is connected through a switch SW7 to a high level power supply potential VDD.

As shown in FIG. 11a, when the switch SW6 is turned on in an initialization operation before a setting operation of the capacitor C2 connected to the gate of the PMOSFET 32 (P-channel setting operation), even in the case of unnecessary electric charges being accumulated in the capacitor C2 owing to, for instance, noise and so on, and a potential of the node N5 between the gate of the PMOSFET 32 and the capacitor C2 being undesirably high, a potential of the node N5 can be lowered to substantially equal the low level power supply potential VSS. A potential of the input terminal IN is preferably a high level input potential at this time, though it may be a low level input potential. Further, the switch SW2 may be either on or off. However, when it is on, a current flows as shown by a dashed arrow in the drawing, and thereby a potential of the node N5 cannot be sufficiently lowered with ease, therefore, the switch SW2 is preferably off.

Similarly, as shown in FIG. 11b, when the switch SW7 is turned on in an initialization operation before a setting operation of the capacitor C3 connected to the gate of the NMOSFET 33 (N-channel setting operation), even in the case of unnecessary electric charges being accumulated in the capacitor C3 owing to, for instance, noise and so on, and a potential of the node N6 between the gate of the NMOSFET 33 and the capacitor C3 being undesirably low, a potential of the node N6 can be increased to substantially equal the high level power supply potential VDD. A potential of the input terminal IN is preferably a low level input potential at this time, though it may be a high level input potential. Further, the switch SW3 may be either on or off. However, when it is on, a current flows as shown by a dashed arrow in the drawing, and thereby a potential of the node N6 cannot be sufficiently increased with ease, therefore, the switch SW3 is preferably off sue.

In a setting operation, the switches SW6 and SW7 are turned off, and as described with reference to FIG. 6a and FIG. 6b, the switch SW2 or SW3 is turned on. According to the aforementioned initialization operation, potentials of the nodes N5 and N6 are set to a proper value before the setting operation. As a result, when the switches SW2 and SW3 are turned on in the setting operation, the diode-connected MOSFETs 35 and 37 are biased in the forward direction to be turned on assuredly, and a current flows through the MOSFETs 35 and 37, and thereby the capacitors C2 and C3 can be properly charged. Although in the embodiments shown in FIG. 10 and FIG. 11, the node N5 is connected to the low level power supply potential VSS whereas the node N6 is connected to the high level power supply potential VDD in the initialization operation, they may be connected to another potential other than the power supply potential as long as the diode-connected MOSFETs 35 and 37 are biased in the forward direction and turned on in the setting operation after the initialization operation. However, since the power supply potential can be obtained easily, it may be preferably used. Furthermore, in the above embodiments, a P-channel initialization operation and an N-channel initialization operation are carried out separately, though they may be carried out simultaneously by turning on the switches SW6 and SW7 at the same time.

Figure 12:
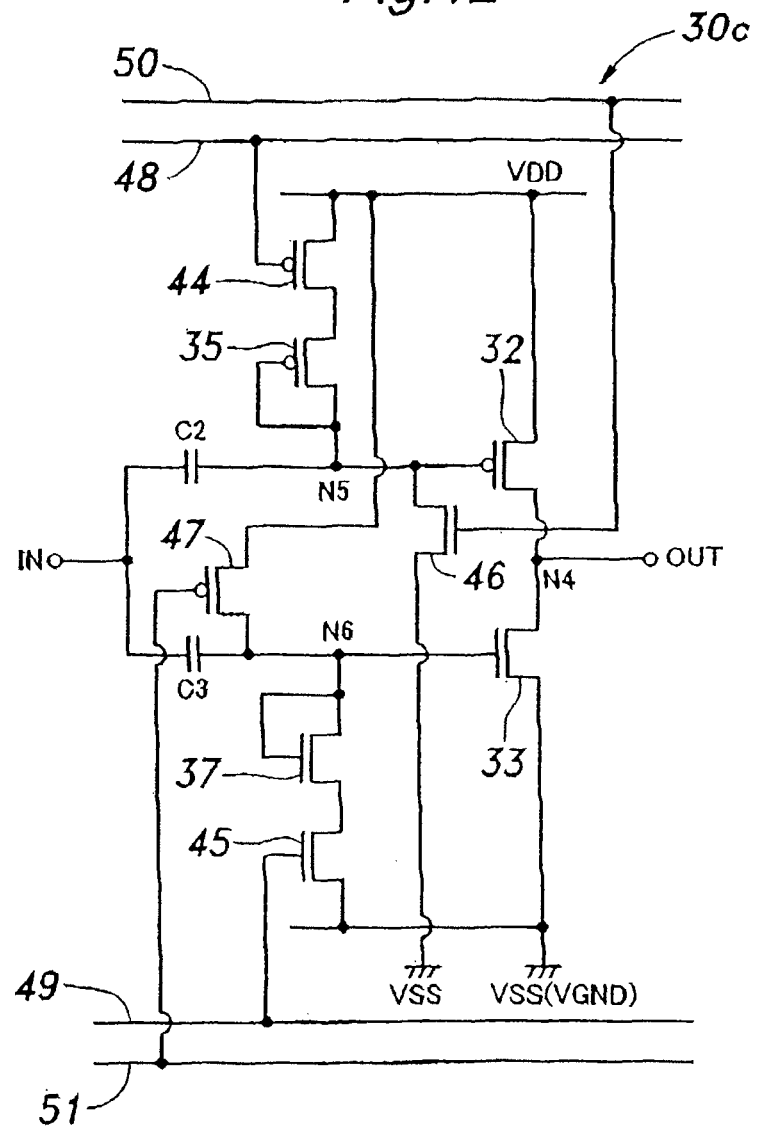
FIG. 12 is a circuit diagram showing a digital circuit in which the switch shown in FIG. 10 is formed of a MOSFET.

FIG. 12 is a circuit diagram showing the digital circuit 30c in which the switches SW2, SW3, SW6, and SW7 shown in FIG. 10 are formed of MOSFETs 44, 45, 46, and 47. The MOSFET 44 is a PMOSFET whose gate is connected to a P-channel control signal line 48. The MOSFET 45 is an NMOSFET whose gate is connected to an N-channel control signal line 49. The MOSFET 46 is an NMOSFET whose gate is connected to a P-channel initialization signal line 50. The MOSFET 47 is a PMOSFET whose gate is connected to an N-channel initialization signal line 51. When potentials of the control signal lines 48 and 49 and the initialization signal lines 50 and 51 being controlled properly, the MOSFETs 44 to 47 are properly turned on/off, and thereby the initialization, setting, and normal operations described above can be carried out. In this manner, each switch can be formed of a proper semiconductor element.

Figure 13:
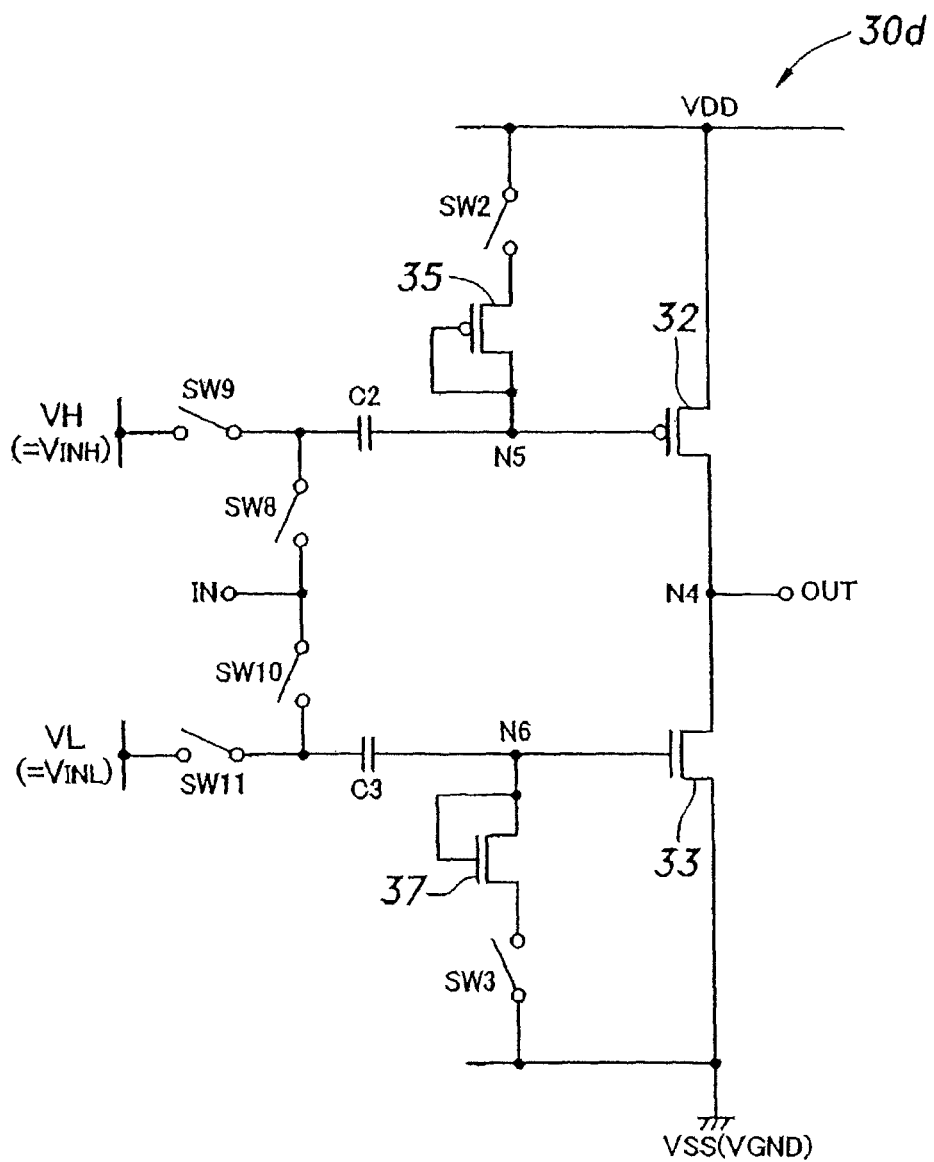
FIG. 13 is a circuit diagram showing still another embodiment of the modified digital circuit shown in FIG. 5.

FIG. 13 is a circuit diagram showing still another embodiment of the modified digital circuit 30 shown in FIG. 5. In this drawing, the same portions as FIG. 5 are denoted by the same reference numerals and are explained in no more details. In a digital circuit 30d, a terminal of the capacitor C2 on the opposite side to a terminal that is connected to the gate of the PMOSFET 32 is connected through a switch SW8 to the input terminal IN while connected through a switch SW9 to a potential $V_H$ that is substantially equal to a high level input potential $V_{INH}$ of an input signal inputted to the input terminal IN in a normal operation. Similarly, a terminal of the capacitor C3 on the opposite side to a terminal that is connected to the gate of the NMOSFET 33 is connected through a switch SW10 to the input terminal IN while connected through a switch SW11 to a potential $V_L$ that is substantially equal to a low level input potential $V_{INL}$ of an input signal inputted to the input terminal IN in a normal operation.

In this embodiment, the switches SW2, SW3, SW9, and SW11 are turned on whereas the switches SW8 and SW10 are turned off, and thereby a setting operation of the capacitors C2 and C3 can be carried out at the same time and independent of a potential of the input terminal IN. In a normal operation, the switches SW2, SW3, SW9, and SW11 are turned off whereas the switches SW8 and SW10 are turned on, and inputted to the input terminal IN is an input signal which oscillates between a high level input potential $V_{INH}$ and a low level input potential $V_{INL}$.

In a CMOS inverter, when a MOSFET is connected in series with a PMOSFET and an NMOSFET that constitute the inverter, and these MOSFETs are turned on/off by a clock signal (or a synchronizing signal having the opposite phase thereto such as an inverted clock signal), an output of the inverter is synchronized with the synchronizing signal such as the clock signal. Such an inverter is referred to as a clocked inverter. The invention can also be applied to a MOSFET for clock signal synchronization connected in series with a PMOSFET and an NMOSFET that constitute a CMOS inverter. An embodiment thereof is shown in FIG. 14.

Figure 14:
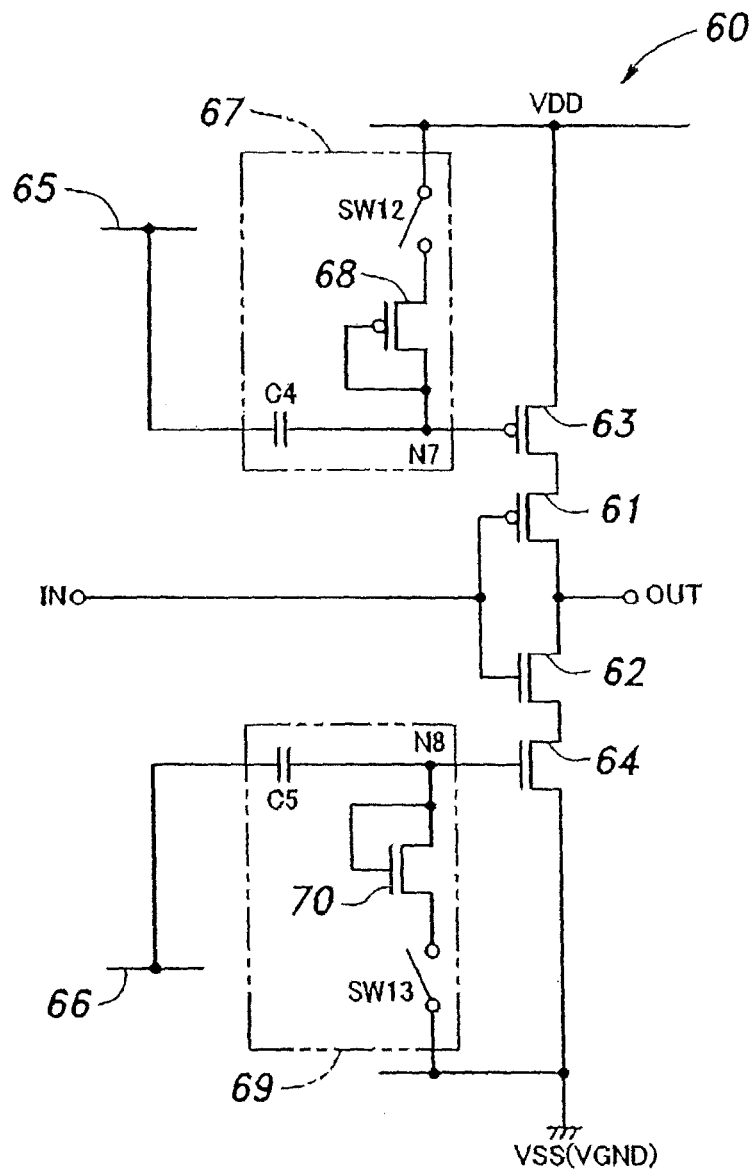
FIG. 14 is a circuit diagram showing one embodiment of a clocked inverter circuit to which the invention is applied.

A clocked inverter circuit (digital circuit) 60 shown in FIG. 14 comprises a PMOSFET 61 and an NMOSFET 62 that constitute a CMOS inverter. Gates of the MOSFETs 61 and 62 are connected to an input terminal IN and a common drain thereof is connected to an output terminal OUT. A source of the PMOSFET 61 is connected to a high level power supply potential VDD through a PMOSFET 63 for clock synchronization, and a source of the NMOSFET 62 is connected to a low level power supply potential VSS (ground potential $V_{GND}$ in this example) through an NMOSFET 64 for clock synchronization. A gate of the PMOSFET 63 is connected to an inverted clock signal line 65 for supplying an inverted clock signal whereas a gate of the NMOSFET 64 is connected to a clock signal line 66 for supplying a clock signal. The clock signal and the inverted clock signal oscillate between a high level potential $V_{CH}$ lower than a high level power supply potential VDD and a low level potential $V_{CL}$ higher than a low level power supply potential VSS. In this embodiment, an input signal inputted to the input terminal IN oscillates between the high level power supply potential VDD and the low level power supply potential VSS. However, in the case of an amplitude of the input signal being small, similarly to the embodiment described above, a correcting circuit can be provided for the MOSFETs 61 and 62 that constitute the inverter. It is to be noted that the PMOSFET 61 may be connected between the PMOSFET 63 and the power supply potential VDD, and the NMOSFET 62 may be connected between the NMOSFET 64 and the power supply potential VSS.

A correcting circuit 67 based on the invention is connected between the gate of the PMOSFET 63 and the inverted clock signal line 65. The correcting circuit 67 includes a capacitor C4 connected between the gate of the PMOSFET 63 and the inverted clock signal line 65, a diode-connected PMOSFET 68 that has the substantially same threshold voltage as the PMOSFET 63, and a switch SW12. A drain of the PMOSFET 68 is connected to a node N7 between the capacitor C4 and the gate of the PMOSFET 63, a source thereof being connected through the switch SW12 to the high level power supply potential VDD.

Similarly, a correcting circuit 69 is connected between the gate of the NMOSFET 64 and the clock signal line 66. The correcting circuit 69 includes a capacitor C5 connected between the gate of the NMOSFET 64 and the clock signal line 66, a diode-connected NMOSFET 70 that has the substantially same threshold voltage as the NMOSFET 64, and a switch SW13. A drain of the NMOSFET 70 is connected to a node N8 between the capacitor C5 and the gate of the NMOSFET 64, a source thereof being connected through the switch SW13 to the low level power supply potential VSS.

In this embodiment, a clock signal and an inverted clock signal can be considered as input signals in the invention when seen from the corresponding MOSFETs 63 and 64. Furthermore, the PMOSFET 63 and the correcting circuit 67 or the NMOSFET 64 and the correcting circuit 69 can be considered to form the digital circuit of the invention. In that case, the drains of the PMOSFET 63 and the NMOSFET 64 can be considered as output terminals.

Firstly, in a setting operation, both the switches SW12 and SW13 are turned on, and in this state, a high level potential $V_{CH}$ is inputted as an inverted clock signal (at this time, a clock signal becomes a low level potential $V_{CL}$). Since the high level potential $V_{CH}$ is lower than a high level power supply potential VDD, the diode-connected PMOSFET 68 is biased in the forward direction and turned on, and thereby a current flows and the capacitor C4 is charged. The current flows until a voltage across the capacitor C4 becomes high enough to turn off the PMOSFET 68. Further at this time, a low level potential $V_{CL}$ higher than a low level power supply potential VSS is inputted as a clock signal. Therefore, the diode-connected NMOSFET 70 is biased in the forward direction and turned on, and thereby a current flows and the capacitor C5 is charged. After a voltage across the capacitor C5 rises sufficiently, the NMOSFET 70 is turned off, and thus the current is stopped. As set forth above, in this embodiment, the setting operations of the capacitors C4 and C5 in the two correcting circuits 67 and 69 can be carried out at the same time.

In a normal operation, both the switches SW12 and SW13 are turned off and a clock signal, an inverted clock signal and an input signal are inputted. In this case also, the capacitors C4 and C5 are charged to a proper voltage corresponding to threshold voltages of the PMOSFET 63 and the NMOSFET 64, and the clock signal and the inverted clock signal are biased properly and inputted to the gates of the PMOSFET 63 and the NMOSFET 64. Therefore, the PMOSFET 63 and the NMOSFET 64 are assuredly turned on/off, and an output signal can be synchronized with the clock signal.

Figure 15:
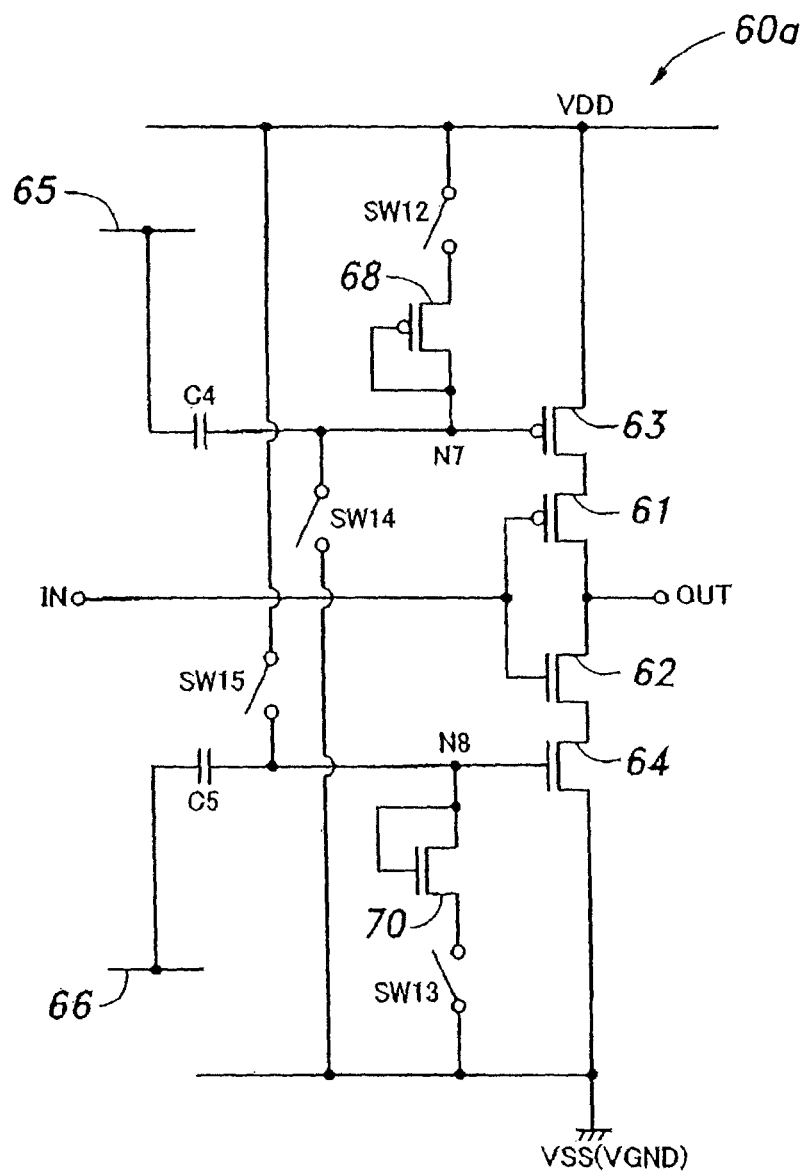
FIG. 15 is a circuit diagram showing another embodiment of the modified clocked inverter circuit shown in FIG. 14.

FIG. 15 is a circuit diagram showing another embodiment of the modified clocked inverter circuit 60 shown in FIG. 14. In this drawing, the same portions as FIG. 14 are denoted by the same reference numerals and are explained in no more details. A clocked inverter circuit 60a shown in FIG. 15 comprises, similarly to the embodiment shown in FIG. 10, switches SW14 and SW15 that selectively connect nodes N7 and N8 between the capacitors C4 and C5 and the corresponding gates of the MOSFETs 63 and 64 to a low level power supply potential VSS and a high level power supply potential VDD. According to this, the capacitors C4 and C5 for correction can be initialized by turning on the switches SW14 and SW15 before a setting operation, and thereby even when undesired electric charges being accumulated in the capacitors C4 and C5 owing to noise and so on, the MOSFETs 68 and 70 are not adversely affected by the electric charges.

Figure 16:
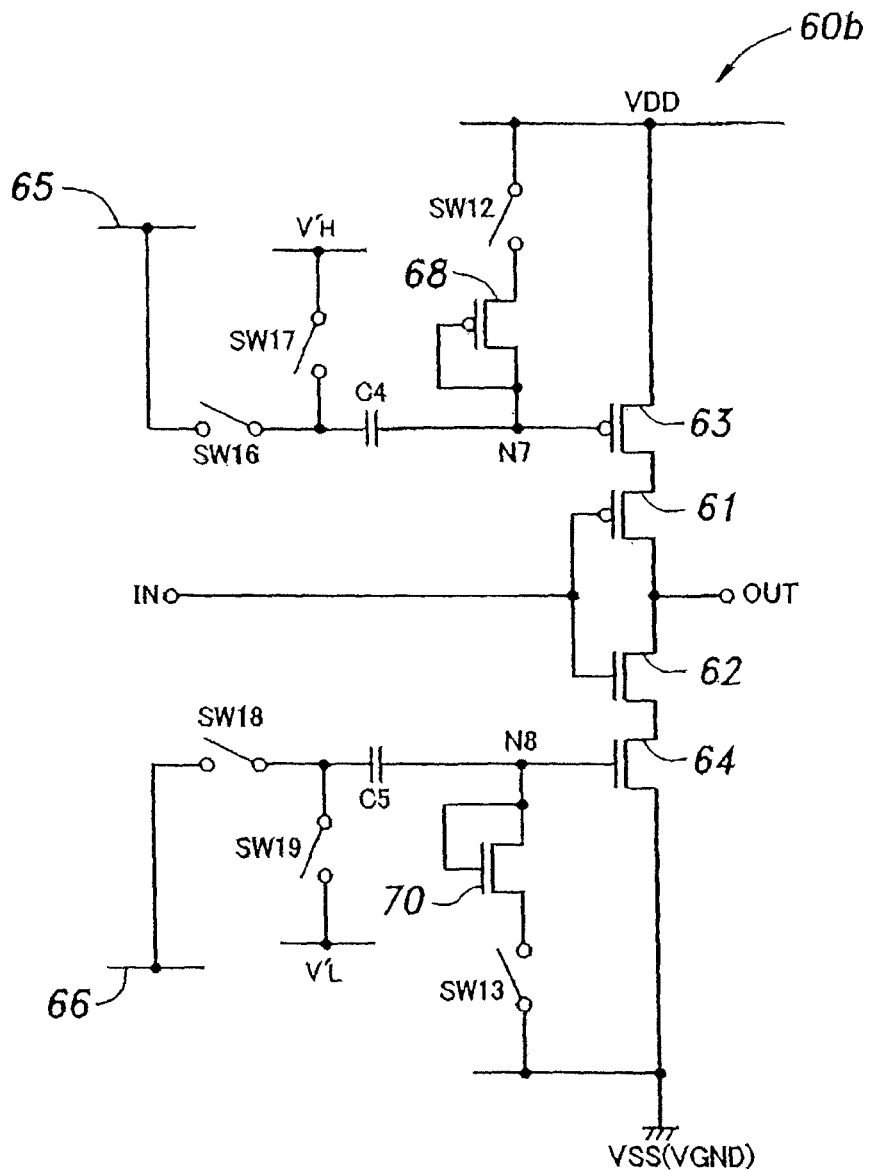
FIG. 16 is a circuit diagram showing another embodiment of the modified clocked inverter circuit based on the invention shown in FIG. 14.

FIG. 16 is a circuit diagram showing another modification embodiment of the modified clocked inverter circuit 60 based on the invention shown in FIG. 14. In this drawing, the same portions as FIG. 14 are denoted by the same reference numerals and are explained in no more details. In a clocked inverter circuit 60b shown in FIG. 16, similarly to the embodiment shown in FIG. 13, a terminal of the capacitor C4 on the opposite side to a terminal that is connected to the gate of the PMOSFET 63 is connected through a switch SW16 to the inverted clock signal line 65 while connected through a switch SW17 to a potential $V'_H$ that is substantially equal to a high level potential $V_{CH}$ of and inverted clock signal. Similarly, a terminal of the capacitor C5 on the opposite side to a terminal that is connected to the gate of the NMOSFET 64 is connected through a switch SW18 to the clock signal line 66 while connected through a switch SW19 to a potential $V'_L$ that is substantially equal to a low level potential $V_{CL}$ of a clock signal.

In this embodiment, the switches SW12, SW13, SW17, and SW19 are turned on whereas the switches SW16 and SW18 are turned off, and thereby setting operations of the capacitors C4 and C5 can be carried out at the same time and independent of potentials of a clock signal and an inverted clock signal. In a normal operation, the switches SW12, SW13, SW17, and SW19 are turned off whereas the switches SW16 and SW18 are turned on. In this state, a clock signal and an inverted clock signal are inputted through the capacitors C4 and C5 to the gates of the PMOSFET 63 and the NMOSFET 64, and an input signal which oscillates between a high level input potential $V_{INH}$ and a low level input potential $V_{INL}$ is inputted to the input terminal IN.

Figure 17:
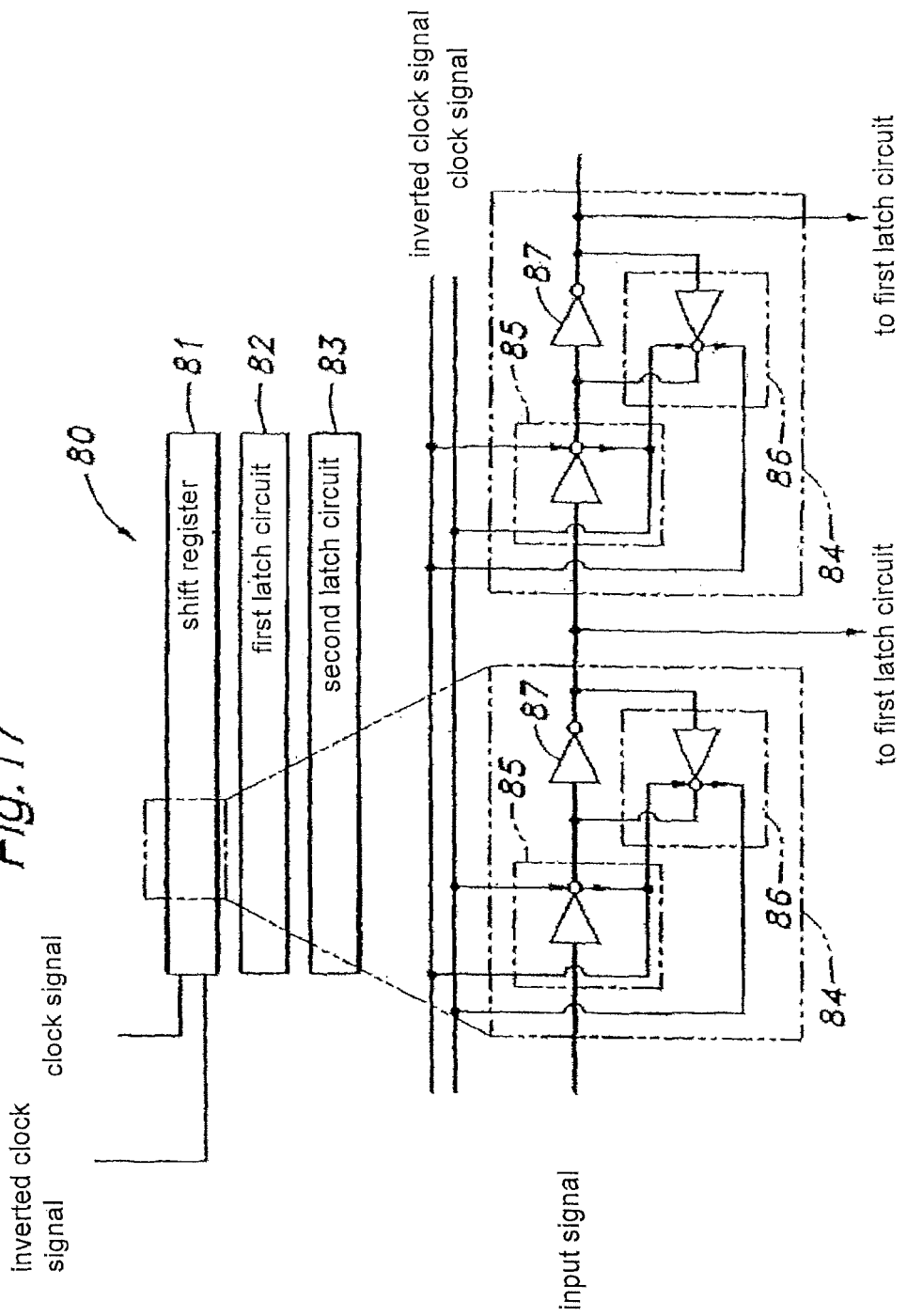
FIG. 17 is a diagram schematically showing an essential portion of a driver circuit of an active matrix device that is used in a liquid crystal display device and so on and showing a typical unit circuit in a shift register of the driver circuit.

FIG. 17 is a diagram schematically showing an essential portion of a driver circuit of an active matrix device that is used in a liquid crystal display, an organic EL display and showing a typical unit circuit in a shift register of the driver circuit. A driver circuit 80 comprises a shift register 81 for sequentially outputting a selective signal in synchronism with a clock signal and an inverted clock signal, a first latch circuit 82 for latching a video signal in accordance with the selective signal from the shift register 81, and a second latch circuit 83 for latching data transferred from the first latch circuit 82. The shift register 81 comprises a plurality of unit circuits 84. Each of the unit circuits 84 includes two clocked inverters 85 and 86 and one inverter 87, and is operated, for instance, so as to take an input signal in a unit circuit 84 when a clock signal becomes a high level potential $V_{CH}$ (at this time, an output signal may vary), and hold an output signal in a unit circuit 84 when a clock signal becomes a low level. In one unit circuit 84 and an adjacent unit circuit 84, a clock signal and an inverted clock signal are inverted. Therefore, when an input signal is taken in one unit circuit 84, an output signal is held in an adjacent unit circuit 84, and when an output signal is held in one unit circuit 84, an input signal is taken in an adjacent unit circuit 84. The configuration and operation of such shift register 81 are well known in this field. An amplitude of a clock signal (or an inverted clock signal) inputted to the clocked inverters 85 and 86 of the shift register 81 is made smaller than a power supply voltage (high level power supply potential VDD−low level power supply potential VSS). In that case, some measures are preferably taken in order to assuredly turn off these clocked inverters 85 and 86 without introducing errors. When the invention is applied to the clocked inverters 85 and 86, such a problem can be solved without lowering operation speed.

Figure 18:
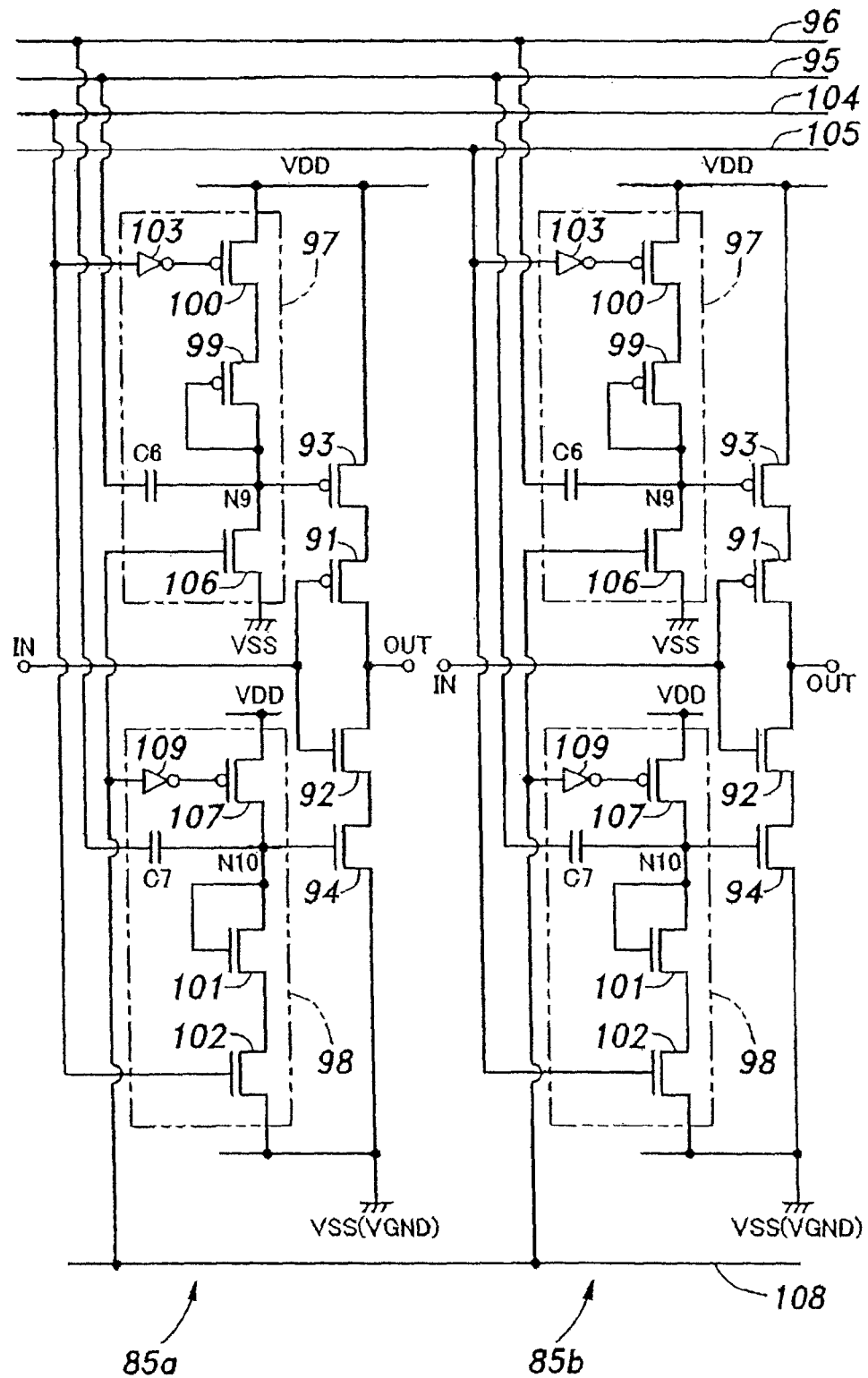
FIG. 18 is a circuit diagram showing an embodiment in which the invention is applied to a clocked inverter on a left side in the unit circuit of the shift register shown in FIG. 17.

FIG. 18 is a circuit diagram showing an embodiment in which the invention is applied to the clocked inverter 85 on a left side in the unit circuit 84 of the shift register 81 shown in FIG. 17. In this drawing, the other clocked inverter 86 and the inverter 87 are not shown.

A clocked inverter 85a on a left side of FIG. 18 (corresponding to the clocked inverter 85 on the left side in the unit circuit 84 of FIG. 17) comprises a PMOSFET 91 and an NMOSFET 92 whose drains are connected in series with each other to constitute a CMOS inverter. The PMOSFET 91 is connected through a PMOSFET 93 for clock synchronization to a high level power supply potential VDD, the NMOSFET 92 being connected through an NMOSFET 94 for clock synchronization to a low level power supply potential VSS (for instance, $V_{GND}$).

A gate of the PMOSFET 93 is connected through a correcting circuit 97 to an inverted clock signal line 95, a gate of the NMOSFET 94 being connected through a correcting circuit 98 to a clock signal line 96. The correcting circuit 97 includes a capacitor C6 connected between the gate of the PMOSFET 93 and the inverted clock signal line 95, a diode-connected PMOSFET 99 that has the substantially same threshold voltage as the PMOSFET 93, and a PMOSFET 100 that functions as a switch for selectively carrying out a setting operation. The PMOSFET 99 and the PMOSFET 100 are connected in series between a node N9 between the capacitor C6 and the gate of the PMOSFET 93 and a high level power supply potential VDD. Similarly, the correcting circuit 98 includes a capacitor C7 connected between the gate of the NMOSFET 94 and the clock signal line 96, a diode-connected NMOSFET 101 that has the substantially same threshold voltage as the NMOSFET 94, and an NMOSFET 102 that functions as a switch for selectively carrying out a setting operation. The NMOSFET 101 and the NMOSFET 102 are connected in series between a node N10 between the capacitor C7 and the gate of the NMOSFET 94 and a low level power supply potential VSS. A gate of the PMOSFET 100 is connected through an inverter 103 to a first control signal line 104, a gate of the NMOSFET 102 being connected directly to the first control signal line 104.

Furthermore, the node N9 between the capacitor C6 and the gate of the PMOSFET 93 is connected through an NMOSFET 106 to the low level power supply potential VSS, the node N10 between the capacitor C7 and the gate of the NMOSFET 94 being connected through a PMOSFET 107 to the high level power supply potential VDD. The capacitors C6 and C7 can be initialized by selectively turning on/off the NMOSFET 106 and the PMOSFET 107. A gate of the NMOSFET 106 is connected directly to an initialization signal line 108, a gate of the PMOSFET 107 being connected through an inverter 109 to the initialization signal line 108, and a signal with opposite polarity is inputted to each gate of the MOSFETs 106 and 107.

A clocked inverter 85b on a right side of FIG. 18 (corresponding to the clocked inverter 85 on the right side in the unit circuit 84 of FIG. 17) has the same configuration as the clocked inverter 85a on the left side, except that the gate of the PMOSFET 93 is connected through the capacitor C6 to the clock signal line 96, the gate of the NMOSFET 94 is connected through the capacitor C7 to the inverted clock signal line 95, and the gates of the PMOSFET 100 and the NMOSFET 102 are connected to a second control signal line 105. It is to be noted that although only the two clocked inverters 85a and 85b are shown in FIG. 18, a plurality of these inverters are arranged alternately in the actual circuit.

Figure 19:
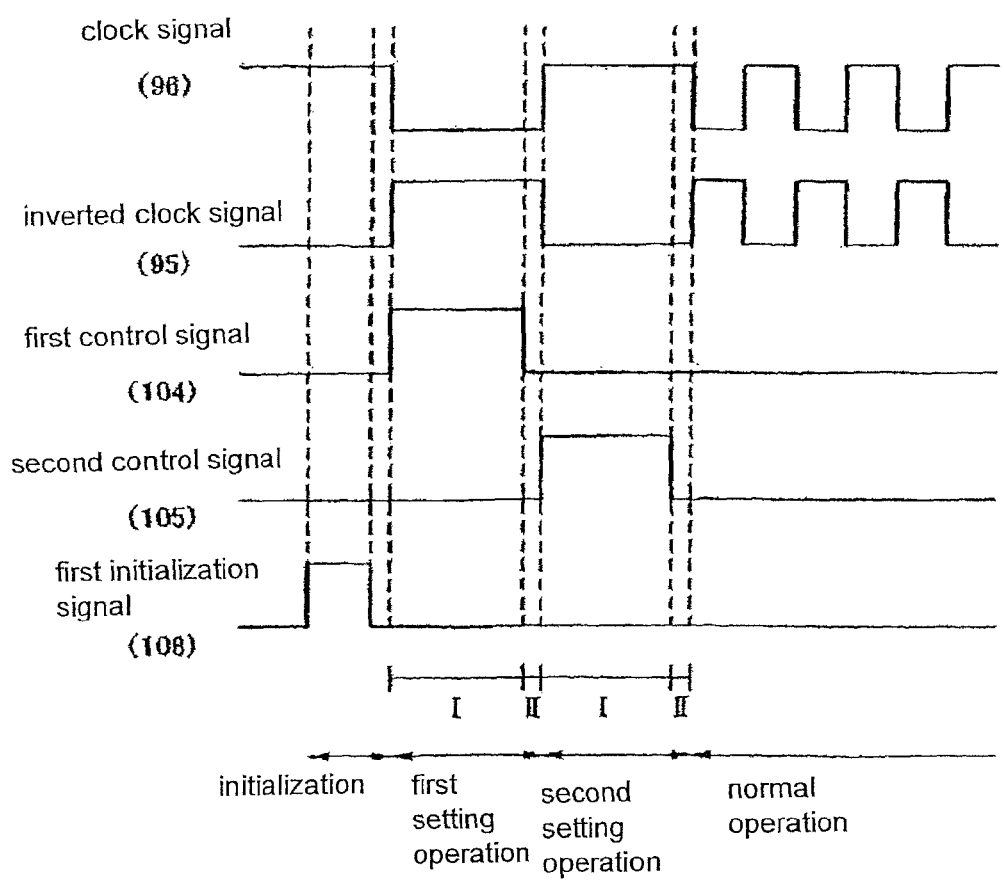
FIG. 19 is a timing chart showing signals (potentials) of the respective portions in an initialization, a setting operation and a normal operation of a shift register including the clocked inverter circuit shown in FIG. 18.

FIG. 19 is a timing chart showing preferable changes in signals (potentials) of the respective portions in an initialization, a setting operation and a normal operation of thus constituted clocked inverters 85a and 85b of the shift register 81.

In an initialization operation, a potential of the initialization signal line 108 becomes high, when a potential of the clock signal line 96 is high, a potential of the inverted clock signal line 95 is low, and potentials of the first control signal line 104 and the second control signal line 105 are low. According to this, the NMOSFET 106 and the PMOSFET 107 in each of the clocked inverters 85a and 85b are turned on, and the capacitors C6 and C7 in the correcting circuits 97 and 98 are initialized. When the potential of the initialization signal line 108 becomes a low level, the initialization operation is completed. In this embodiment, the initialization operation is simultaneously carried out in the clocked inverter 85a on the left side and the clocked inverter 85b on the right side. Therefore, in the initialization operation, in the clocked inverter 85b on one side (the right side in this example), a high level potential $V_{CH}$ is inputted to the capacitor C6 connected to the gate of the PMOSFET 93 while a low level potential $V_{cL}$ is inputted to the capacitor C7 connected to the gate of the NMOSFET 94. Meanwhile, in the clocked inverter 85a on the other side (the left side in this example), a low level potential $V_{cL}$ is inputted to the capacitor C6 connected to the gate of the PMOSFET 93 while a high level potential $V_{CH}$ is inputted to the capacitor C7 connected to the gate of the NMOSFET 94.

A setting operation is composed of a first setting operation in which electric charges are accumulated in the capacitors C6 and C7 in the clocked inverter 85a on the left side of FIG. 18 and a second setting operation in which electric charges are accumulated in the capacitors C6 and C7 in the clocked inverter 85b on the right side of FIG. 18. In the first setting operation, in a first phase, potentials of the first control signal line 104 and the inverted clock signal line 95 become a high level while potentials of the second control signal line 105 and the clock signal line 96 become a low level. According to this, in the clocked inverter 85a on the left side, the PMOSFET 100 and the NMOSFET 102 are turned on, the capacitors the setting operation of C6 and C7 is carried out, and thereby the capacitors C6 and C7 are properly charged. Since the PMOSFET 100 and the NMOSFET 102 are off in the clocked inverter 85b on the right side, the setting operation is not carried out in the clocked inverter 85b. In a second phase, a potential of the first control signal line 104 becomes a low level and the MOSFETs 100 and 102 are turned off, therefore, the setting operation in the clocked inverter 85a is completed.

Subsequently in the second setting operation, in the first phase, the potentials of the second control signal line 105 and the clock signal line 96 become a high level while the potential of the inverted clock signal line 95 becomes a low level. According to this, the PMOSFET 100 and the NMOSFET 102 in the clocked inverter 85b on the right side are turned on and the setting operation of the capacitors C6 and C7 is carried out. In the second phase, the potential of the second control signal line 105 becomes a low level, and the setting operation in the clocked inverter 85b is completed. In a normal operation, the potentials of the first and the second control signal lines 104 and 105 are maintained at a low level and the electric charges accumulated in the capacitors C6 and C7 in each of the clocked inverters 85a and 85b are held, and in this state, a clock signal is supplied to the clock signal and the inverted clock signal lines 96 and 95.

Figure 20:
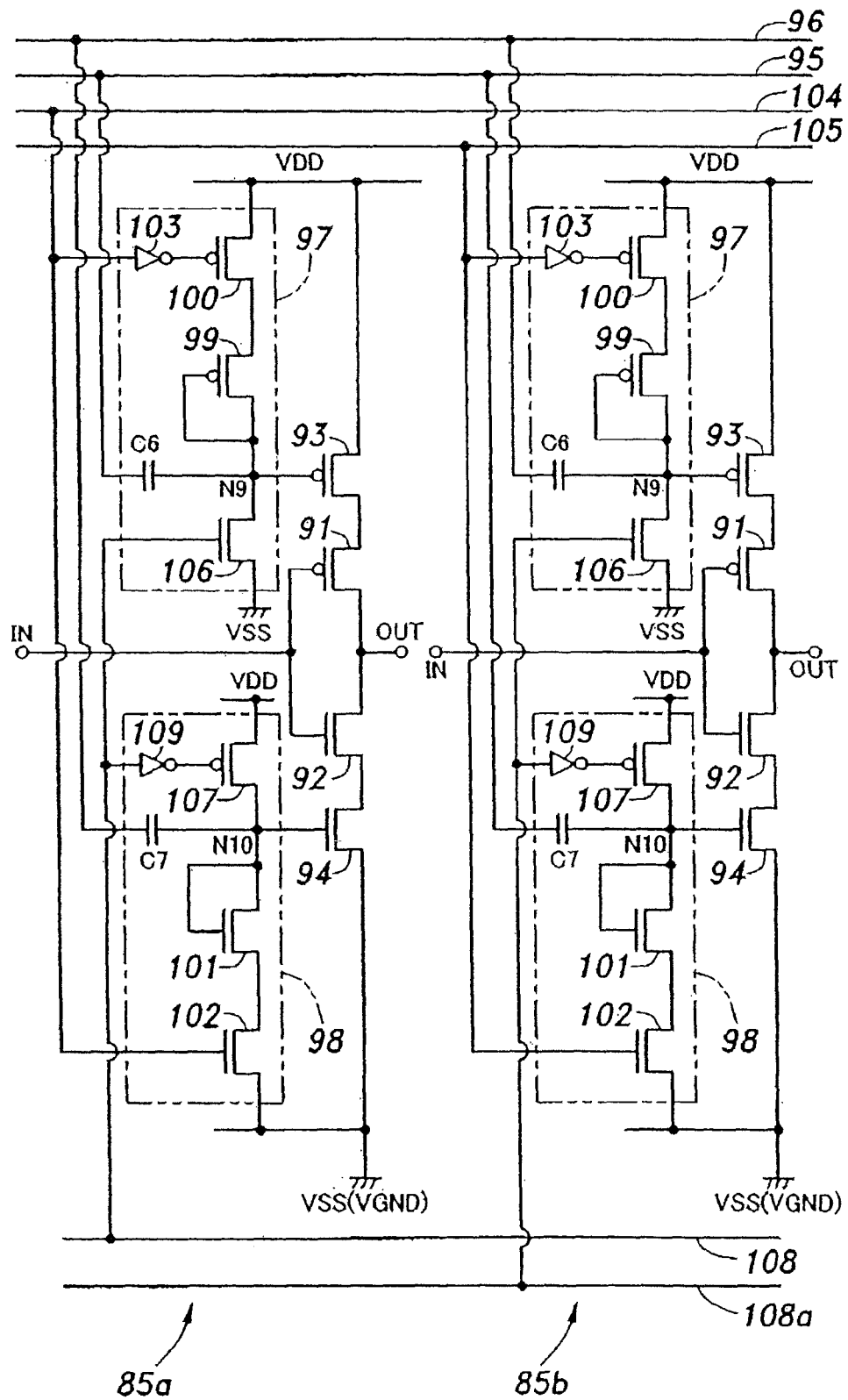
FIG. 20 is a circuit diagram showing a another embodiment of the modified embodiment shown in FIG. 18.

FIG. 20 is a circuit diagram showing another embodiment of the modified shift register 81 that includes the clocked inverters 85a and 85b shown in FIG. 18. In this drawing, the same portions as FIG. 18 are denoted by the same reference numerals. The embodiment shown in FIG. 20 is different from that shown in FIG. 18 in that a second initialization signal line 108a is provided in addition to the initialization signal line 108 (referred to as a first initialization signal line), and the gates of the MOSFETs 106 and 107 for initialization in the clocked inverter 85b on the right side are connected to the second initialization signal line 108a so that the initialization operations in the clocked inverter 85a on the left side and the clocked inverter 85b on the right side can be carried out separately.

FIG. 21 is a timing chart showing preferable changes in signals (potentials) of the respective portions in an initialization, a setting operation and a normal operation in the embodiment shown in FIG. 20. As shown in FIG. 21, in this embodiment, a first initialization operation is carried out before a first setting operation in which electric charges are accumulated in the capacitors C6 and C7 in the clocked inverter 85a on the left side of FIG. 20, and a second initialization operation is carried out before a second setting operation in which electric charges are accumulated in the capacitors C6 and C7 in the clocked inverter 85b on the right side.

In the first initialization operation, a potential of the first initialization signal line 108 becomes a high level, a potential of the clock signal line 96 being a low level, a potential of the inverted clock signal line 95 being a high level, and potentials of the first control signal line 104 and the second control signal line 105 being a low level. According to this, the NMOSFET 106 and the PMOSFET 107 in the clocked inverter 85a are turned on, and the capacitors C6 and C7 in the correcting circuits 97 and 98 are initialized. The first setting operation was described with reference to FIG. 19, therefore, the explanation is omitted here.

In the second initialization operation, a potential of the second initialization signal line 108a becomes a high level, the potential of the clock signal line 96 being a high level, the potential of the inverted clock signal line 95 being a low level, and the potentials of the first control signal line 104 and the second control signal line 105 being a low level. According to this, the NMOSFET 106 and the PMOSFET 107 in the clocked inverter 85b are turned on, and the capacitors C6 and C7 in the correcting circuits 97 and 98 are initialized. The second setting operation was described with reference to FIG. 19, therefore, the explanation is omitted here.

In the aforementioned embodiment, the initialization operation is divided into the first initialization operation and the second initialization operation. Accordingly, the potentials of the clock signal line 96 and the inverted clock signal line 95 can be controlled properly in each initialization operation so that a high level potential $V_{CH}$ is inputted to the capacitor C6 connected to the gate of the PMOSFET 93 while a low level potential $V_{cL}$ is inputted to the capacitor C7 connected to the gate of the NMOSFET 94.

Figure 22:
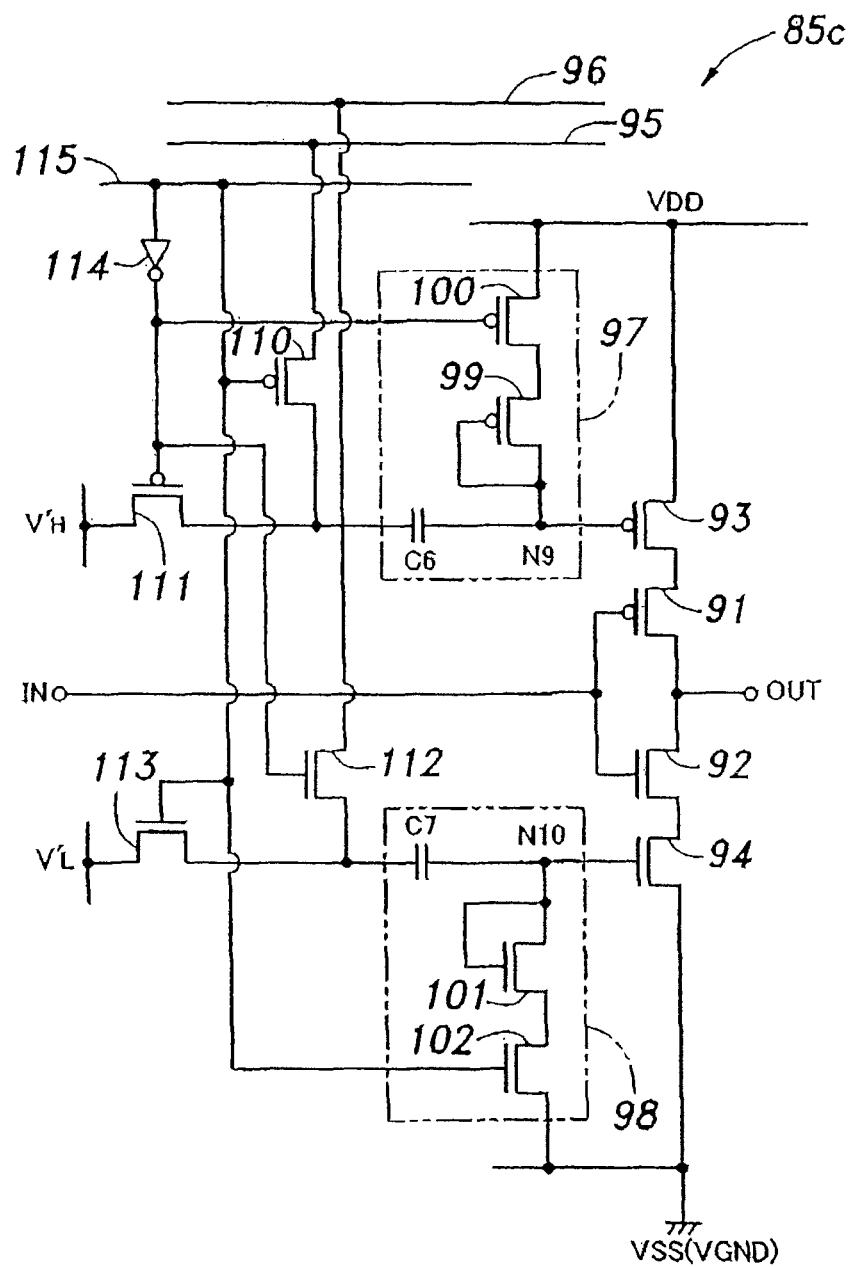
FIG. 22 is a circuit diagram showing another embodiment of the clocked inverter shown in FIG. 18.

FIG. 22 is a circuit diagram showing another embodiment of the clocked inverter 85a (85b) shown in FIG. 18. In this drawing, the same portions as FIG. 18 are denoted by the same reference numerals, and are explained in no more details. In a clocked inverter 85c, a terminal of the capacitor C6 on the opposite side to a terminal that is connected to the gate of the PMOSFET 93 is connected through a PMOSFET 110 to the inverted clock signal line 95 while connected through a PMOSFET 111 to a potential $V_H'$ that is substantially equal to a high level potential $V_{CH}$ of an inverted clock signal. Similarly, a terminal of the capacitor C7 on the opposite side to a terminal that is connected to the gate of the NMOSFET 94 is connected through an NMOSFET 112 to the clock signal line 96 while connected through an NMOSFET 113 to a potential $V_L'$ that is substantially equal to a low level potential $V_{cL}$ of a clock signal. Gates of the MOSFETs 100, 111 and 112 are connected through an inverter 114 to a control signal line 115, gates of the MOSFETs 102, 110 and 113 are connected directly to the control signal line 115. According to this, when a potential of the control signal line 115 becomes high level, the MOSFETs 100, 111, 102, and 113 are turned on while the MOSFETs 110 and 112 are turned off, and thereby electric charges are accumulated in the capacitors C6 and C7 (setting operation). On the other hand, in the case of the potential of the control signal line 115 being a low level, the MOSFETs 100, 111, 102, and 113 are turned off while the MOSFETs 110 and 112 are turned on, and thereby an inverted clock signal and a clock signal are supplied through the charged capacitors C6 and C7 to the gates of the PMOSFET 93 and the NMOSFET 94. Such an embodiment shown in FIG. 22 can be considered to be an example in which the switches SW12, SW13, and SW16 to SW19 in the clocked inverter circuit 60b shown in FIG. 16 are formed of the MOSFETs 100, 102, and 110 to 113. It is needless to say that although the MOSFETs 106 and 107 for initialization of the capacitors C6 and C7 shown in FIG. 18 are not provided in this embodiment, they may be provided as required.

Figure 23:
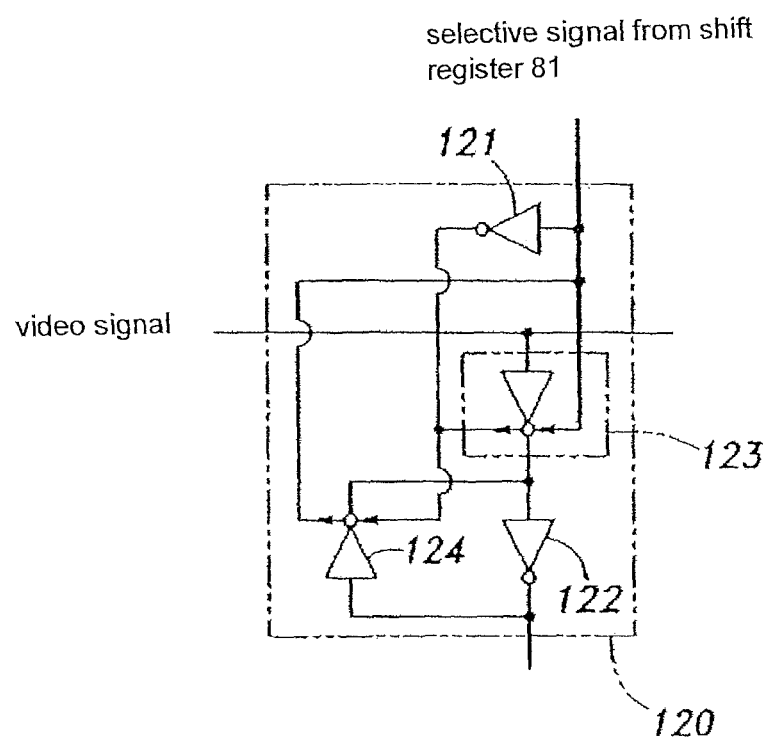
FIG. 23 is a circuit diagram showing a typical unit circuit in a first latch circuit shown in FIG. 17.

FIG. 23 is a circuit diagram showing a typical unit circuit in the first latch circuit 82 shown in FIG. 17. A unit circuit 120 comprises two inverters 121 and 122 and two clocked inverters 123 and 124, and has a function to latch a digitalized video signal in accordance with a selective signal from the shift register 81. The invention may be applied to the clocked inverter 123 to which the video signal is supplied as an input signal, in the case of a high level potential of the video signal being lower than a high level power supply potential VDD and/or a low level potential of the video signal being higher than a low level power supply potential VSS.

Figure 24:
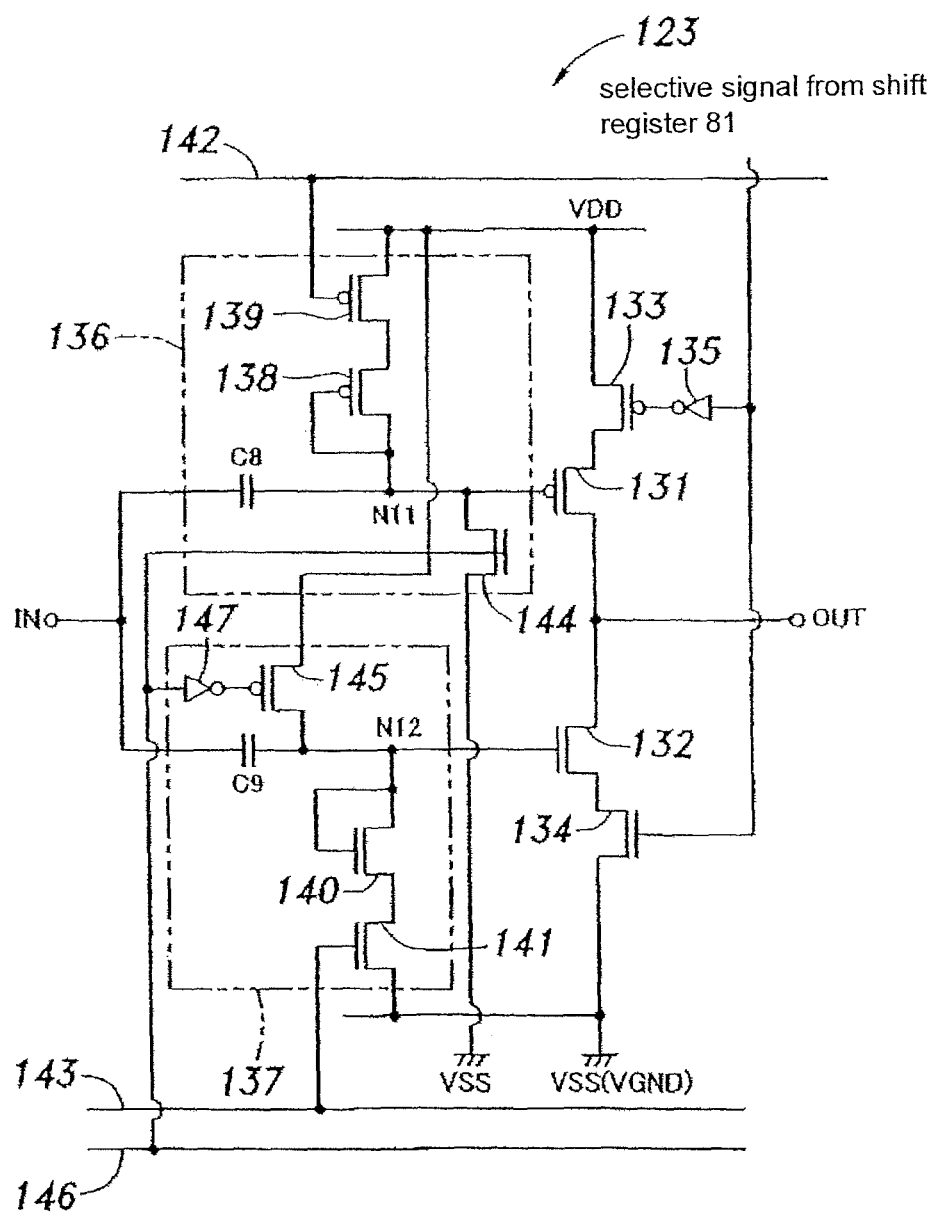
FIG. 24 is a circuit diagram showing an embodiment in which the invention is applied to the clocked inverter of the first latch circuit shown in FIG. 23.

FIG. 24 is a circuit diagram showing an embodiment in which the invention is applied to the clocked inverter 123 of the unit circuit 120 shown in FIG. 23. The clocked inverter 85c using a correcting circuit for the MOSFET for clock signal synchronization is shown in FIG. 22. Meanwhile, in FIG. 24, a clocked inverter using a correcting circuit for a MOSFET to which an input signal is inputted is shown. The clocked inverter 123 comprises a PMOSFET 131 and an NMOSFET 132 whose drains are connected to an output terminal OUT and in series with each other so as to constitute a CMOS inverter. Both gates of these MOSFETs 131 and 132 are connected to an input terminal IN to which a video signal is inputted as an input signal. A source of the PMOSFET 131 is connected through a PMOSFET 133 to a high level power supply potential VDD, a source of the NMOSFET 132 being connected through an NMOSFET 134 to a low level power supply potential VSS ($V_{GND}$ in this example). A selective signal from the shift register is inputted to gates of the PMOSFET 133 and the NMOSFET 134. However, since an inverter 135 is provided to the gate of the PMOSFET 133, a signal with opposite polarity is inputted to each of the MOSFETs 133 and 134.

Correcting circuits 136 and 137 are respectively connected between the input terminal IN and the gates of the PMOSFET 131 and the NMOSFET 132. The correcting circuit 136 comprises a capacitor C8 connected between the gate of the PMOSFET 131 and the input terminal IN, a diode-connected PMOSFET 138 that has the substantially same threshold voltage as the PMOSFET 131, and a PMOSFET 139 that functions as a switch for selectively carrying out a setting operation. The PMOSFET 138 and the PMOSFET 139 are connected in series between a node N11 between the capacitor C8 and the gate of the PMOSFET 131 and a high level power supply potential VDD. Similarly, the correcting circuit 137 comprises a capacitor C9 connected between the gate of the NMOSFET 132 and the input terminal IN, a diode-connected NMOSFET 140 that has the substantially same threshold voltage as the NMOSFET 132, and an NMOSFET 141 that functions as a switch for selectively carrying out a setting operation. The NMOSFET 140 and the NMOSFET 141 are connected in series between a node N12 between the capacitor C9 and the gate of the NMOSFET 132 and a low level power supply potential VSS. In this embodiment, a gate of the PMOSFET 139 is connected to a P-channel control signal line 142, a gate of the NMOSFET 141 being connected to an N-channel control signal line 143. However, in the case of the setting operation being carried out at the same time in the PMOSFET and the NMOSFET as shown in FIG. 16 and FIG. 22, an inverter is provided to either the gate of the PMOSFET 139 or the gate of the NMOFSET 141 similarly to the embodiment shown in FIG. 18, and thereby only one control signal line can be used in common.

Furthermore, the node N11 between the capacitor C8 and the gate of the PMOSFET 131 is connected through an NMOSFET 144 to the low level power supply potential VSS, the node N12 between the capacitor C9 and the gate of the NMOSFET 132 being connected through a PMOSFET 145 to the high level power supply potential VDD. The NMOSFET 144 is connected directly to an initialization signal line 146, a gate of the PMOSFET 145 is connected through an inverter 147 to the initialization signal line 146, and signals with opposite phases are inputted to the gates of these MOSFETs 144 and 145. It is to be noted that the initialization signal line may be arranged separately as the embodiment shown in FIG. 12.

Figure 25:
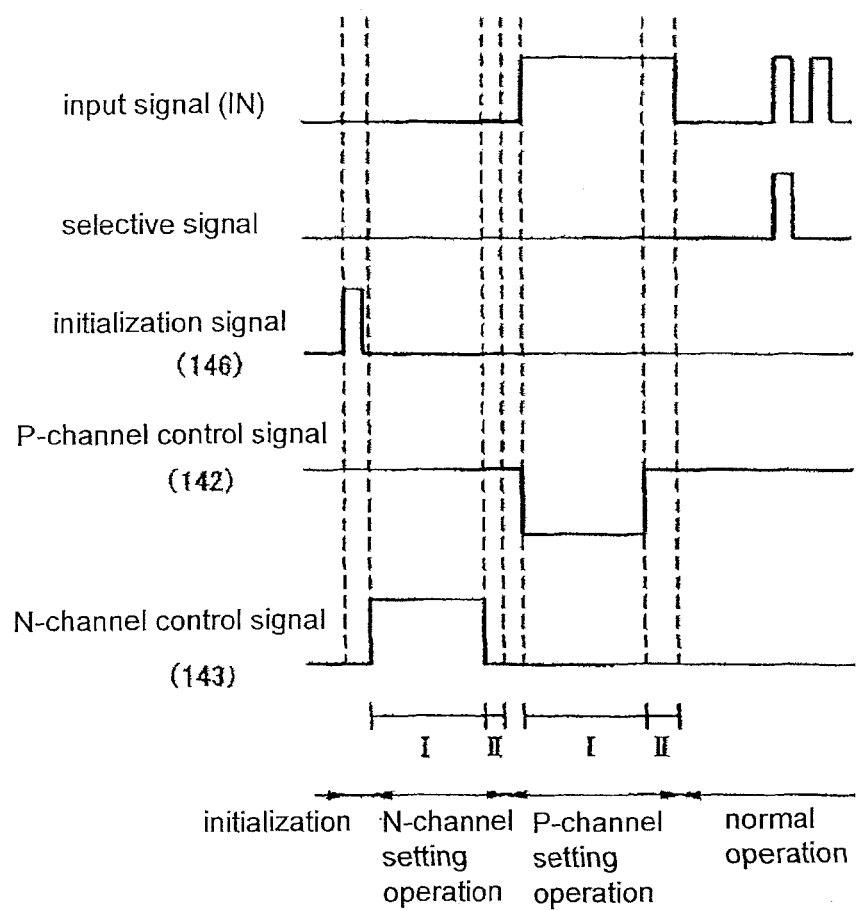
FIG. 25 is a timing chart showing signals (potentials) of the respective portions in an initialization, a setting operation and a normal operation of the clocked inverter shown in FIG. 24.

FIG. 25 is a timing chart showing preferable changes in signals (potentials) of the respective portions in an initialization, a setting operation and a normal operation of thus constituted clocked inverter 123 in the latch circuit. As shown in FIG. 25, an initialization operation, an N-channel setting operation (setting operation of the capacitor C9), a P-channel setting operation (setting operation of the capacitor C8), and a normal operation are carried out in this order. Each of the N-channel setting operation and the P-channel setting operation is composed of two phases. It is needless to say that the order of the N-channel setting operation and the P-channel setting operation can be changed over.

In the initialization operation, an initialization signal (146) becomes high, an input signal (video signal), a selective signal, and an N-channel control signal (143) being low and a P-channel control signal (142) being high. Since the P-channel control signal is a high level and the N-channel control signal is a low level, the PMOSFET 139 and the NMOSFET 141 are off. When the initialization signal becomes high, the MOSFETs 144 and 145 are turned on and the capacitors C8 and C9 are initialized (that is, a potential of the node N11 is lowered to a low level power supply potential VSS whereas a potential of the node N12 is increased to a high level power supply potential VDD). When the initialization signal becomes a low level, the initialization operation is completed.

In the N-channel setting operation for accumulating electric charges in the capacitor C9 connected to the gate of the NMOSFET 132, the N-channel control signal (143) becomes high in a first phase while the video signal (IN) remains at a low level. As a result, the NMOSFET 141 is turned on and a current flows from the input terminal IN to the low level power supply potential VSS, and thereby the capacitor C9 is charged. The N-channel control signal is maintained at a high level for a sufficient time for a voltage across the capacitor C9 to reach a proper value and for the NMOSFET 141 to turn off. In a second phase, the N-channel control signal becomes low and the N-channel setting operation is completed.

In the P-channel setting operation for accumulating electric charges in the capacitor C8 connected to the gate of the PMOSFET 131, the video signal (IN) becomes high in a first phase while the P-channel control signal (142) remains at a low level. As a result, the PMOSFET 139 is turned on and a current flows from the high level power supply potential VDD to the input terminal IN, and thereby the capacitor C8 is charged. The P-channel control signal is maintained at a low level for a sufficient time for a voltage across the capacitor C8 to reach a proper value and for the PMOSFET 139 to turn off, and is then turned high in a second phase. When the video signal becomes low, the normal operation can be started. As shown in FIG. 25, in the normal operation, the video signal and the selective signal are inputted, the P-channel control signal being high and the N-channel control signal being low. As set forth above, there are two types of circuits: the one in which a capacitor is connected directly to an input terminal IN as shown in FIG. 5 and FIG. 7 and the other in which a capacitor is connected through a switch to an input terminal IN as shown in FIG. 13 and FIG. 16. By combining these two types of circuits, various circuits can be configured and timing of the setting operation can be changed arbitrarily depending on the configuration of each circuit.

Figure 26A:
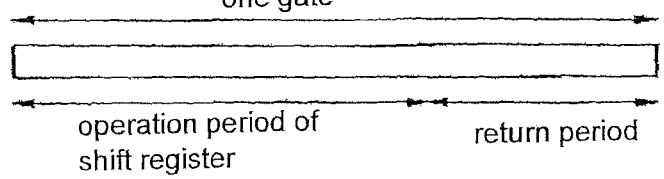
FIG. 26a is a diagram schematically showing a return period in a selective period of one gate and FIG. 26b is a diagram schematically showing a driver stop period.

In the various embodiments of the invention described above, after a setting operation of a capacitor in a correcting circuit, a switch connected between the capacitor and a power supply potential (VDD or VSS) is turned off, therefore, electric charges accumulated in the capacitor are held. However, since some leakage current occurs actually, the setting operation is preferably carried out at a proper period. For example, in the case of the invention being applied to a transistor in a shift register of an active matrix circuit of a liquid crystal display, the setting operation may be carried out in a return period of an inputted video signal in which the shift register is not operated (see FIG. 26*a*).

Figure 26B:
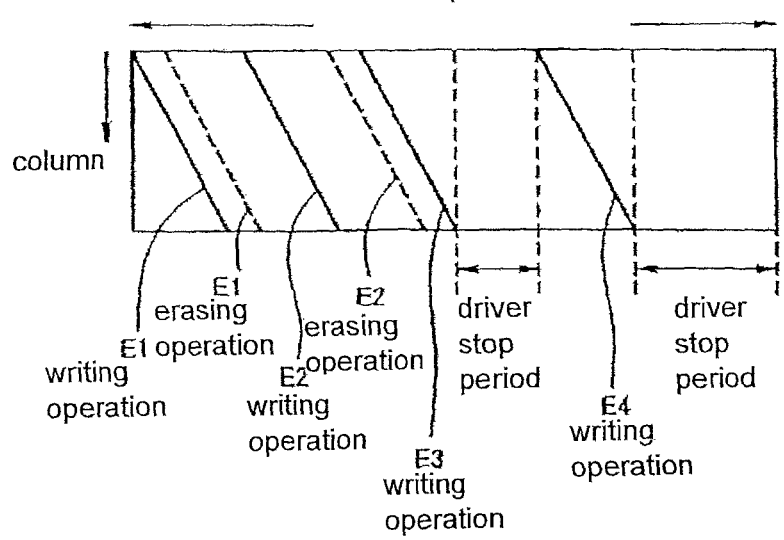

Further, known is a display adopting a time gray scale method in which gray scale is obtained by varying a total period of light emission of each pixel in one frame by selectively combining a plurality of different light emitting periods E1, E2, E3 . . . in one frame period (in the case of 4-bit display, for example, 16 gray scales can be achieved by combining E1 to E4, when it is supposed that E1 is the shortest light emitting period and E2=2×E1, E3=4×E1, and E4=8×E1 are obtained). In a display adopting such a time gray scale method, for example, after data indicating whether or not light is emitted in the light emitting period E3 is written to a memory for each pixel, there is a period in which a driver circuit is not operated such as a period before or after writing of data whether or not light is emitted in the light emitting period E4 (see FIG. 26*b*). The aforementioned setting operation of the correcting circuit can be carried out in such a period in which the driver circuit is not operated. It is to be noted that the setting operation is not necessarily carried out in all the correcting circuits at a time, and it may be carried out at different timing in each correcting circuit. In addition, a signal is shifted and transferred in sequence in the shift register shown in FIG. 17 or FIG. 18. Therefore, the setting operation of a correcting circuit may be carried out by using a signal in the several stages before.

Figure 27:
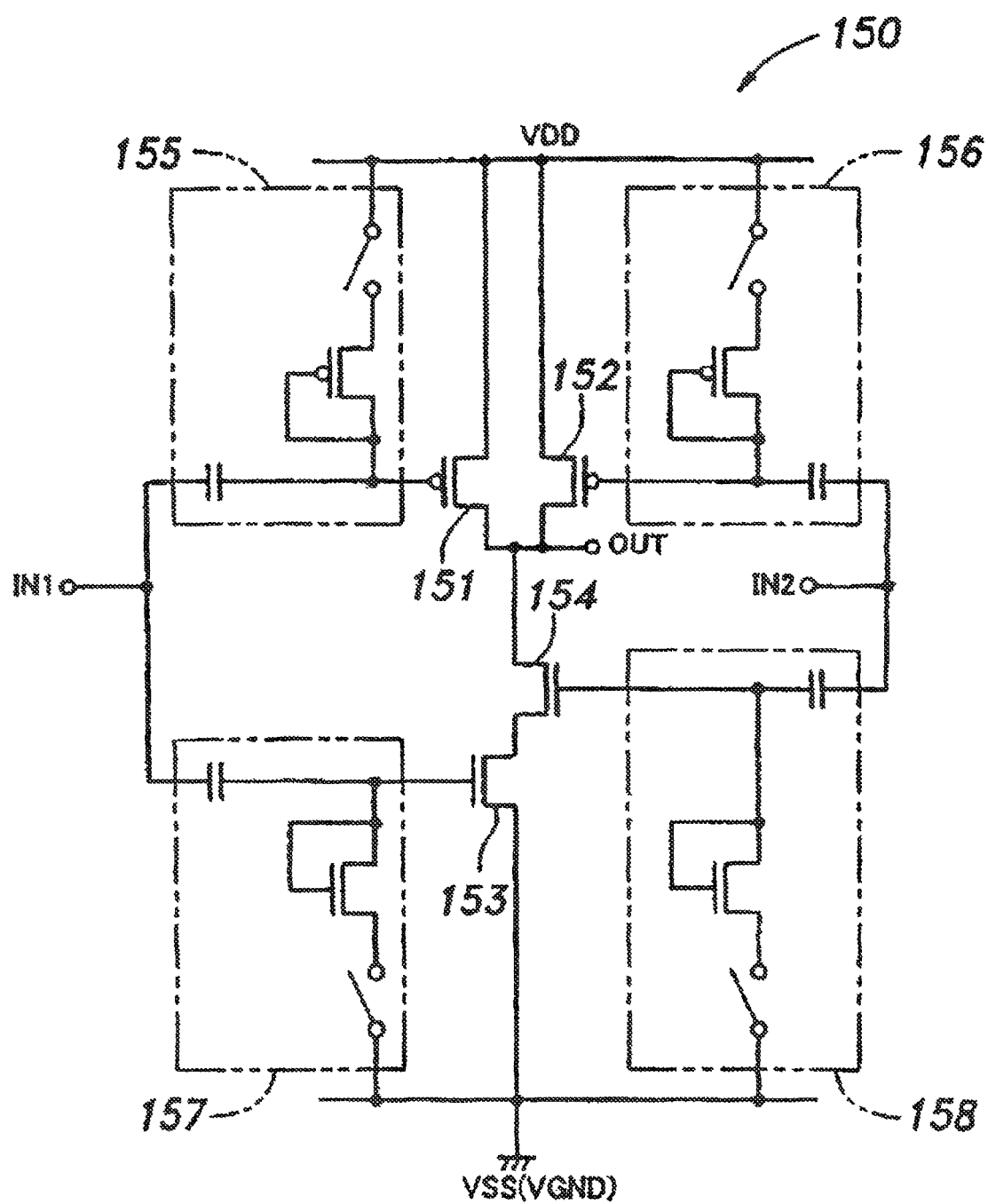
FIG. 27 is a circuit diagram showing an embodiment in which the invention is applied to a transistor constituting a NAND circuit.
Figure 28:
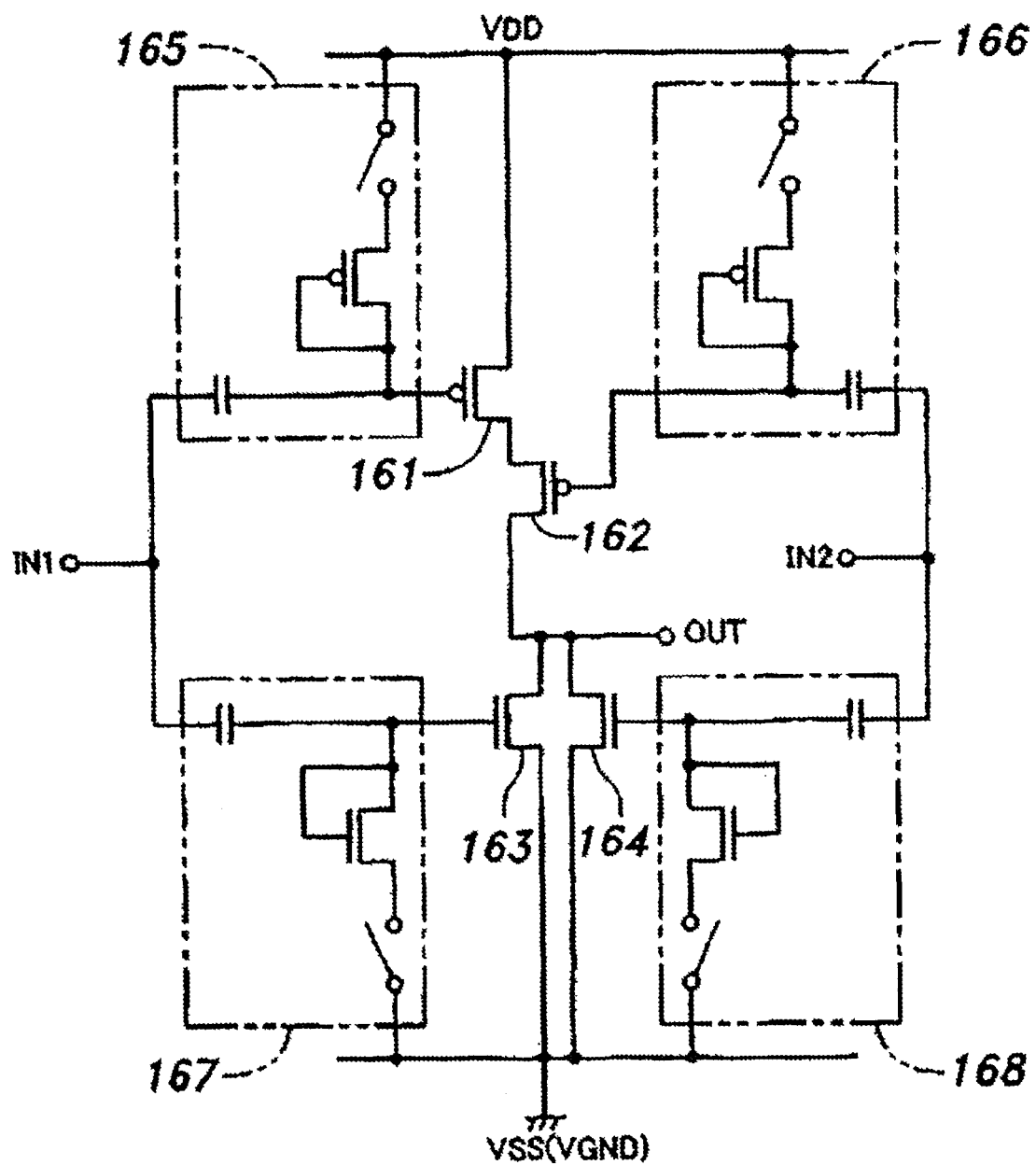
FIG. 28 is a circuit diagram showing an embodiment in which the invention is applied to a transistor constituting a NOR circuit.

The invention can be applied to a logical circuit such as a NAND circuit, a NOR circuit, and a transfer gate. FIG. 27 is a circuit diagram showing an embodiment in which the invention is applied to a transistor constituting a NAND circuit. FIG. 28 is a circuit diagram showing an embodiment in which the invention is applied to a transistor constituting a NOR circuit.

A digital circuit 150 shown in FIG. 27 comprises two PMOSFETs 151 and 152 that are connected in parallel, and two NMOSFETs 153 and 154 that are connected in series, and these four MOSFETs 151 to 154 constitute a NAND circuit. More specifically, gates of the PMOSFET 151 and the NMOSFET 153 are connected to a first input terminal IN1, gates of the PMOSFET 152 and the NMOSFET 154 being connected to a second input terminal IN2. Sources of the PMOSFETs 151 and 152 are both connected to a high level power supply potential VDD, both drains thereof being connected to a drain of the NMOSFET 154 as well as an output terminal OUT. A source of the NMOSFET 154 is connected to a drain of the NMOSFET 153, a source of the NMOSFET 153 being connected to a low level power supply potential VSS ($V_{GND}$ in this example). Such a NAND circuit is known well in this field.

According to the invention, correcting circuits 155 to 158 are provided for the MOSFETs 151 to 154 respectively. Similarly to the aforementioned embodiments, each of the correcting circuits 155 to 158 comprises a capacitor connected to the gate of the corresponding MOSFET, a diode-connected MOSFET that has the same polarity and the substantially same threshold voltage as the corresponding MOSFET, and a switch that is connected in series with the diode-connected MOSFET. Operations and effects of such correcting circuits 155 to 158 are similar to those of the embodiments described above, therefore, the explanation thereof is omitted here.

FIG. 28 comprises two PMOSFETs 161 and 162 that are connected in series, and two NMOSFETs 163 and 164 that are connected in parallel, and these four MOSFETs 161 to 164 constitute a NOR circuit. More specifically, gates of the PMOSFET 161 and the NMOSFET 163 are connected to a first input terminal IN1, gates of the PMOSFET 162 and the NMOSFET 164 being connected to a second input terminal IN2. A source of the PMOSFET 161 is connected to a high level power supply potential VDD, a drain thereof being connected to a source of the PMOSFET 162. A drain of the PMOSFET 162 is connected to drains of the NMOSFETs 163 and 164 as well as an output terminal OUT. Sources of the NMOSFETs 163 and 164 are both connected to a low level power supply potential VSS ($V_{GND}$ in this example). Such a NOR circuit is known well in this field.

According to the invention, correcting circuits 165 to 168 are provided for the MOSFETs 161 to 164 respectively. Similarly to the aforementioned embodiments, each of the correcting circuits 165 to 168 comprises a capacitor connected to the gate of the corresponding MOSFET, a diode-connected MOSFET that has the same polarity and the substantially same threshold voltage as the corresponding MOSFET, and a switch that is connected in series with the diode-connected MOSFET. Operations and effects of such correcting circuits 165 to 168 are similar to those of the embodiments described above, therefore, the explanation thereof is omitted here.

Figure 29:
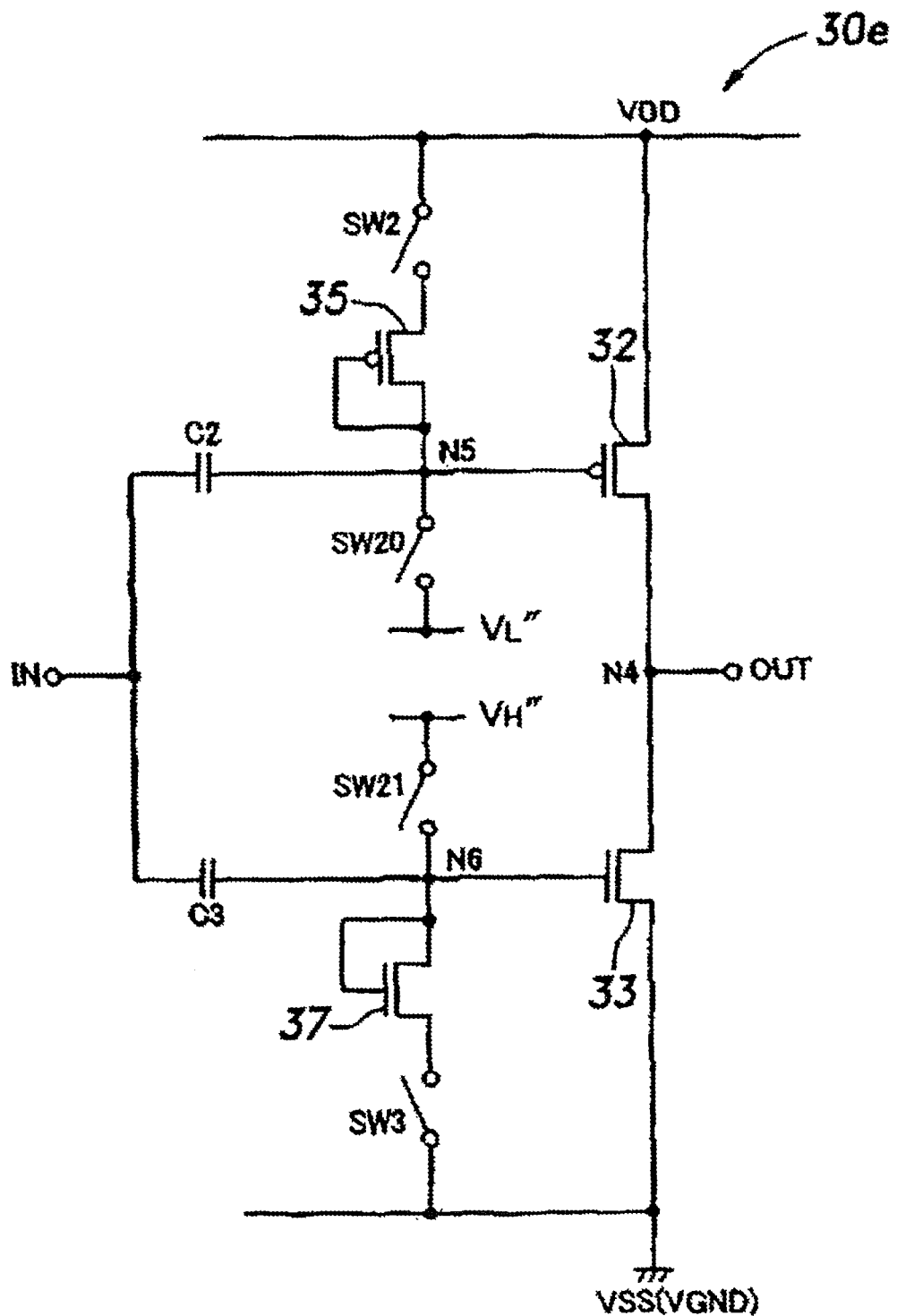
FIG. 29 is a circuit diagram showing still another modification embodiment of a digital circuit based on the invention.

Described above is a preferable embodiment of a digital circuit having a switching circuit using a transistor, which is capable of turning on/off the transistor assuredly even in the case of an amplitude of an input signal being smaller than a power supply voltage (difference between a high level power supply potential and a low level power supply potential). When the setting operation is changed properly, the aforementioned embodiment can respond to the case of operation speed of the transistor being preferably improved when the power supply voltage is not sufficiently large with respect to the absolute value of a threshold voltage of the transistor. FIG. 29 shows another modification embodiment of a digital circuit that can carry out such a setting operation. In this embodiment, the same portions as the embodiment shown in FIG. 5 are denoted by the same reference numerals, and are described in no more details.

In a digital circuit (inverter circuit) 30e shown in FIG. 29, the node N5 between the gate of the PMOSFET 32 and the capacitor C2 is connected through a switch SW20 to a low level potential $V_L"$, the node N6 between the gate of the NMOSFET 33 and the capacitor C3 being connected through a switch SW21 to a high level potential $V_H"$. The low level potential $V_L"$ can be made equal to a low level power supply potential VSS and the high level potential $V_H"$ can be made equal to, for instance, a high level power supply potential VDD. In that case, the digital circuit 30e becomes the same as the digital circuit 30c shown in FIG. 10.

A setting and normal operations of thus constituted digital circuit 30e will be explained below. It is herein assumed that a low level input potential $V_{INL}$ is equal to the low level power supply potential VSS ($V_{GND}$ in this example) and a high level input potential $V_{INH}$ is equal to the high level power supply potential VDD.

Figure 30B:
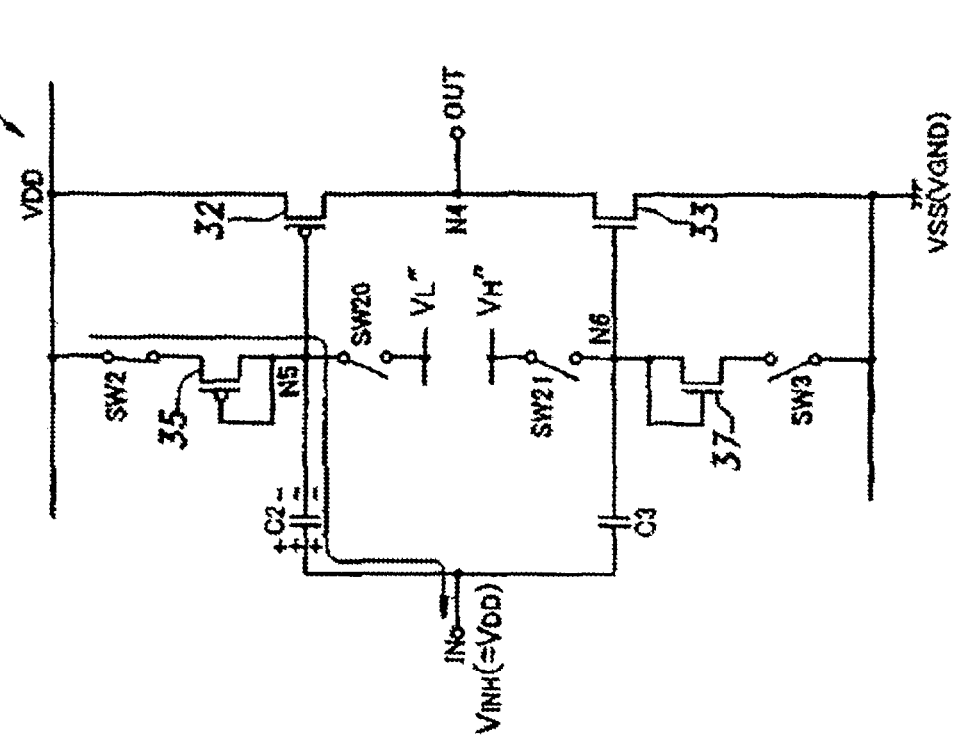
FIGS. 30a and 30b are diagrams each showing a setting operation of the digital circuit shown in FIG. 29.
Figure 30A:
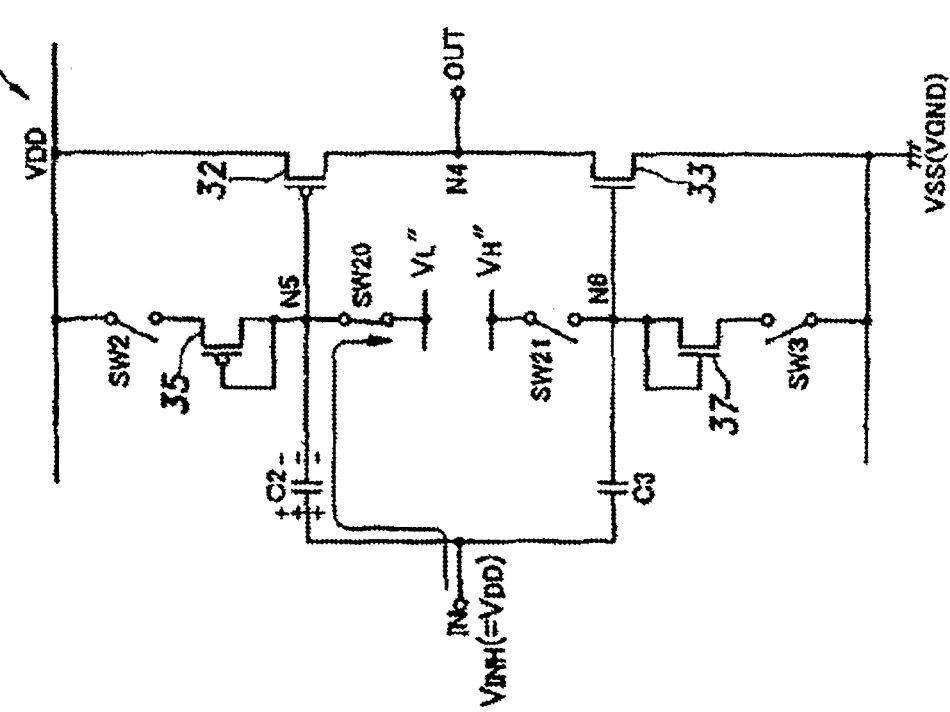

As shown in FIG. 30a, in a first setting operation for the capacitor C2, the switches SW2, SW3 and SW21 are turned off, and in this state, the switch SW20 is turned on and a high level input potential $V_{INH}$ is inputted to the input terminal IN. Then, a current flows in the direction shown by an arrow in the drawing, and thereby the capacitor C2 is charged so that the input terminal IN side becomes high and the gate side of the PMOSFET 32 becomes low. Subsequently, as shown in FIG. 30b, in a second setting operation, the switch SW20 is turned off and the switch SW2 is turned on while the high level input potential $V_{INH}$ being inputted to the input terminal IN. Accordingly, the capacitor C2 is discharged and a current flows in the direction shown by an arrow in the drawing. When a voltage across the capacitor C2 becomes equal to a threshold voltage $V_{THP}$ of the PMOSFET 35, the current is stopped. It is to be noted that the switch SW2 may be turned on in the first setting operation. The low level potential $V_L"$ is not necessarily equal to the VSS and has only to be a value that allows the capacitor C2 to be charged, in the first setting operation, at a voltage larger than the threshold voltage $V_{THP}$ of the PMOSFET 35 (namely, of the PMOSFET 32). The first setting operation can be considered as an initialization operation.

Similarly, as shown in FIG. 31a, in a first setting operation for the capacitor C3, the switches SW2, SW3 and SW20 are turned off, and in this state, the switch SW21 is turned on and a low level input potential $V_{INL}$ is inputted to the input terminal IN. Accordingly, a current flows in the direction shown by an arrow in the drawing, and thereby the capacitor C3 is charged so that the input terminal IN side becomes low and the gate side of the NMOSFET 33 becomes high. Subsequently, in a second setting operation, the switch SW21 is turned off and the switch SW3 is turned on while the low level input potential $V_{INL}$ being inputted to the input terminal IN. Accordingly, the capacitor C3 is discharged and a current flows in the direction shown by an arrow in FIG. 31b. When a voltage across the capacitor C3 becomes equal to a threshold voltage $V_{THN}$ of the NMOSFET 37, the current is stopped. It is to be noted that the switch SW3 may be turned on in the first setting operation. The high level potential $V_H"$ is not necessarily equal to the VDD and has only to be a value that allows the capacitor C3 to be charged, in the first setting operation, at a voltage larger than the threshold voltage $V_{THN}$ of the NMOSFET 37 (namely, of the NMOSFET 33).

After the capacitors C2 and C3 are thus charged, in a normal operation, the switches SW2, SW3, SW20, and SW21 are turned off, and an input signal that oscillates between a high level input potential $V_{INH}$ and a low level input potential $V_{INL}$ is inputted to the input terminal IN. In the case of a high level input potential $V_{INH}$ being inputted, as shown in FIG. 32a, a gate potential of the PMOSFET 32 $V_{INH}-|V_{THP}|$ becomes equal to VDD$-|V_{THP}|$, and a gate-source voltage $V_{GS}$ thereof becomes equal to $-|V_{THP}|$, and thereby the PMOSFET 32 is turned off. On the other hand, a gate potential of the NMOSFET 33 $V_{INH}+|V_{THN}|$ becomes equal to VDD$+|V_{THN}|$. Therefore, a voltage obtained by subtracting the $V_{THN}$ from a gate-source voltage $V_{GS}$ of the NMOSFET 33 becomes equal to the VDD, and thereby a voltage that is large enough to flow a sufficient current to the NMOSFET 33 to turn it on at high-speed is assured.

Figure 32B:
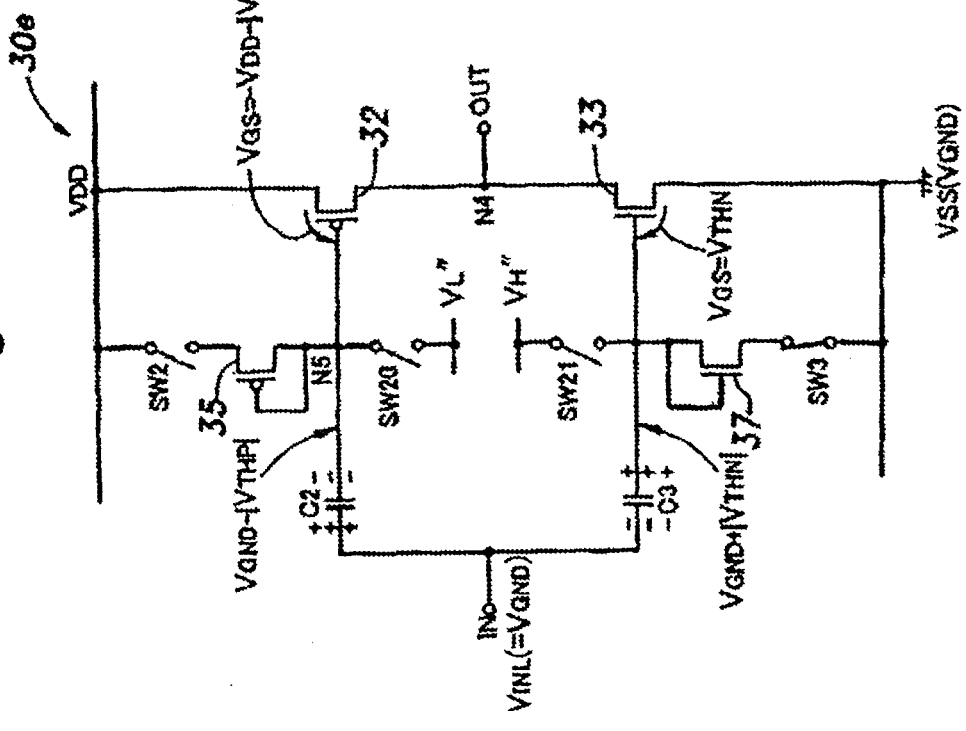
FIGS. 32a and 32b are diagrams each showing a normal operation of the digital circuit shown in FIG. 29.
Figure 32A:
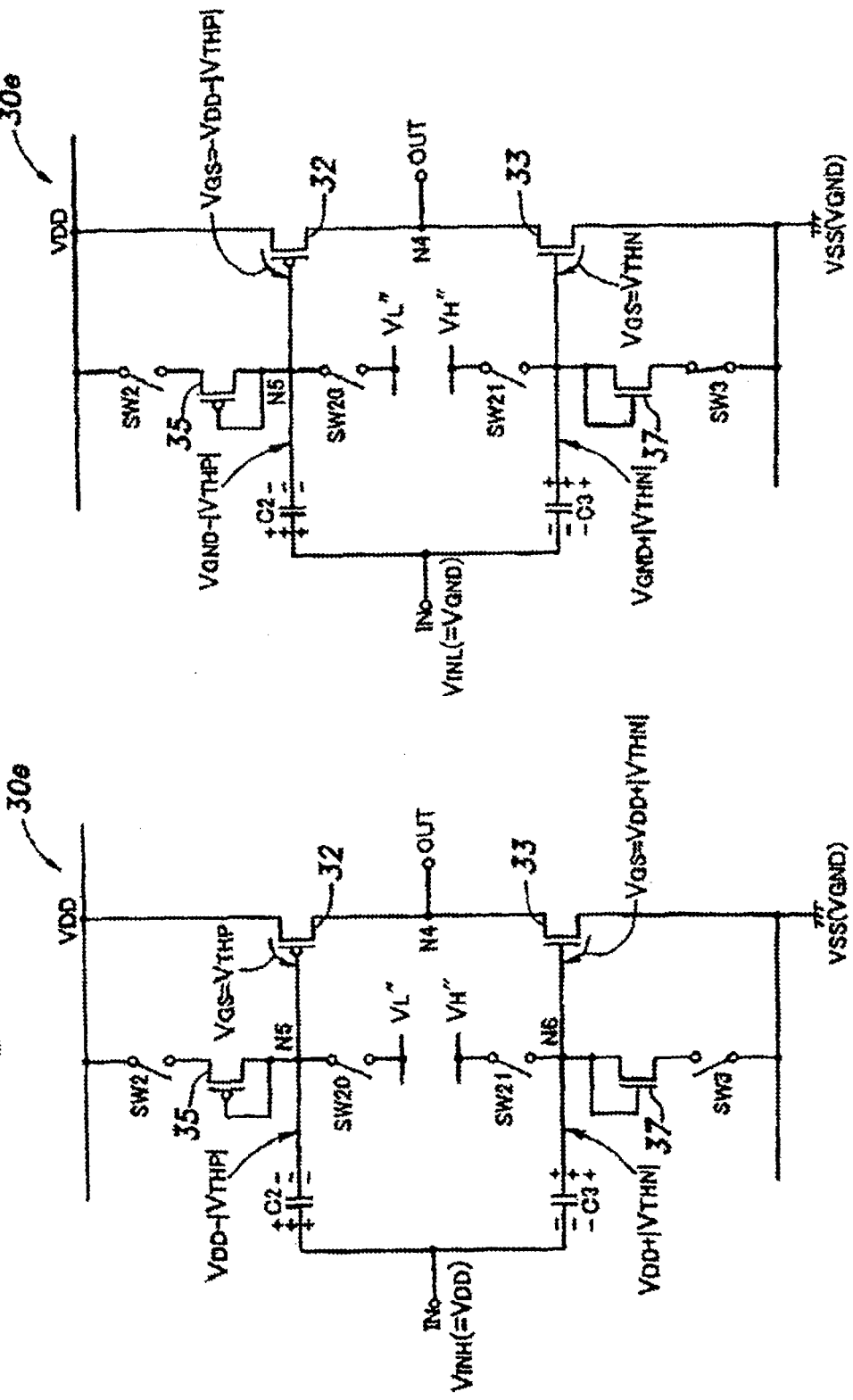

Similarly, in the case of a low level input potential $V_{INL}$ being inputted to the input terminal IN, as shown in FIG. 32b, a gate potential of the NMOSFET 33 $V_{INL}+|V_{THN}|$ becomes equal to VGND$+|V_{THN}|$, and a gate-source voltage $V_{GS}$ thereof becomes equal to $|V_{THN}|$, and thereby the NMOSFET 33 is turned off. On the other hand, a gate potential of the PMOSFET 32 $V_{INL}-|V_{THP}|$ becomes equal to $V_{GND}-|V_{THP}|$.

Therefore, a voltage obtained by subtracting the $V_{THP}$ from a gate-source voltage $V_{GS}$ of the PMOSFET 32 becomes equal to −VDD, and thereby a voltage (absolute value) that is large enough to flow a sufficient current to the PMOSFET 32 to turn on with high-speed is assured.

As set forth above, in the embodiments described with reference to FIGS. 29 to 32, the capacitors C2 and C3 in the correcting circuit can be charged so as to correct a DC level of an input signal in order to improve on-operation speed of the corresponding MOSFETs 32 and 33. Accordingly, a power supply voltage can be lowered without lowering circuit operation speed, leading to reduction in power consumption. Although a low level input potential $V_{INL}$ is equal to a low level power supply potential VSS ($V_{GND}$ in this example) while a high level input potential $V_{INH}$ is equal to a high level power supply potential VDD in the above description, the invention is not limited to this. In the above circuit, in general, the absolute value of a voltage of the capacitor C2 becomes $|V_{THP}|-(VDD-V_{INH})$ after a setting operation whereas the absolute value of a voltage of the capacitor C3 becomes $|V_{THN}|-(V_{INL}-VSS)$ after a setting operation. In an off-state, $V_{GS}$=threshold voltage is obtained in both the PMOSFET 32 and the NMOSFET 33, and both the PMOSFET 32 and the NMOSFET 33 are barely turned off. However, in an on-state, $|V_{GS}|=|$threshold voltage$|+V_{INH}-V_{INL}$ is obtained.

Figure 33:
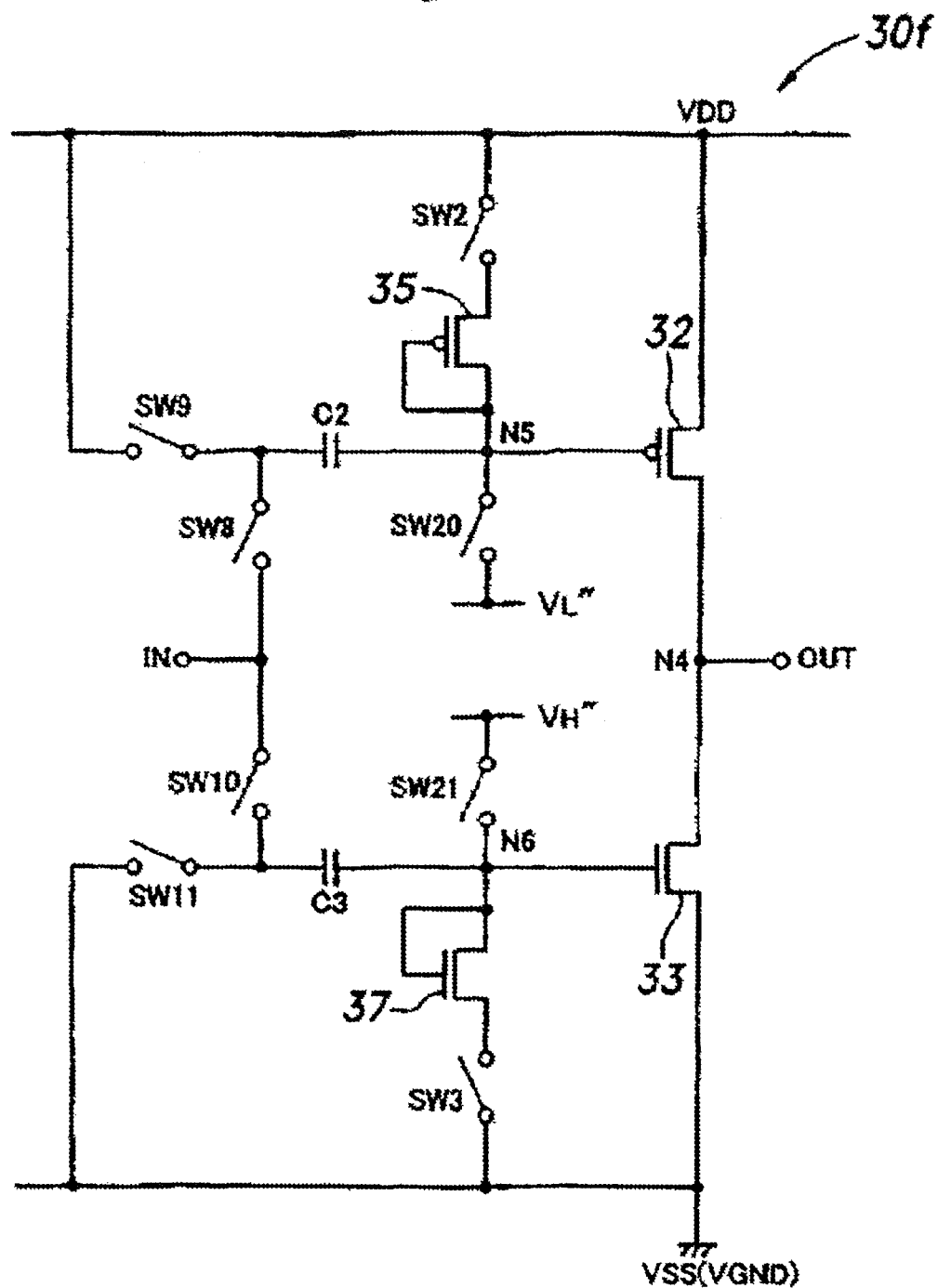
FIG. 33 is a circuit diagram showing still another modification embodiment of a digital circuit based on the invention.

In the digital circuit 30e shown in FIG. 29, setting operations of the capacitor C2 connected to the gate of the PMOSFET 32 and the capacitor C3 connected to the gate of the NMOSFET 33 are carried out separately by varying an input signal potential inputted to the input terminal IN. However, it is preferable that these setting operations can be carried out at the same time. Such a digital circuit is shown in FIG. 33. Note that this embodiment with reference to FIG. 33 is an embodiment to which the digital circuit 30d shown in FIG. 13 is applied, and in FIG. 33, the same portions as FIG. 13 and FIG. 29 are denoted by the same reference numerals and described in no more details.

In a digital circuit 30f shown in FIG. 33, a terminal of the capacitor C2 on the opposite side to a terminal that is connected to the gate of the PMOSFET 32 is connected through the switch SW8 to the input terminal IN while connected through the switch SW9 to a high level power supply potential VDD. Similarly, a terminal of the capacitor C3 on the opposite side to a terminal that is connected to the gate of the NMOSFET 33 is connected through the switch SW10 to the input terminal IN while connected through the switch SW11 to a low level power supply potential VSS.

A setting and normal operations of thus constituted digital circuit 30f will be explained below. It is herein assumed that, similarly to the description of the operation of the digital circuit 30e, a low level input potential $V_{INL}$ is equal to the low level power supply potential VSS ($V_{GND}$ in this example) and a high level input potential $V_{INH}$ is equal to the high level power supply potential VDD.

Figure 34B:
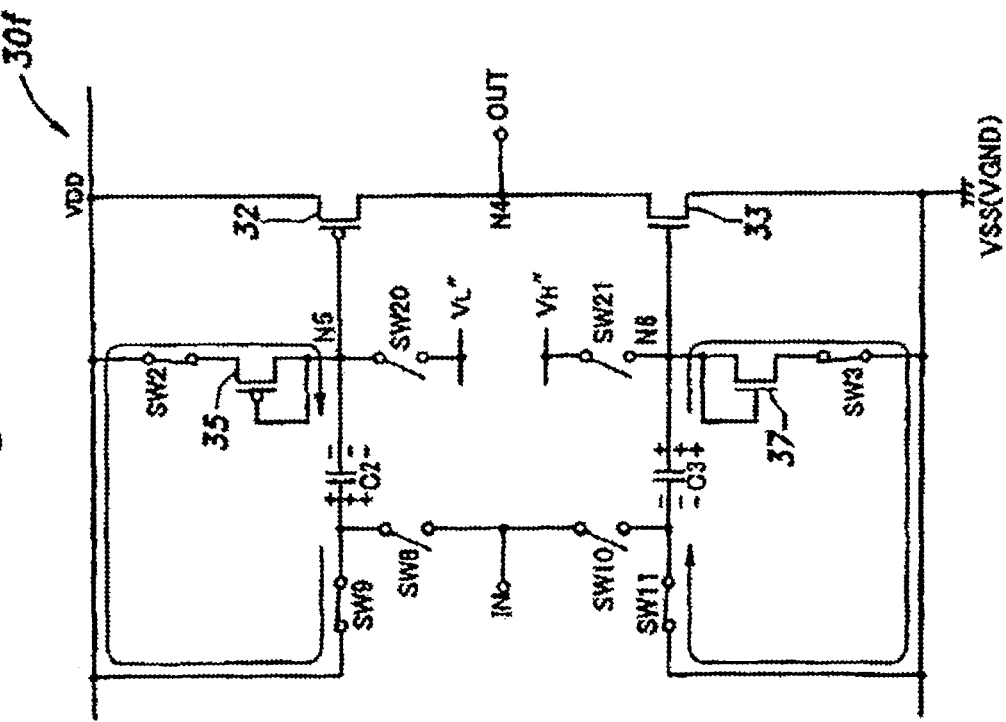
FIGS. 34a and 34b are diagrams each showing a setting operation of the digital circuit shown in FIG. 33.
Figure 34A:
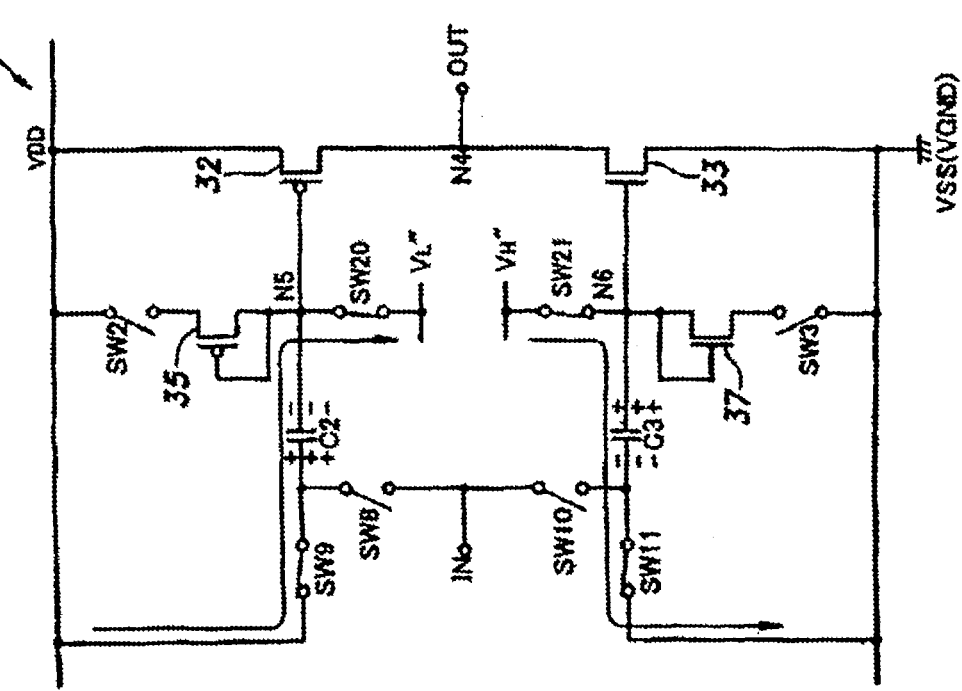

As shown in FIG. 34b, in a second setting operation, the switches SW2, SW3, SW9, and SW11 are turned on, and the switches SW8, SW10, SW20, and SW21 are turned off. According to this, the capacitors C2 and C3 are discharged and currents flow in the directions shown by arrows in the drawing. The respective currents stop when a voltage across the capacitor C2 becomes equal to a threshold voltage of the PMOSFET 35 and a voltage across the capacitor C3 becomes equal to a threshold voltage of the NMOSFET 37.

As shown in FIG. 34b, in a second setting operation, the switches SW2, SW3, SW9, and SW11 are turned on, and the switches SW8, SW10, SW20, and SW21 are turned off. According to this, the capacitors C2 and C3 are discharged and currents flow in the directions shown by arrows in the drawing. The respective currents stop when a voltage between both ends of the capacitor C2 becomes equal to a threshold voltage of the PMOSFET 35 and a voltage between both ends of the capacitor C3 becomes equal to a threshold voltage of the NMOSFET 37.

Figure 35:
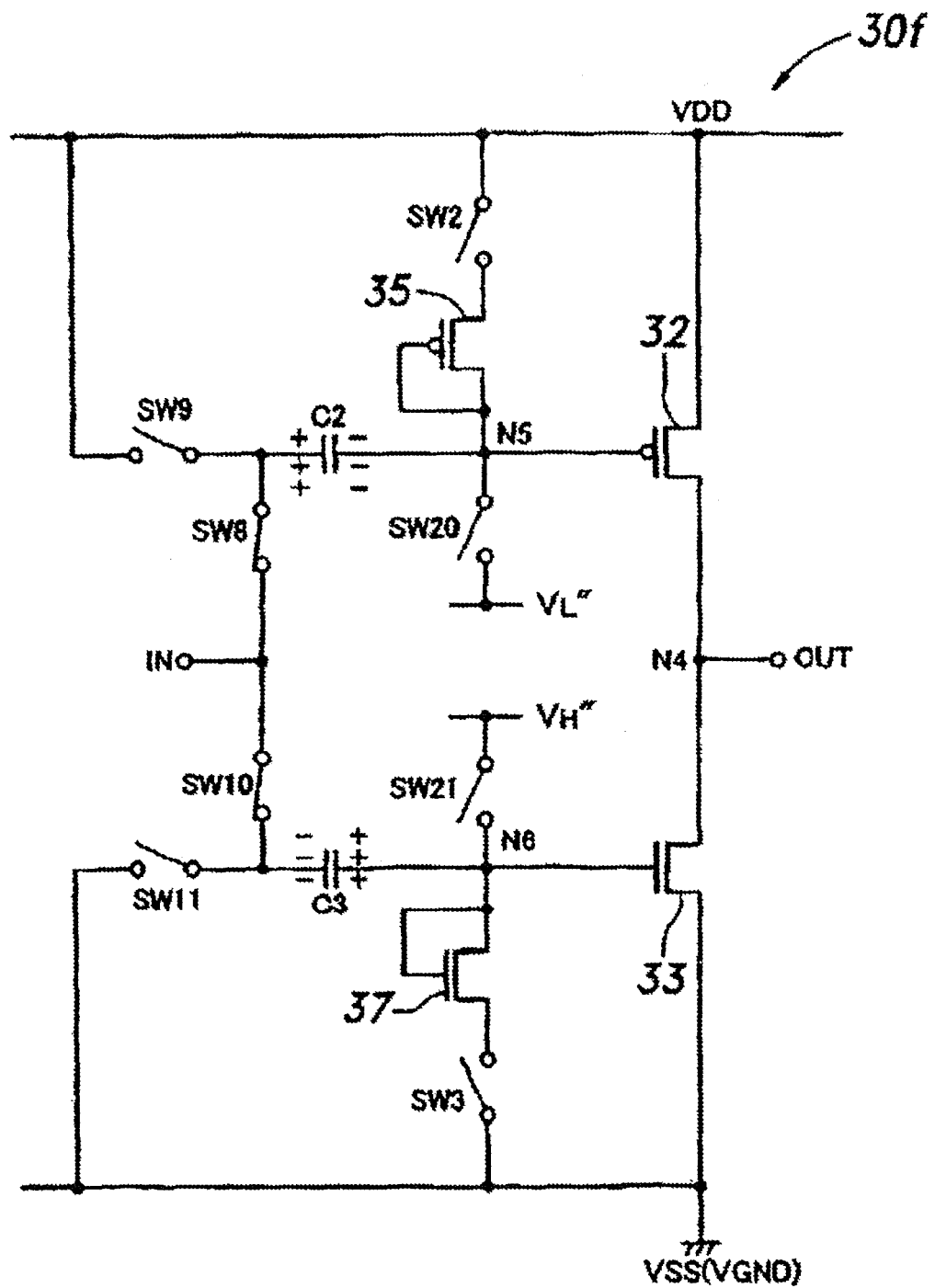
FIG. 35 is a circuit diagram showing a normal operation of the digital circuit shown in FIG. 33.
Figure 36A:
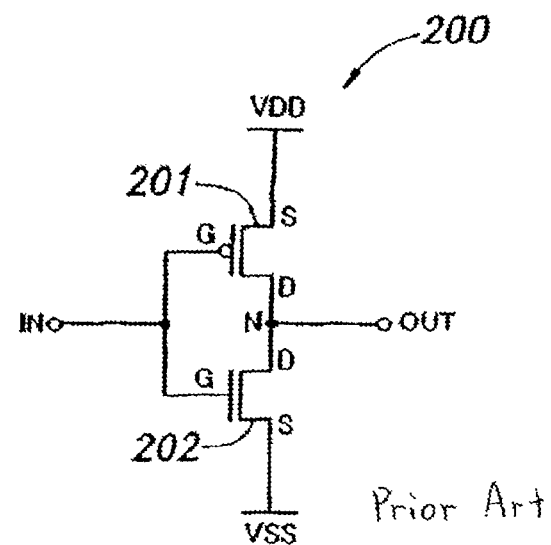
FIG. 36a is a circuit diagram showing a typical example of an existing CMOS inverter circuit.
Figure 36B:
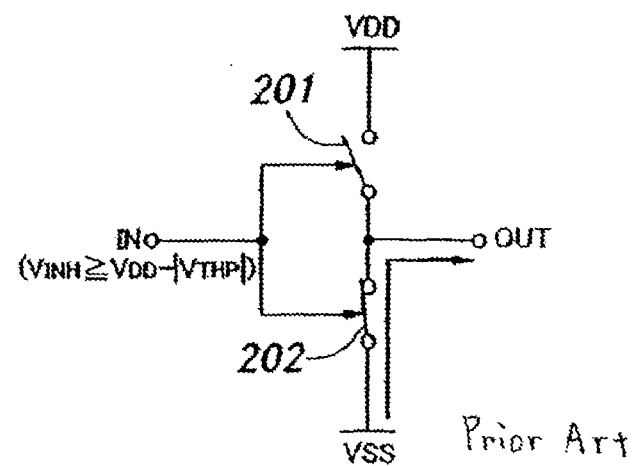
Figure 36C:
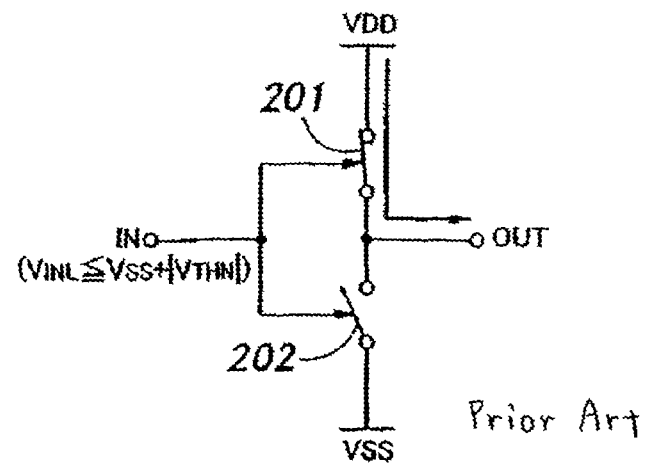
Figure 37A:
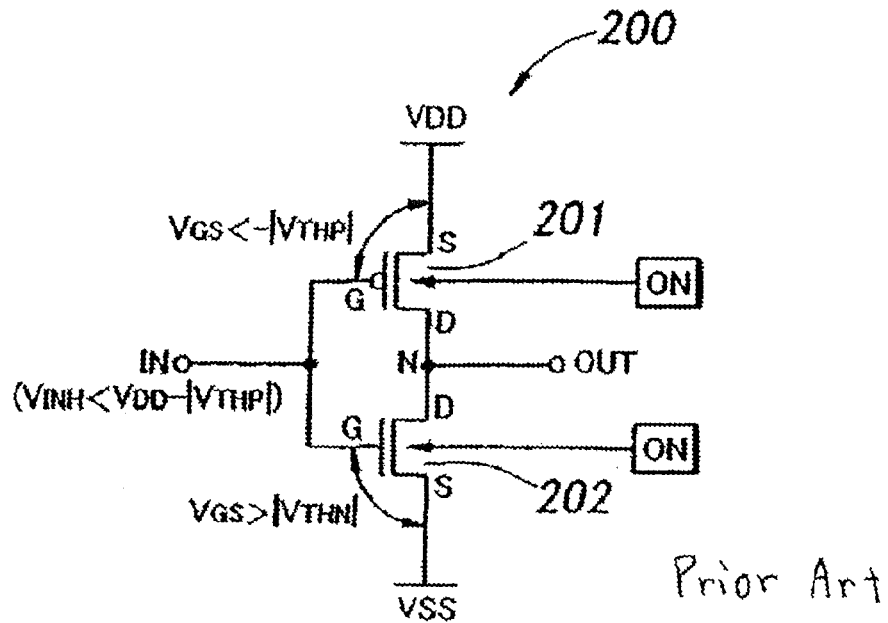
FIGS. 37a and 37b are diagrams for explaining a problem of the CMOS inverter circuit shown in FIG. 36.
Figure 37B:
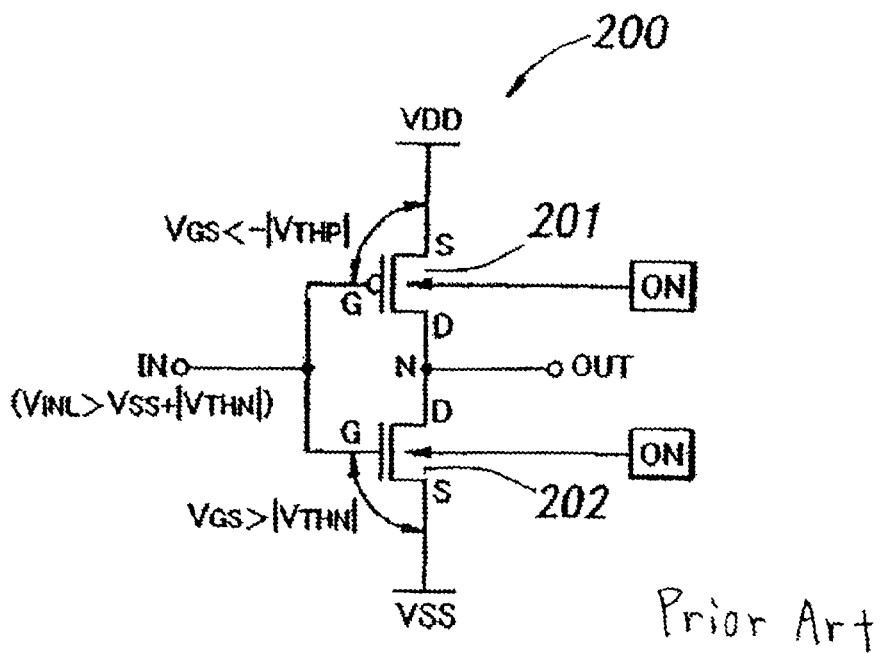

After the setting of the capacitors C2 and C3, in a normal operation, the switches SW2, SW3, SW9, SW11, SW20, and SW21 are turned off while the switches SW8 and SW10 are turned on, and an input signal is inputted to the input terminal IN as shown in FIG. 35. The operation of the MOSFETs 32 and 33 in this case is the same as that described in FIG. 32a and FIG. 32b, therefore, the explanation is omitted herein. In this embodiment, a low level input potential $V_{INL}$ is equal to a low level power supply potential VSS and a high level input potential $V_{INH}$ is equal to a high level power supply potential VDD, and thus the capacitors C2 and C3 are connected through the switches SW9 and SW11 to the high level power supply potential VDD and the low level power supply potential VSS, respectively. However, if this is not the case, the capacitors C2 and C3 may be connected through the switches SW9 and SW11 to a potential that is substantially equal to the high level input potential $V_{INH}$ and a potential that is substantially equal to the low level input potential $V_{INL}$, respectively.

Although the invention has been fully described with reference to the embodiments, the invention is not limited to the embodiments that are shown by way of example. It is needless to say that various changes and modifications will be apparent to those skilled in the art unless such changes and modifications depart from the scope of the invention defined in claims.

For instance, although a low level power supply potential VSS is a ground potential $V_{GND}$ and a high level power supply potential VDD is a potential higher than the $V_{GND}$ in the above embodiments, other potentials can be adopted such that a high level power supply potential VDD is a ground potential $V_{GND}$ and a low level power supply potential VSS is a potential lower than the ground potential $V_{GND}$. Furthermore, although the MOSFET is used as a transistor in the above embodiments, other transistors such as a bipolar transistor and other types of FETs can also be employed. A transistor may adopt any configuration, material, and manufacturing method, for example, may use a normal single crystalline substrate or an SOI (silicon on insulator) substrate. Moreover, a thin film transistor (TFT) using amorphous silicon, polysilicon and the like may be employed as well as a transistor using an organic semiconductor or a carbon nanotube. In addition, the transistor may be formed on a glass substrate, a quartz substrate, a plastic substrate or other substrates.

INDUSTRIAL APPLICABILITY

As set forth above, the digital circuit based on the invention comprises a switching circuit having a first transistor such as a MOSFET supplied with a power supply potential, and a correcting circuit connected between an input terminal inputted with an input signal and a control terminal (gate) of the first transistor. The correcting circuit has a) a capacitor connected between the control terminal of the first transistor and the input terminal and b) at least one switch for determining a conduction path for setting, in a setting operation prior to a normal operation, electric charges that are accumulated in the capacitor so that a voltage across thereof may be a predetermined value. In a normal operation, a state of the at least one switch is set so as to hold the voltage across the capacitor. Accordingly, without the correcting circuit, the switching circuit does not operate normally due to a difference between an input potential level and a power supply potential level (for instance, a high level input potential is lower than a high level power supply potential), or in the case of the transistor being not operated with high-speed owing to the power supply voltage being not sufficiently large with respect to a threshold voltage of the transistor (for instance, the power supply voltage of 3.3 V and the threshold voltage of the transistor of 3 V), when the voltage across the capacitor is properly set in the setting operation and the set voltage (or potential) is held in the normal operation, a DC level of the input signal can be corrected properly and thereby a preferable circuit operation can be realized. Since electric charges of the capacitor are held in the normal operation, there is no concern of the capacitor adversely affecting on the dynamic characteristics of the digital circuit (that is, operation speed is not lowered). On the contrary, the capacitor, being connected in series with parasitic capacitance of the transistor to lower total capacitance, can contribute to improve the dynamic characteristics. Furthermore, since there is no need to frequently carry out the setting operation, power consumption due to the setting operation is only slight. Preferably, in order that the voltage of the capacitor can reflect the threshold voltage of the corresponding transistor, the correcting circuit further includes a diode-connected second transistor that is provided between a node between the capacitor and the control terminal of the first transistor and the power supply potential, and has the substantially same threshold voltage as the first transistor, and a switch that is connected in series with the diode-connected second transistor.

The invention can be applied to electronic apparatuses such as a desktop, floor standing, or wall hanging display, a video camera, a digital camera, a goggle type display (head mounted display), a navigation system, an audio reproducing device (an in-car audio system, an audio component set, and the like), a laptop personal computer, a game player, a portable information terminal (a mobile computer, a mobile phone, a portable game player, an electronic book, and the like), and an image reproducing device provided with a recording medium (specifically, a device that reproduces an image or a still image recorded in a recording medium such as a Digital Versatile Disc (DVD) and includes a display capable of displaying the reproduced images). Specific examples of these electronic apparatuses are shown in FIG. 38a to FIG. 38h.

Figure 38A:
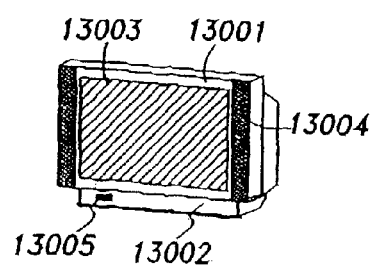
FIGS. 38a to 38h are diagrams of electronic apparatuses to which the invention can be applied.

FIG. 38a shows a desktop, floor standing, or wall hanging display that includes a housing 13001, a supporting base 13002, a display portion 13003, a speaker portion 13004, a video input terminal 13005, and the like. The invention can be applied to an electric circuit that constitutes the display portion 13003. Such a display can be used as an information display device for personal computer, TV broadcast reception, advertising display and the like.

Figure 38B:
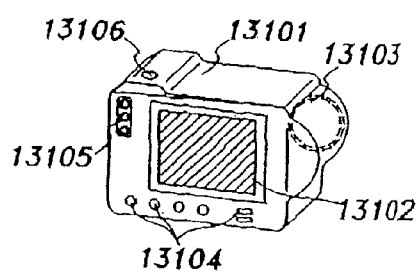

FIG. 38b shows a digital still camera that includes a main body 13101, a display portion 13102, an image receiving portion 13103, operating keys 13104, an external connecting port 13105, a shutter 13106, and the like. The invention can be applied to an electric circuit that constitutes the display portion 13102.

Figure 38C:
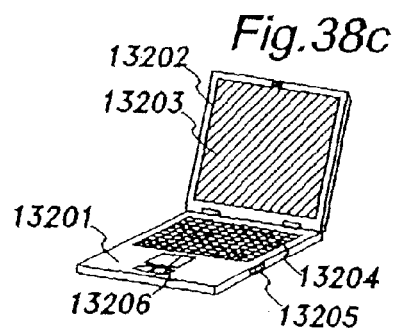

FIG. 38c shows a laptop personal computer that includes a main body 13201, a housing 13202, a display portion 13203, a keyboard 13204, an external connecting port 13205, a pointing mouse 13206, and the like. The invention can be applied to an electric circuit that constitutes the display portion 13203.

Figure 38D:
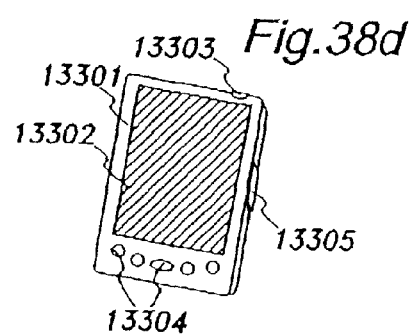

FIG. 38d shows a mobile computer that includes a main body 13301, a display portion 13302, a switch 13303, operating keys 13304, an infrared port 13305, and the like. The invention can be applied to an electric circuit that constitutes the display portion 13302.

Figure 38E:
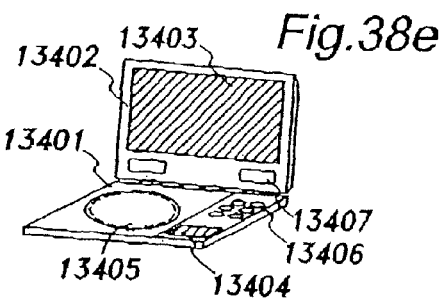

FIG. 38e shows a portable image reproducing device provided with a recording medium (specifically a DVD reproducing device), that includes a main body 13401, a housing 13402, a first display portion 13403, a second display portion 13404, a recording medium (such as a DVD) reading portion 13405, an operating key 13406, a speaker portion 13407, and the like. The first display portion 13403 displays mainly image data whereas the second display portion 13404 displays mainly character data. The invention can be applied to an electric circuit that constitutes the first and the second display portions 13403 and 13404. It is to be noted that the image reproducing device provided with a recording medium includes a home game player and the like.

Figure 38F:
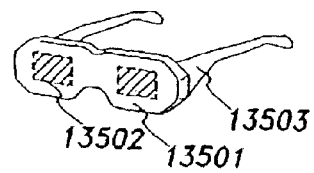

FIG. 38f shows a goggle type display (head mounted display) that includes a main body 13501, a display portion 13502, and an arm portion 13503. The invention can be applied to an electric circuit that constitutes the display portion 13502.

Figure 38G:
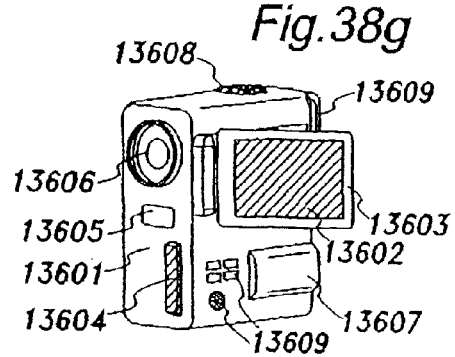

FIG. 38g shows a video camera that includes a main body 13601, a display portion 13602, a housing 13603, an external connecting port 13604, a remote control receiving portion 13605, an image receiving portion 13606, a battery 13607, an audio input portion 13608, operating keys 13609, and the like. The invention can be applied to an electric circuit that constitutes the display portion 13602.

Figure 38H:
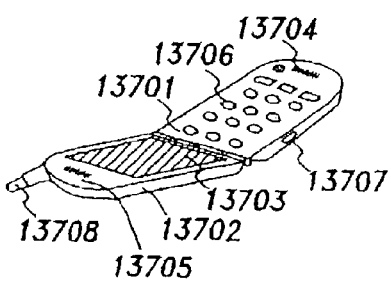

FIG. 38h shows a mobile phone that includes a main body 13701, a housing 13702, a display portion 13703, an audio input portion 13704, an audio output portion 13705, an operating key 13706, an external connecting port 13707, an antenna 13708, and the like. The invention can be applied to an electric circuit that constitutes the display portion 13703.

A display portion of the aforementioned electronic apparatuses may be a self-light emitting type using in each pixel a light emitting element such as an LED or an organic EL, or may be formed, such as a liquid crystal display, by using another light source such as a backlight. In the case of the self-light emitting type, the display portion can be made thinner than that of the liquid crystal display without requiring a backlight.

The aforementioned electronic apparatuses are becoming to be more used for displaying data distributed through a telecommunication path such as Internet and a CATV (Cable Television System), and in particular used for displaying moving pictures. The self-light emitting display portion is suitable for displaying moving pictures since the light emitting material such as an organic EL can exhibit a remarkably high response. When the luminance of the light emitting material is improved in the future, it can be used for a front type or rear type projector by magnifying and projecting outputted light including image data by a lens and the like.

Since light emitting parts consume power in a self-light emitting display portion, data is desirably displayed so that the light emitting parts occupy as small area as possible. Accordingly, in the case where a self-light emitting type is adopted for a display portion that mainly displays character data, such as the one of a mobile phone or an audio reproducing device, it is preferably operated so that the character data emits light by using non-light emitting parts as background.

As set forth above, the application range of the invention is so wide that it can be applied to electronic apparatuses of all fields.

The invention claimed is:

1. A semiconductor device comprising:
a first transistor;
a second transistor;
a third transistor;
a fourth transistor;
a fifth transistor; and
a capacitor,
wherein a gate of the first transistor is electrically connected to one of a pair of terminals of the capacitor,
wherein one of a source and a drain of the first transistor is electrically connected to a first wiring,
wherein the other of the source and the drain of the first transistor is electrically connected to one of a source and a drain of the second transistor,
wherein the other of the source and the drain of the second transistor is electrically connected to an output terminal,
wherein the one of the pair of terminals of the capacitor is electrically connected to one of a source and a drain of the third transistor,
wherein the other of the pair of terminals of the capacitor is electrically connected to one of a source and a drain of the fourth transistor,
wherein the other of the pair of terminals of the capacitor is electrically connected to one of a source and a drain of the fifth transistor,
wherein the other of the source and the drain of the fourth transistor is electrically connected to a second wiring,
wherein the other of the source and the drain of the fifth transistor is electrically connected to a third wiring,
wherein the first wiring is configured to be supplied with a power supply voltage,
wherein the second wiring is configured to be supplied with a signal, and
wherein the third wiring is configured to be supplied with a constant voltage.

2. The semiconductor device according to claim 1, wherein a gate of the third transistor is electrically connected to the one of the source and the drain of the third transistor.

3. The semiconductor device according to claim 1, further comprising a sixth transistor,
wherein one of a source and a drain of the sixth transistor is electrically connected to the other of the source and the drain of the third transistor, and
wherein the other of the source and the drain of the sixth transistor is electrically connected to the first wiring.

4. The semiconductor device according to claim 1, further comprising a pixel including a display element,
wherein the output terminal is electrically connected to the pixel.

5. An electronic apparatus comprising the semiconductor device according to claim 1, and at least one of a switch, a speaker, an image receiving portion and a memory.

6. An electronic apparatus comprising the semiconductor device according to claim 1, wherein the electronic apparatus is selected from the group consisting of a display, a digital camera, a computer, a portable image reproducing device, a goggle type display, a video camera, and a mobile phone.

7. A semiconductor device comprising:
a first transistor;
a second transistor;
a third transistor;
a fourth transistor;
a fifth transistor; and
a capacitor,
wherein a gate of the first transistor is electrically connected to one of a pair of terminals of the capacitor,
wherein one of a source and a drain of the first transistor is electrically connected to a first wiring,
wherein the other of the source and the drain of the first transistor is electrically connected to one of a source and a drain of the second transistor,
wherein the other of the source and the drain of the second transistor is electrically connected to an output terminal,
wherein the one of the pair of terminals of the capacitor is electrically connected to one of a source and a drain of the third transistor,
wherein the other of the pair of terminals of the capacitor is electrically connected to one of a source and a drain of the fourth transistor,
wherein the other of the pair of terminals of the capacitor is electrically connected to one of a source and a drain of the fifth transistor,
wherein the other of the source and the drain of the fourth transistor is electrically connected to a second wiring,
wherein the other of the source and the drain of the fifth transistor is electrically connected to a third wiring, and
wherein the first transistor, the second transistor, the third transistor, the fourth transistor and the fifth transistor have the same polarity.

8. The semiconductor device according to claim 7, wherein each of the first transistor, the second transistor, the third transistor, the fourth transistor and the fifth transistor is a p-channel type transistor.

9. The semiconductor device according to claim 7, wherein a gate of the third transistor is electrically connected to the one of the source and the drain of the third transistor.

10. The semiconductor device according to claim 7, further comprising a sixth transistor,
wherein one of a source and a drain of the sixth transistor is electrically connected to the other of the source and the drain of the third transistor, and
wherein the other of the source and the drain of the sixth transistor is electrically connected to the first wiring.

11. The semiconductor device according to claim 7, further comprising a pixel including a display element,
wherein the output terminal is electrically connected to the pixel.

12. An electronic apparatus comprising the semiconductor device according to claim 7, and at least one of a switch, a speaker, a display portion and a memory.

13. An electronic apparatus comprising the semiconductor device according to claim 7, wherein the electronic apparatus is selected from the group consisting of a display, a digital camera, a computer, a portable image reproducing device, a goggle type display, a video camera, and a mobile phone.

* * * * *